US007016286B2

(12) United States Patent
Hayami et al.

(10) Patent No.: US 7,016,286 B2
(45) Date of Patent: Mar. 21, 2006

(54) DIGITAL SIGNAL MODULATION METHOD, DIGITAL SIGNAL MODULATION APPARATUS, ENCODING METHOD, ENCODING APPARATUS, STORAGE MEDIUM, TRANSMISSION APPARATUS AND PROGRAM

(75) Inventors: Atsushi Hayami, Kanagawa-ken (JP); Tsuyoshi Oki, Kanagawa-ken (JP); Toshio Kuroiwa, Kanagawa-ken (JP)

(73) Assignee: Victor Company of Japan, Limited, Kanagawa-Ken (JP)

( * ) Notice: Subject to any disclaimer, the term of this patent is extended or adjusted under 35 U.S.C. 154(b) by 702 days.

(21) Appl. No.: 10/178,619

(22) Filed: Jun. 25, 2002

(65) Prior Publication Data

US 2003/0002184 A1 Jan. 2, 2003

(30) Foreign Application Priority Data

| | | |
|---|---|---|
| Jun. 29, 2001 | (JP) | P2001-198296 |
| Jul. 2, 2001 | (JP) | P2001-201415 |
| Jul. 18, 2001 | (JP) | P2001-217406 |

(51) Int. Cl.
*G11B 5/09* (2006.01)

(52) U.S. Cl. .............................. 369/59.23; 369/59.26; 369/59.1; 369/47.19

(58) Field of Classification Search .................... None
See application file for complete search history.

(56) References Cited

U.S. PATENT DOCUMENTS

| | | | |
|---|---|---|---|
| 5,774,078 A | 6/1998 | Tanaka et al. | |
| 5,912,869 A | 6/1999 | Tanaka et al. | |
| 5,917,857 A | 6/1999 | Tanaka et al. | |
| 6,002,718 A | 12/1999 | Roth | |
| 6,297,753 B1 * | 10/2001 | Hayami | 341/59 |
| 6,300,886 B1 * | 10/2001 | Hayami | 341/59 |

FOREIGN PATENT DOCUMENTS

| | | |
|---|---|---|
| EP | 0 673 034 A2 | 9/1995 |
| EP | 1 056 209 A2 | 11/2000 |
| EP | 1 229 659 A2 | 8/2002 |
| EP | 1 265 241 A1 | 12/2002 |
| JP | 10-340543 | 12/1998 |
| JP | 11-177431 | 7/1999 |
| JP | 2000-295109 | 10/2000 |
| JP | 2000-332613 | 11/2000 |

OTHER PUBLICATIONS

Schouhamer Immink, K.A. "EFMPlus: The Coding Format of the Multimedia Compact Disc", *IEEE Transactions on Consumer Electronics*, vol. 41 pp. 491-497, 1995.

Coene, W. et al. "EFMCC: A New Combi-Code for High Density Optical Recording", *Optical Data Storage 2000*, vol. 4090 pp. 275-282, 2000.

* cited by examiner

*Primary Examiner*—Muhammad Edun
(74) *Attorney, Agent, or Firm*—Nath & Associates PLLC; Gregory B. Kang; Teresa M. Arroyo

(57) ABSTRACT

First and second synchronous words having respective numbers of times of inversion different from each other in NRZI conversion are generated in a synchronous word generation portion, and first and second code word series data are generated by arranging code word data generated making reference to a run-length coding table after these two synchronous words. With respect to the first and second code word series data, DSV calculation results stored in two DSV calculation peak value memories corresponding to these data are compared with each other by a peak value comparison portion. Based on a comparison result, the code word series data having a smaller direct-current component generated in NRZI conversion is selected.

24 Claims, 32 Drawing Sheets

FIG.3

| S(k) | 0 | | | 1 | | | 2 | | | 3 | | |
|---|---|---|---|---|---|---|---|---|---|---|---|---|
| D(k) | C(k) | | S(k+1) | C(k) | | S(k+1) | C(k) | | S(k+1) | C(k) | | S(k+1) |
| 0 | 1 | 000001 | 0 | 9 | 001001 | 0 | 33 | 100001 | 0 | 41 | 101001 | 0 |
| 1 | 17 | 010001 | 1 | 5 | 000101 | 1 | 17 | 010001 | 1 | 37 | 100101 | 1 |
| 2 | 18 | 010010 | 2 | 2 | 000010 | 2 | 18 | 010010 | 2 | 34 | 100010 | 2 |
| 3 | 17 | 010001 | 0 | 5 | 000101 | 0 | 17 | 010001 | 0 | 37 | 100101 | 0 |
| 4 | 18 | 010010 | 1 | 2 | 000010 | 1 | 18 | 010010 | 1 | 34 | 100010 | 1 |
| 5 | 1 | 000001 | 1 | 9 | 001001 | 1 | 33 | 100001 | 1 | 41 | 101001 | 1 |
| 6 | 18 | 010010 | 3 | 2 | 000010 | 3 | 18 | 010010 | 3 | 34 | 100010 | 3 |
| 7 | 20 | 010100 | 1 | 4 | 000100 | 1 | 36 | 100100 | 1 | 20 | 010100 | 1 |
| 8 | 21 | 010101 | 0 | 4 | 000100 | 2 | 36 | 100100 | 2 | 21 | 010101 | 0 |
| 9 | 21 | 010101 | 1 | 4 | 000100 | 3 | 36 | 100100 | 3 | 21 | 010101 | 1 |
| 10 | 20 | 010100 | 2 | 10 | 001010 | 1 | 42 | 101010 | 1 | 20 | 010100 | 2 |
| 11 | 20 | 010100 | 3 | 8 | 001000 | 1 | 40 | 101000 | 1 | 20 | 010100 | 3 |
| 12 | 16 | 010000 | 2 | 8 | 001000 | 2 | 40 | 101000 | 2 | 16 | 010000 | 2 |
| 13 | 0 | 000000 | 3 | 10 | 001010 | 3 | 42 | 101010 | 3 | 32 | 100000 | 3 |
| 14 | 16 | 010000 | 3 | 8 | 001000 | 3 | 40 | 101000 | 3 | 16 | 010000 | 3 |
| 15 | 0 | 000000 | 2 | 10 | 001010 | 2 | 42 | 101010 | 2 | 32 | 100000 | 2 |

FIG.4

INPUT D(k): 4 BITS, OUTPUT C(k): 6 BITS,
S(k): TABLE STATUS AT TIME k, L(k - 1): LOW ORDER ZERO-RUN LENGTH OF C(k - 1)

| | CONDITION OF EXISTENCE OF ALTERNATIVE | REPLACEABLE STATUS NUMBER S(k) |
|---|---|---|
| CONDITION 1 | WHEN S(k) = 3, ((4≦L(k-1)≦5) and D(k)≦6) or (L(k-1) = 6 and (D(k) = 1 or 3 or 5) | 1 |
| CONDITION 2 | WHEN S(k) = 2, ((4≦L(k-1)≦5) and 7≦D(k)) or (L(k-1) = 6 and 10≦D(k)) | 1 |
| CONDITION 3 | WHEN S(k) = 2, (1≦L(k-1)≦4) and (D(k) = 0 or 5) | 0 |
| CONDITION 4 | WHEN S(k) = 2, ((1≦L(k-1)≦2) and (D(k) = 13 or 15)) REPLACEABLE WITH S(k) = 0 | 0 |
| CONDITION 5 | WHEN S(k) = 2 AND L(k-1) = 3, (D(k) = 13 and ((D(k+1) ≦ 6) or (D(k+1) = 13 or 15)) | 0 |
| CONDITION 6 | WHEN S(k) = 2 AND L(k-1) = 3, (D(k) = 15 and ((7 ≦ D(k+1)) or (D(k+1) = 0 or 5)) | 0 |

| | S(k) | | | |
|---|---|---|---|---|
| D(k) | 0 | 1 | 2 | 3 |
| 0 | +4 | +0 | -4 | +0 |
| 1 | -2 | +2 | -2 | -2 |
| 2 | +0 | +2 | +0 | -2 |
| 3 | -2 | +2 | -2 | -2 |
| 4 | +0 | +2 | +0 | -2 |
| 5 | +4 | +0 | -4 | +0 |
| 6 | +0 | +2 | +0 | -2 |
| 7 | +2 | +0 | +0 | +2 |
| 8 | +0 | +0 | +0 | +0 |
| 9 | +0 | +0 | +0 | +0 |
| 10 | +2 | +2 | -2 | +2 |
| 11 | +2 | -2 | +2 | +2 |
| 12 | -4 | -2 | +2 | -4 |
| 13 | +6 | +2 | -2 | -6 |
| 14 | -4 | -2 | +2 | -4 |
| 15 | +6 | +2 | -2 | -6 |

FIG.12

| S(k) | 0 | | | 1 | | | 2 | | | 3 | | |
|---|---|---|---|---|---|---|---|---|---|---|---|---|
| D(k) | C(k) | | S(k+1) | C(k) | | S(k+1) | C(k) | | S(k+1) | C(k) | | S(k+1) |
| 0 | 1 | 000001 | 0 | 9 | 001001 | 0 | 33 | 100001 | 0 | 41 | 101001 | 0 |
| 1 | 17 | 010001 | 1 | 5 | 000101 | 1 | 17 | 010001 | 1 | 37 | 100101 | 1 |
| 2 | 18 | 010010 | 2 | 2 | 000010 | 2 | 18 | 010010 | 2 | 34 | 100010 | 2 |
| 3 | 17 | 010001 | 0 | 5 | 000101 | 0 | 17 | 010001 | 0 | 37 | 100101 | 0 |
| 4 | 18 | 010010 | 1 | 2 | 000010 | 1 | 18 | 010010 | 1 | 34 | 100010 | 1 |
| 5 | 1 | 000001 | 1 | 9 | 001001 | 1 | 33 | 100001 | 1 | 41 | 101001 | 1 |
| 6 | 18 | 010010 | 3 | 2 | 000010 | 3 | 18 | 010010 | 3 | 34 | 100010 | 3 |
| 7 | 20 | 010100 | 1 | 4 | 000100 | 1 | 36 | 100100 | 1 | 20 | 010100 | 1 |
| 8 | 21 | 010101 | 0 | 4 | 000100 | 2 | 36 | 100100 | 2 | 21 | 010101 | 0 |
| 9 | 21 | 010101 | 1 | 4 | 000100 | 3 | 36 | 100100 | 3 | 21 | 010101 | 1 |
| 10 | 20 | 010100 | 2 | 10 | 001010 | 1 | 42 | 101010 | 1 | 20 | 010100 | 2 |
| 11 | 20 | 010100 | 3 | 8 | 001000 | 1 | 40 | 101000 | 1 | 20 | 010100 | 3 |
| 12 | 16 | 010000 | 2 | 8 | 001000 | 2 | 40 | 101000 | 2 | 16 | 010000 | 2 |
| 13 | 0 | 000000 | 3 | 10 | 001010 | 3 | 42 | 101010 | 3 | 32 | 100000 | 3 |
| 14 | 16 | 010000 | 3 | 8 | 001000 | 3 | 40 | 101000 | 3 | 16 | 010000 | 3 |
| 15 | 0 | 000000 | 2 | 10 | 001010 | 2 | 42 | 101010 | 2 | 32 | 100000 | 2 |

FIG.13

INPUT D(k) : 4 BITS, OUTPUT C(k): 6 BITS,
S(k): TABLE STATUS AT POINT IN TIME k, L(k - 1): LOW ORDER ZERO-RUN LENGTH OF C(k - 1)

| | CONDITION OF EXISTENCE OF ALTERNATIVE | REPLACEABLE STATUS NUMBER S(k) |
|---|---|---|
| CONDITION 1 | WHEN S(k) = 3, ((4≦L(k-1)≦5) and D(k)≦6) or (L(k-1) = 6 and (D(k) = 0 or 1 or 3 or 5) | 1 |
| CONDITION 2 | WHEN S(k) = 2, ((4≦L(k-1)≦5) and 7≦D(k)) or (L(k-1) = 6 and 10≦D(k)) | 1 |
| CONDITION 3 | WHEN S(k) = 2, (1≦L(k-1)≦4) and (D(k) = 0 or 5) | 0 |
| CONDITION 4 | WHEN S(k) = 2, ((1≦L(k-1)≦2) and (D(k) = 13 or 15)) | 0 |
| CONDITION 5 | WHEN S(k) = 2 AND L(k-1) = 3, (D(k) = 13 and ((D(k) ≦ 6) or (D(k+1) = 13 or 15)) | 0 |
| CONDITION 6 | WHEN S(k) = 2 AND L(k-1) = 3, (D(k) = 15 and ((7 ≦ D(k+1)) or (D(k+1) = 0 or 5)) | 0 |

| | S(k) | | | |
|---|---|---|---|---|
| D(k) | 0 | 1 | 2 | 3 |
| 0 | +4 | +0 | -4 | +0 |
| 1 | -2 | +2 | -2 | -2 |
| 2 | +0 | +2 | +0 | -2 |
| 3 | -2 | +2 | -2 | -2 |
| 4 | +0 | +2 | +0 | -2 |
| 5 | +4 | +0 | -4 | +0 |
| 6 | +0 | +2 | +0 | -2 |
| 7 | +2 | +0 | +0 | +2 |
| 8 | +0 | +0 | +0 | +0 |
| 9 | +0 | +0 | +0 | +0 |
| 10 | +2 | +2 | -2 | +2 |
| 11 | +2 | -2 | +2 | +2 |
| 12 | -4 | -2 | +2 | -4 |
| 13 | +6 | +2 | -2 | -6 |
| 14 | -4 | -2 | +2 | -4 |
| 15 | +6 | +2 | -2 | -6 |

FIG.23

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG.24

| S(k) | 0 | | | 1 | | | 2 | | | 3 | | |
|---|---|---|---|---|---|---|---|---|---|---|---|---|
| D(k) | C(k) | | S(k+1) | C(k) | | S(k+1) | C(k) | | S(k+1) | C(k) | | S(k+1) |
| 0 | 1 | 000001 | 0 | 9 | 001001 | 0 | 33 | 100001 | 0 | 41 | 101001 | 0 |
| 1 | 17 | 010001 | 1 | 5 | 000101 | 1 | 17 | 010001 | 1 | 37 | 100101 | 1 |
| 2 | 18 | 010010 | 2 | 2 | 000010 | 2 | 18 | 010010 | 2 | 34 | 100010 | 2 |
| 3 | 17 | 010001 | 0 | 5 | 000101 | 0 | 17 | 010001 | 0 | 37 | 100101 | 0 |
| 4 | 18 | 010010 | 1 | 2 | 000010 | 1 | 18 | 010010 | 1 | 34 | 100010 | 1 |
| 5 | 1 | 000001 | 1 | 9 | 001001 | 1 | 33 | 100001 | 1 | 41 | 101001 | 1 |
| 6 | 18 | 010010 | 3 | 2 | 000010 | 3 | 18 | 010010 | 3 | 34 | 100010 | 3 |
| 7 | 20 | 010100 | 1 | 4 | 000100 | 1 | 36 | 100100 | 1 | 20 | 010100 | 1 |
| 8 | 21 | 010101 | 0 | 4 | 000100 | 2 | 36 | 100100 | 2 | 21 | 010101 | 0 |
| 9 | 21 | 010101 | 1 | 4 | 000100 | 3 | 36 | 100100 | 3 | 21 | 010101 | 1 |
| 10 | 20 | 010100 | 2 | 10 | 001010 | 1 | 42 | 101010 | 1 | 20 | 010100 | 2 |
| 11 | 20 | 010100 | 3 | 8 | 001000 | 1 | 40 | 101000 | 1 | 20 | 010100 | 3 |
| 12 | 16 | 010000 | 2 | 8 | 001000 | 2 | 40 | 101000 | 2 | 16 | 010000 | 2 |
| 13 | 0 | 000000 | 3 | 10 | 001010 | 3 | 42 | 101010 | 3 | 32 | 100000 | 3 |
| 14 | 16 | 010000 | 3 | 8 | 001000 | 3 | 40 | 101000 | 3 | 16 | 010000 | 3 |
| 15 | 0 | 000000 | 2 | 10 | 001010 | 2 | 42 | 101010 | 2 | 32 | 100000 | 2 |

FIG.25

REPRESENTING S(k): STATUS, L(k-1): ZERO-RUN LENGTH ON LSB SIDE OF C(k-1), AND D(k): INPUT 4-BIT DATA.

CONDITION 1 WHEN S(k) = 3,
((4≦L(k-1)≦5) and D(k)≦6) or (L(k-1) = 6 and (D(k) = 0 or 1 or 3 or 5)
REPLACEABLE WITH S(k) = 1.

CONDITION 2 WHEN S(k) = 2,
((5≦L(k-1)≦6) and 7≦D(k)) or (L(k-1) = 4 and 10 = D(k))
REPLACEABLE WITH S(k) = 1.

CONDITION 3 WHEN S(k) = 2,
((1≦L(k-1)≦4) and ((D(k) = 0 or 5)
REPLACEABLE WITH S(k) = 0.

CONDITION 4 WHEN S(k) = 2,
(NOT IMMEDIATELY BEFORE REDUNDANT BIT) and (L(k-1) = 1) and (D(k) = 13 or 15) or
(IMMEDIATELY BEFORE REDUNDANT BIT) and (L(k-1) = 1) and (D(k) = 15) and ((7 ≦ D(k+1)) or (D(k+1) = 0 or 5)) or
(IMMEDIATELY BEFORE REDUNDANT BIT) and (L(k-1) = 1) and (D(k) = 13) and ((D(k+1) ≦ 6)) or (D(k+1) = 13 or 15))
REPLACEABLE WITH S(k) = 0.

EXECUTE 101010 REPETITION PROHIBITION PROCESSING.

CONDITION 5 WHEN S(k) = 2,
(NOT IMMEDIATELY BEFORE REDUNDANT BIT) and (L(k-1) = 2) and (D(k) = 13 or 15)
REPLACEABLE WITH S(k) = 0.

CONDITION 6 WHEN S(k) = 2 AND L(k-1) = 3,
(NOT IMMEDIATELY BEFORE REDUNDANT BIT) and (D(k) = 13 and ((D(k+1) ≦ 6) or (D(k+1) = 13 or 15))
REPLACEABLE WITH S(k) = 0.

CONDITION 7 WHEN S(k) = 2 AND L(k-1) = 3,
(NOT IMMEDIATELY BEFORE REDUNDANT BIT) and (D(k) = 15 and ((7 ≦ D(k+1)) or (D(k+1) = 0 or 5))
REPLACEABLE WITH S(k) = 0.

EXECUTE 2T PATTERN REPETITION PROHIBITION PROCESSING.

CODE WORD CONVERSION OF L(k-1) IS NOT CARRIED OUT IMMEDIATELY AFTER REDUNDANT BIT.

FIG.26

| INPUT DATA WORD | TABLE SELECTION INFORMATION | OUTPUT CODE WORD | TABLE SELECTION INFORMATION |
|---|---|---|---|
| D(k) | S(k) | C(k) | S(k+1) |
| 4 | 0 | 18 | 1 |
| 5 | 1 | 9 | 1 |
| 6 | 1 | 2 | 3 |
| 7 | 3 | 20 | 1 |
| 8 | 1 | 4 | 2 |

FIG.30

| TYPE OF PRECEDING CODE WORD | REDUNDANT BIT PATTERN |
|---|---|
| LSB OF PRECEDING CODE WORD IS 1 | 01 OR 00 |
| LSB OF PRECEDING CODE WORD IS 0 | 10 OR 00 |

DIGITAL SIGNAL MODULATION METHOD, DIGITAL SIGNAL MODULATION APPARATUS, ENCODING METHOD, ENCODING APPARATUS, STORAGE MEDIUM, TRANSMISSION APPARATUS AND PROGRAM

BACKGROUND OF THE INVENTION

1. Field of the Invention

The present invention relates to a digital signal modulation method capable of accurately performing lower component suppression control for suppressing a lower component in a recording code series when converting data of a digital information signal consisting of p (p is a positive integer) bits into a code word consisting of q (q is an integer larger than p) bits and recording it on a high-density storage medium such as an optical disk, a magnetic disk and a magnetic tape by using a code series satisfying a predetermined run-length limited rule, a digital signal modulation apparatus, a storage medium, a transmission apparatus and a program, and to an encoding method used when recording/reproducing data to/from a storage medium or the like, an encoding apparatus, a storage medium, and a program for realizing the encoding method.

2. Description of the Related Art

As a digital signal modulation mode used for recording a digital information signal on a digital storage medium, a modulation mode with less direct-current signal components included in a modulated signal has been developed, and a digital signal recording apparatus employing this modulation mode has come into practical use.

There is an NRZ (Non Return to Zero) mode as a basic digital modulation mode. In this mode, however, a direct-current component is generated when digital-modulating a digital information signal in which 0 or 1 longly continues, and this direct-current component can not be used in, for example, magnetic recording which can not reproduce a direct-current signal. As a countermeasure, a modulation method such as a mirror code or a mirror square code which does not produce a large quantity of direct-current components has-been developed.

The mirror code is a technique which generates a digital modulation signal by a combination of T, 1.5T and 2T with respect to a bit interval T, but a small amount of direct-current components remains in the modulation signal. The mirror square code is a digital modulation mode which further reduces the direct-current signal components by adaptively selecting one which generates a smaller amount of the direct-current component from inversion or non-inversion with 1 at the center when 1 longly continues in an information signal.

In the mirror square code which reduces its direct-current signal components, a minimum bit inversion interval is T and a maximum bit inversion interval is not less than 3T. Therefore, a ratio of a maximum frequency component and a minimum signal frequency of a digital modulation signal is a value not less than 3, and a signal in such a frequency band is recorded on a storage medium.

On the other hand, in the information-oriented society realized by transmission and recording of digital information signals, both a number of types of information to be processed and a quantity of information are increasing, and materialization of an efficient digital modulation mode for effectively transmitting and recording digital information signals which tend to increase has been long-awaited.

The efficient digital modulation mode enables a larger quantity of digital information signals to be recorded on a digital signal storage medium having a restricted recording frequency capacity by performing digital modulation using modulation signal frequency components which is as low as possible.

Further, although the digital modulation signal recorded on the digital signal storage medium is a low direct-current component because of a magnetic reproduction characteristic in case of magnetic recording, reduction in level of the direct-current component included in the digital modulation signal is demanded in order to perform tracking control which obtains a digital modulation signal while tracking directly above a recording track even in case of a discoid high-density storage medium such as an optical disk.

In this manner, the characteristic of the digital modulation signal in the present day lies in that a frequency of the modulation signal is a low frequency band, and it is often the case that the direct-current frequency component is obtained as a signal which is as low as possible. Furthermore, a technique for conversion encoding is often used in order to obtain such a modulation signal.

The conversion encoding is a method such as 8–10 block conversion which encodes 256 types of information signals each consisting of, e.g., eight bits by selecting 256 types of codes having a number of 1 and that of 0 being substantially equal to each other and a smaller quantity of direct-components from 1024 codes each of which can be represented by 10 bits, and this method is also adopted in DAT (Digital Audio Tape recorder).

Moreover, although a CD (Compact Disc) adopts an EFM (Eight to Fourteen Modulation) mode which converts an eight-bit signal into a 14-bit signal series, the EFM modulation mode uses an encoded series in which a redundant bit used for suppressing the direct-current component is set.

In addition, since the encoding efficiency can be further increased as long as a digital conversion signal in which the direct-current component is suppressed can be generated without setting such a redundant bit, there has been developed a method which reduces the direct-current component by applying DSV (Digital Sum Value) control on a recording code series to be recorded on a high-density information recording medium.

Suppression of the digital modulation signal lower component in a high-density discoid optical storage medium typified by the optical disk aims at minimization of adverse affect on performance for executing high-speed servo control by a lower component of the recording signal series which has been mixed in a focus servo signal or the like as well as a tracking servo signal, and also reduction in undesirable servo control operations such as an erroneous control operation by which a reference level for signal detection fluctuates when detecting an error signal for servo.

As to reduction in the signal component applied to such undesirable servo control, for example, the DVD Forum which operates for DVD (Digital versatile Disc) standardization expressly provides a method of DSV control in the physical specification of a DVD-ROM.

Meanwhile, the DSV control method expressly provided in the DVD-ROM physical specification reduces generation of an undesirable error signal by decreasing an absolute value of a DSV value at the point in time of DSV control. Although the lower component in the digital modulation signal can be reduced, there has been demanded establishment of a technique for generating the digital modulation signal for effecting high-performance DSV control which does not generate the lower component at any other point in time than DSV control.

As to such a method for effecting DSV control by detecting a peak voltage value of the DSV signal, although Japanese patent application laid-open No. 2000-295109 "Digital Modulation Apparatus" is disclosed, its DSV control method optimizes the DSV control by using a data scrambling technique, and it can not be applied to, e.g., a digital modulation mode which is based on block conversion using no data scrambling technique.

SUMMARY OF THE INVENTION

In view of he above-described drawbacks, it is an object of the present invention to provide a digital signal modulation method which performs run-length limited encoding targeting at a discoid high-density storage medium such as optical disk by using encode tables which convert data consisting of p bits into a code word consisting of q bits, enables a DSV control method having a better direct-current component suppression characteristic than that in the prior art and can inexpensively provide a structure of a modulation apparatus adopting the DSV control method, a digital signal modulation apparatus, a storage medium, a transmission apparatus, and a program.

It is another object of the present invention to provide a digital signal modulation method which can be applied to a digital modulation mode based on block conversion using no data scrambling technique, a digital signal modulation apparatus, a storage medium, a transmission apparatus and a program.

It is still another object of the present invention to provide an encoding method which can demonstrate the higher DC suppression capability as compared with the prior art in the same degree of redundancy, an encoding apparatus, a storage medium and a program.

To achieve this aim, there is provided a digital signal modulation method which generates a code word data group by repeating a of number of times an operation for converting source data whose bit number is p (p is a positive integer) into code word data whose bit number is q (q is a larger integer than p), generates synchronous words at predetermined bit intervals, obtains code word series data by arranging the code word data group after the generated synchronous words, and obtains a signal to be supplied to a storage medium or a transmission medium by NRZI-converting the obtained code word series signal, the digital signal modulation method comprising: a first step of simultaneously generating a first synchronous word and a second synchronous word, having respective numbers of times of inversion different from each other, by the NRZI conversion; a second step of generating the code word data group based on a run-length encoding method which restricts a run length in a predetermined range, generating first code word series data by arranging the generated code word data group after the first synchronous word, and generating second code word series data by arranging the code word data group after the second synchronous word; a third step of obtaining first direct-current component data concerning a direct-current component generated when NRZI-converting the first code word series data and obtaining second direct-current component data concerning a direct-current component generated when NRZI-converting the second code word series data based on the first and second code word series data generated at the second step; and a fourth step of comparing the first direct-current component data with the second direct-current component data, and selecting and supplying one having smaller direct-current component data among the first code word series data and the second code word series data.

Additionally, to achieve this aim, there is provided a program which causes a computer to execute the first to fourth steps defined in the above aspect of the present invention.

Additionally, to achieve this aim, there is provided a digital signal modulation method which generates, when specific source data with which first code word data and second code word data having different patterns can be generated is supplied in case of generating a code word data group by repeating a number of times an operation for converting source data whose bit number is p (p is a positive integer) into code word data whose bit number is q (q is a larger integer than p), generates the code word data group based on source data supplied after the specific source data, obtains code word series data in which the generated code word data group is arranged after the first code word or the second code word, and obtains a signal to be supplied to a storage medium or a transmission medium by NRZI-converting the obtained code word series signal, the digital signal modulation method comprising: a first step of generating the first code word and the second code word having respective numbers of times of inversion different from each other, by the NRZI conversion; a second step of generating the code word data group based on a run-length encoding method which restricts a run length in a predetermined range, generating first code word series data by arranging the generated code word data group after the first code word, and generating second code word series data by arranging the code word data group after the second code word; a third step of obtaining first direct-current component data concerning a direct-current component generated when NRZI-converting the first code word series data and obtaining second direct-current component data concerning a direct-current component generated when NRZI-converting the second code word series data based on the first and second code word series data generated at the second step; and a fourth step of comparing the first direct-current component data with the second direct-current component data, and selecting and supplying one having smaller direct-current data among the first code word series data and the second code word series data.

Additionally, to achieve this aim, there is provided a program which causes a computer to execute the first to fourth steps defined in the above aspect of the present invention.

Further, to achieve this aim, there is provided a digital signal modulation apparatus which generates a code word data group by repeating a number of times an operation for converting source data whose bit number is p (p is a positive integer) into code word data whose bit number is q (q is a larger integer than p), generates synchronous words at predetermined bit intervals, obtains code word series data by arranging the code word data group after the generated synchronous words, and obtains a signal to be supplied to a storage medium or a transmission medium by NRZI-converting the obtained code word series data, the digital signal modulation apparatus comprising: synchronous word generating means for simultaneously generating a first synchronous word and a second synchronous word having respective numbers of times of inversion different from each other, by the NRZI conversion; code word series data generating means for generating the code word data group based on a run-length encoding method which restricts a run length in a predetermined range, generating first code word series data by arranging the generated code word data group after the first synchronous word, and generating second code word series data by arranging the code word data group after the second synchronous word; DSV calculating means for receiving the first and second code word series data generated by the code word series data generating means, obtaining first direct-current component data concerning a direct-current component generated when NRZI-converting the first code word series data, and obtaining second direct-current component data concerning a direct-current component generated when NRZI-converting the second code word series data; and code word outputting means for comparing the first direct-current component data with the second direct-current component data, and selecting and supplying one having smaller direct-current data from the first code word series data and the second code word series data.

Furthermore, in order to achieve the above-described aim, there is provided a digital signal modulation apparatus which generates, when specific source data with which first code word data and second code word data having different patterns can be generated is supplied in case of generating a code word data group by repeating a number of times an operation for converting source data whose bit number is p (p is a positive integer) into code word data whose bit number is q (q is a larger integer than p), generates the code word data group based on source data supplied after the specific source data, obtains code word series data in which the generated code word data group is arranged after the first code word or the second code word, and obtains a signal to be supplied to a storage medium or a transmission medium by NRZI-converting the obtained code word series data, the digital signal modulation apparatus comprising: code word generating means for generating the first code word and the second code word having respective numbers of times of inversion different from each other, by the NRZI conversion; code word series data generating means for generating the code word data group based on a run-length encoding method which restricts a run length in a predetermined range, generating first code word series data by arranging the generated code word data group after the first code word, and generating second code word series data by arranging the code word data group after the second code word; DSV calculating means for receiving the first and second code word series data generated by the code word series data generating means, obtaining first direct-current component data concerning a direct-current component generated when NRZI-converting the first code word series data, and obtaining second direct-current component data concerning a direct-current component generated when NRZI-converting the second code word series data; and code word outputting means for comparing the first direct-current component data with the second direct-current component data, and selecting and supplying one having smaller direct-current component data from the first code word series data and the second code word series data.

Moreover, in order to achieve the above-described aim, there is provided a digital signal storage medium on which a signal is recorded, signal of which is obtained by generating a code word data group by repeating a number of times an operation for converting source data whose bit number is p (p is a positive integer) into code word data whose bit number is q (q is a larger integer than p), generating synchronous words at predetermined bit intervals, arranging the code word data group after the generated synchronous words in order to obtain code word series data, and NRZI-converting the code word series signal, wherein the digital signal storage medium has the code word series data recorded thereon, the code word series data being obtained by the following steps of: simultaneously generating a first synchronous word and a second synchronous word having respective numbers of times of inversion different from each other, by the NRZI conversion; generating the code word data group based on a run-length encoding method which restricts a run length in a predetermined range, generating a first code word series data by arranging the generated code word data group after the first synchronous word, and generating second code word series data by arranging the code word data group after the second synchronous word; obtaining first direct-current component data concerning a direct-current component generated when NRZI-converting the first code word series data, and obtaining second direct-current data concerning a direct-current component generated when NRZI-converting the second code word series data; and comparing the first direct-current component data with the second direct-current component data, and selecting one having smaller direct-current data from the first code word series data and the second code word series data, thereby recoding said selected and obtained code word series data.

In addition, in order to achieve the above-described aim, there is provided a digital signal storage medium on which a signal is recorded, signal of which is obtained by generating, when specific source data with which first code word data and second code word data having different patterns can be generated is supplied in case of generating a code word data group by repeating a number of times an operation for converting source data whose bit number is p (p is a positive integer) into code word data whose bit number is q (q is a larger integer than p), the code word data group based on source data supplied after the specific source data, arranging the generated code word data group after the first code word or the second code word in order to obtain code word series data, and NRZI-converting the obtained code word series signal, wherein the digital signal storage medium has the code word series data recorded thereon, the code word series data being obtained by the steps of: generating the first code word and the second code word having respective numbers of times of inversion different from each other, by the NRZI conversion; generating the code word data group based on a run-length encoding method which restricts a run length in a predetermined range, generating first code word series data by arranging the generated code word data group after the first code word, and generating second code word series data by arranging the code word data group after the second code word; obtaining first direct-current component data concerning a direct-current component generated when NRZI-converting the first code word series data, and obtaining second direct-current component data concerning a direct-current component generated when NRZI-converting the second code word series data; and comparing the first direct-current component data with the second direct-current component data, and selecting one having smaller direct-current data from the first code word series data and the second code word series data, thereby recording said selected and obtained code word series data.

Additionally, in order to achieve this aim, there is provided a digital signal modulation method which generates a code word data group by repeating a number of times an operation for converting source data whose bit number is p (p is a positive integer) into code word data whose bit number is q (q is a larger integer than p), generates synchronous words at predetermined bit intervals, obtains code word series data by arranging the code word data group after the generated synchronous words, and NRZI-converts and outputs a signal of the obtained code word series data, the digital signal modulation method comprising: a first step of simultaneously generating a first synchronous word and a second synchronous word having respective numbers of times of inversion different from each other, by the NRZI conversion; a second step of generating the code word data group based on a run-length limited rule which restricts a run length in a predetermined range, generating first code word series data by arranging the generated code word data group after the first synchronous word, and generating second code word series data by arranging the code word data group after the second synchronous word; a third step of obtaining first direct-current component data concerning a direct-current component generated when NRZI-converting the first code word series data and obtaining second direct-current component data concerning a direct-current generated when NRZI-converting the second code word series data based on the first and second code word series data generated at the second step; a fourth step of obtaining first direct-current component square data by squaring the first direct-current component data obtained at the predetermined bit intervals and obtaining second direct-current component square data by squaring the second direct-current component data obtained at the predetermined bit intervals; and a fifth step of comparing the first direct-current component square data with the second direct-current component square data, and selecting and outputting one having smaller direct-current component square data from the first code word series data and the second code word series data.

Further, in order to achieve the above-described aim, there is provided a digital signal modulation method which generates a code word data group by repeating a number of times an operation for converting source data whose bit number is p (p is a positive integer) into code word data whose bit number is q (q is a larger integer than p), generates the code word data group based source data inputted after specific source data when the specific source data with which a first code word and a second code word having different patterns can be generated is inputted in case of generating synchronous words at predetermined bit intervals, arranges the generated code word data group after the first code word or the second code word, obtains code word series data in which the synchronous words are inserted at the predetermined bit intervals, and NRZI-converts a signal of the obtained code word series data and output the NRZI-converted signal, the digital signal modulation method comprising: a first step of generating the first code word and the second code word having respective numbers of times of inversion different from each other, by the NRZI conversion; a second step of generating the code word data group based on a run-length limited rule which restricts a run length in a predetermined range, generating first code word series data by arranging the generated code word data group after the first code word, and generating second code word series data by arranging the code word data group after the second code word; a third step of obtaining first direct-current component data concerning a direct-current component generated when NRZI-converting the first code word series data and obtaining second direct-current component data concerning a direct-current generated when NRZI-converting the second code word series data based on the first and second code word series data generated at the second step; a fourth step of obtaining first direct-current component square data by squaring the first direct-current component data acquired at the predetermined bit intervals and obtaining second direct-current component square data by squaring the second direct-current component data acquired at the predetermined bit intervals; and a fifth step of comparing the first direct-current component square data with the second direct-current square data, and selecting and outputting one having smaller direct-current component square data from the first code word series data and the second code word series data.

Furthermore, in order to achieve the above-described aim, there is provided a digital signal modulation apparatus which generates a code word data group by repeating a number of times an operation for converting source data whose bit number is p (p is a positive integer) into code word data whose bit number is q (q is a larger integer than p), generates synchronous words at predetermined bit intervals, obtains code word series data by arranging the code word data group after the generated synchronous words, and NRZI-converts a signal of the obtained code word series data and outputs the NRZI-converted signal, the digital signal modulation apparatus comprising: synchronous word generating means for simultaneously generating a first synchronous word and a second synchronous word having respective numbers of times of inversion different from each other, by the NRZI conversion; code word series data generating means for generating the code word data group based on a run-length limited rule which restricts a run length in a predetermined range, generating first code word series data by arranging the generated code word data group after the first synchronous word, and generating second code word series data by arranging the code word data group after the second synchronous word; DSV calculating means for receiving the first and second code word series data generated by the code word series data generating means, obtaining first direct-current component data concerning a direct-current component generated when NRZI-converting the first code word series data, and obtaining second direct-current component data concerning a direct-current component generated when NRZI-converting the second code word series data; DSV square calculating means for obtaining first direct-current component square data by squaring the first direct-current component data acquired at the predetermined bit intervals and obtaining second direct-current component square data by squaring the second direct-current component data acquired at the predetermined bit intervals; and code word outputting means for comparing the first direct-current component square data with the second direct-current component square data, and selecting and outputting one having smaller direct-current component square data from the first code word series data and the second code word series data.

Moreover, in order to achieve the above-described aim, there is provided a digital signal modulation apparatus which generates a code word data group by repeating a number of times an operation for converting source data whose bit number is p (p is a positive integer) into code word data whose bit number is q (q is a larger integer than p), generates the code word data group based on source data inputted after specific source data when the specific source data with which a first code word and a second code word having different patterns can be generated is inputted in case of generating synchronous words at predetermined bit intervals, arranges the generated code word data group after the first code word or the second code word, obtains code word series data in which the synchronous words are inserted at the predetermined bit intervals, and NRZI-converts a signal of the obtained code word series data and outputs the NRZI-converted signal, the digital signal modulation apparatus comprising: code word generating means for generating the first code word and the second code word having respective numbers of times of inversion different from each other, by the NRZI conversion; code word series data generating means for generating the code word data group based on a run-length limited rule which restricts a run length in a predetermined range, generating first code word series data by arranging the generated code word data group after the first code word, and generating second code word series data by arranging the code word data group after the second code word; DSV calculating means for receiving the first and second code word series data generated by the code word series data, obtaining first direct-current component data concerning a direct-current component generated when NRZI-converting the first code word series data, and obtaining second direct-current component data concerning a direct-current component generated when NRZI-converting the second code word series data; DSV square calculating means for obtaining first direct-current component square data by squaring the first direct-current component data acquired at the predetermined bit intervals, and obtaining second direct-current component square data by squaring the second direct-current component data acquired at the predetermined bit intervals; and code word outputting means for comparing the first direct-current component square data with the second direct-current component square data, and selecting and outputting one having smaller direct-current component square data from the first code word series data and the second code word series data.

In addition, in order to achieve the above-described aim, there is provided a storage medium, wherein the code word series data generated by the digital signal modulation apparatus is NRZI-converted and recorded.

Additionally, in order to achieve the above-described aim, there is provided a transmission apparatus comprising a transmission encoding portion which adds a header to the code word series data generated and NRZI-converted by the digital signal modulation apparatus and realizes a packet of the code word series data, wherein the packet outputted from the transmission encoding portion is transmitted to a transmission path.

Further, in order to achieve the above-described aim, there is provided a program which executes the first to fifth steps of the digital signal modulation method by a computer.

Furthermore, in order to achieve the above-described aim, there is provided an encoding method which associates a specific input data word with a plurality of different code words, and selects and outputs a specific code word from the plurality of different code words when encoding an input data word consisting of p bits into a code word consisting of q bits (where q>p) and outputting the code word as a bit string to which a predetermined run-length limited rule is applied, wherein, in case of selecting the specific code word, reckoning from an absolute value of DSV at a selectable point in time, encoding is performed in accordance with each selectable code word in order to integrate the absolute value of DSV, results of integration of the absolute value of DSV for the plurality of different code words are compared with each other in largeness, thereby selecting and outputting the specific code word.

Moreover, in order to achieve the above-described aim, there is provided a storage medium, wherein a code word string obtained by the encoding method is NRZI-converted and recorded.

In addition, in order to achieve the above-described aim, there is provided an encoding method which performs DSV control by adding one redundant bit selected from a plurality of different redundant bits every predetermined number of code words to an outputted code word string when encoding an input data word consisting of p bits into a code word consisting of q bits (where q>p) and outputting the code word as a bit string to which a predetermined run-length limited rule is applied, wherein, in case of selecting the redundant bit, reckoning from an absolute value of DSV at a selectable point in time, encoding is performed in accordance with each selectable redundant bit in order to integrate the absolute value of DSV, results of integration of the absolute value of DSV for a plurality of different code words each having the redundant bit added thereto are compared with each other in largeness, and the one redundant bit is consequently selected, thereby outputting the code word string and the selected one redundant bit.

Additionally, in order to achieve the above-described aim, there is provided a storage medium, wherein the code word string and the selected one redundant bit obtained by the encoding method is NRZI-converted and recorded.

Further, in order to achieve the above-described aim, there is provided an encoding apparatus which performs DSV control by associating a plurality of different code words with a specific input data word and selecting and outputting a specific code word from the plurality of different code words when encoding an input data word consisting of p bits into a code word consisting of q bits (where q>p) and outputting the code word as a bit string to which a predetermined run-length limited rule is applied, the encoding apparatus comprising: a detection circuit which detects whether there is an alternative of the code word with respect to the input data word; a calculation portion which outputs the plurality of different code words corresponding to the input data word when a result of alternative detection supplied from the detection circuit indicates presence of an alternative, and outputs one code word corresponding to the input data word when a result of detection from the detection circuit indicates absence of an alternative; a plurality of storing means for accumulating output code words after a point in time of outputting an output code word and a code word inputted from the calculation portion immediately before with respect to each of a plurality of code word strings outputted from the calculation portion through a plurality of paths, and storing a DSV value obtained from an output code word selected in the past and a code word immediately precedently inputted from the calculation portion; and outputting means for comparing integrated values of absolute values of DSV values before an immediately preceding code word supplied from the plurality of storing means with each other, selecting and outputting a code word of the storing means corresponding to a smallest integrated value, and substituting a content of the selected storing means for a content of the unselected storing means among the plurality of storing means, wherein the outputting means performs encoding for each selectable code word and integrates the absolute value of DSV reckoning from the absolute value of DSV at a point in time of selectable conversion.

Furthermore, in order to achieve the above-described aim, there is provided an encoding apparatus which performs DSV control by adding one redundant bit selected from a plurality of different redundant bits for each predetermined number of code words to an outputted code word string when encoding an input bit word consisting of p bits into a code word consisting of q bits (where q>p) and outputting the code word as a bit string to which a predetermined run-length limited rule is applied, the encoding apparatus comprising: a calculation portion which adds a plurality of the different redundant bits for each predetermined number of code words; a plurality of storing means for accumulating an output code word and a redundant bit after a point in time of outputting the output code word and a code word and a redundant bit inputted from the calculation portion immediately before with respect to each of a plurality of code word strings including redundant bits outputted from the calculation portion through a plurality of paths corresponding to the plurality of different redundant bits, and storing a DSV value obtained from an output code word and a redundant bit selected in the past and a code word and a redundant bit immediately precedently inputted from the calculation portion; and outputting means for comparing integrated values of absolute values of DSV values up until an immediately preceding code word and a redundant bit supplied from the plurality of storing means with each other, selecting and outputting a code word and a redundant bit of a storing means corresponding to a smallest integrated value, and substituting a content of selected storing means for a content of unselected storing means among the plurality of storing means, wherein the outputting means performs encoding in accordance with each selectable redundant bit and integrates the absolute values of DSV, reckoning from an absolute value of DSV at a point in time of selectable conversion.

Moreover, in order to achieve the above-described aim, there is provided a computer program which causes the detection circuit, the calculation portion, the plurality of storing means and the outputting means in the encoding apparatus to function as a computer.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is a view showing an example of coding tables in RLL (1, 9) limitation wherein p=4 and q=6, which is used in the first embodiment according to the present invention;

FIG. 4 shows conditions when presence of an alternative is determined according to the first embodiment of the present invention;

FIG. 5 shows an example of synchronous signals used in accordance with a value of S(k) according to the first embodiment of the present invention;

FIG. 9 shows values of CDS with respect to code words in the form of a table according to the first embodiment of the present invention;

FIG. 12 is a view showing an example of coding tables, in which p=4 and q=6 and which is under RLL (1, 9) limitation, used in the second embodiment according to the present invention;

FIG. 13 is an explanatory view of conditions when presence of an alternative is determined by a code word alternative presence/absence detection circuit illustrated in FIG. 11 according to the second embodiment of the present invention;

FIG. 14 is an explanatory view showing an example of synchronous words used in accordance with values of status information S(k) in the coding tables utilized in the second embodiment according to the present invention;

FIG. 18 is a view showing a table of CDS values calculated with respect to the code word according to the second embodiment of the present invention;

FIG. 23 shows types of a code word consisting of six bits satisfying (1, 7) RLL limitation according to the fourth embodiment of the present invention;

FIG. 24 is a view showing coding tables used in the fourth embodiment according to the present invention;

FIG. 25 is a view for illustrating conditions enabling exchange between two coding tables in order to satisfy (1, 9) RLL limitation in the fourth embodiment according to the present invention;

FIG. 26 is a view for illustrating selection information and output code words of the coding tables of FIG. 24 used when encoding an input data word D(k) in units of four bits based on (1, 7) RLL limitation in the fourth embodiment according to the present invention;

FIG. 30 is a view showing the relationship between types of preceding code words and redundant bit patterns used in the forth embodiment according to the present invention;

DESCRIPTION OF THE PREFERRED EMBODIMENTS

<First Embodiment>

A digital signal modulation method, a digital signal modulation apparatus and a storage medium according to the present invention will now be described based on preferred embodiments hereinafter.

Figure 1:
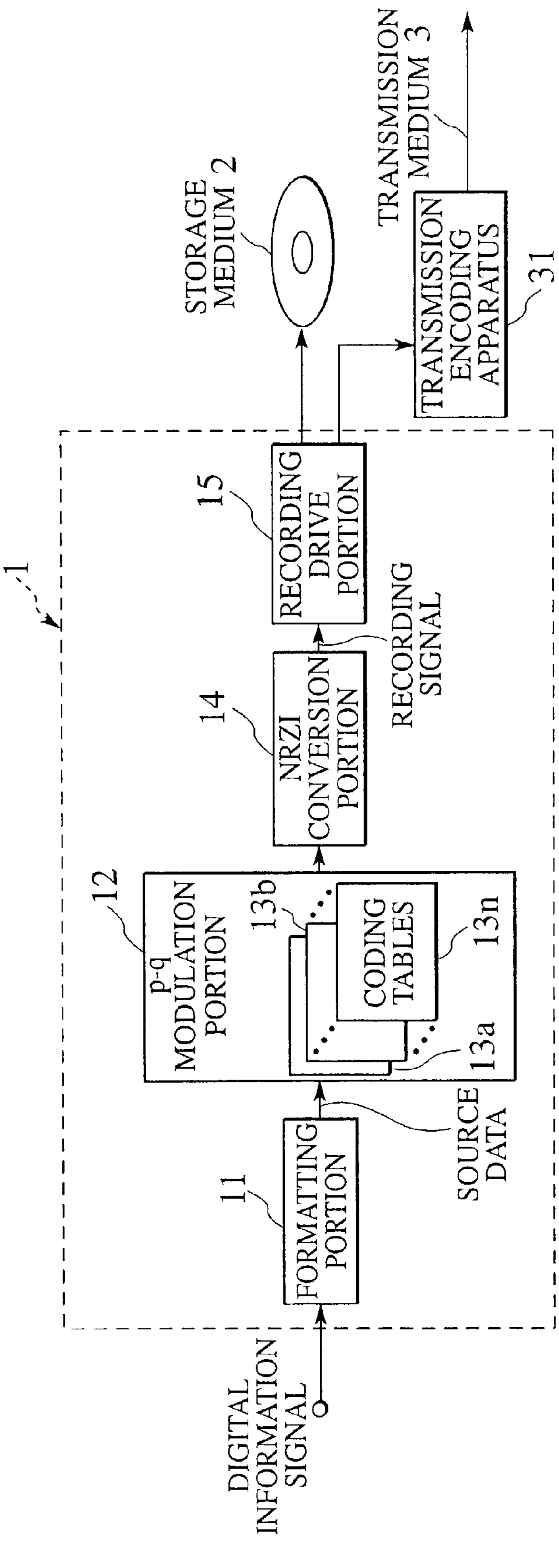
FIG. 1 is a schematic block diagram of a digital signal modulation apparatus according to a first embodiment of the present invention.

FIG. 1 shows a schematic structure of a digital signal modulation apparatus to which an embodiment of the digital signal modulation method is applied.

The digital signal modulation apparatus 1 illustrated in the drawing is constituted by a formatting portion 11, a p-q modulation portion 12, coding tables 13*a*, 13*b*, . . . , 13*n*, an NRZI (Non Return to Zero Inverse) conversion portion 14, and a recording drive portion 15. A signal of the digital signal modulation apparatus constituted in this manner is supplied to a recording apparatus (not shown) used for recording information on a storage medium 2, or supplied to a transmission medium 3 through a transmission encoding portion 31. An outline of the operation of the digital signal modulation apparatus 1 will now be given.

A digital information signal such as video or sound compressed and encoded based on MPEG (moving picture experts group)-2 or the like is supplied to a formatting portion 11 where an error correction code is added to the supplied digital information signal, supplied data is scrambled, interleaved or the like. The thus processed information signal is divided into source data each consisting of p bits (p is an integer larger than 1, e.g., 4), and the divided source data each consisting of p bits is supplied to the p-q modulation portion 12.

The p-q modulation portion 12 is a circuit which block-converts a signal of the source data which is an information signal supplied in p bits to generate a signal consisting of q-bit (q is an integer larger than p, e.g., 6) encoding data. Further, the p-q modulation portion 12 treats a predetermined number of source data as a unit and operates to insert a predetermined synchronous word each unit.

Furthermore, the p-q modulation portion 12 includes the coding tables 13*a*, 13*b*, . . . , 13*n*, and the supplied source data is outputted as a code word series signal obtained by sequentially block-converting source data into q-bit code words while the DSV (Digital Sum Value) control based on the later-described method is performed making reference to the coding tables 13*a*, 13*b*, . . . , 13*n*.

The code word series signal obtained by the block conversion is supplied to the NRZI conversion portion 14 where the supplied coded bit series signal is subjected to NRZI conversion. A digital modulation signal obtained by the conversion is supplied to the recoding drive portion 15. In order to record the inputted digital modulation signal onto the storage medium 2 which is, e.g., an optical disk, the recording drive portion 15 changes the intensity of a laser beam in accordance with the digital modulation signal. The laser beam whose intensity has been changed is emitted onto the storage medium 2, and recording of the digital modulation signal according to the intensity is performed.

Moreover, the digital-modulated signal is supplied to the transmission encoding portion 31, and second digital modulation is carried out in such a manner that this signal is turned into a signal suitable as a signal to be transmitted through the transmission medium 3. Then, the modulated signal is transmitted through the transmission medium 3.

Here, for example, even if the digital modulation signal obtained by the digital signal modulation apparatus 1 is supplied to any other peripheral as a base band signal and the inter-apparatus ground potential is different between the digital signal apparatus 1 and any other peripheral and they are coupled by a high-frequency transformer or the like, the digital modulation signal outputted from the digital signal modulation apparatus 1 hardly includes a direct-current component. Therefore, the digital modulation signal can be stably transmitted.

In this way, the digital signal modulation apparatus 1 performs p-q modulation and NRZI modulation on the inputted digital information signal so that the direct-current component can be suppressed, optically modulates the modulated signal, and outputs as output light a laser beam obtained by the optical modulation, or outputs a digital modulation signal as a base band signal to be supplied to the transmission medium 3.

Detailed explanation will now be given as to the structure and the operation of the p-q modulation portion 12 which is a primary part of the digital signal modulation apparatus 1.

Figure 2:
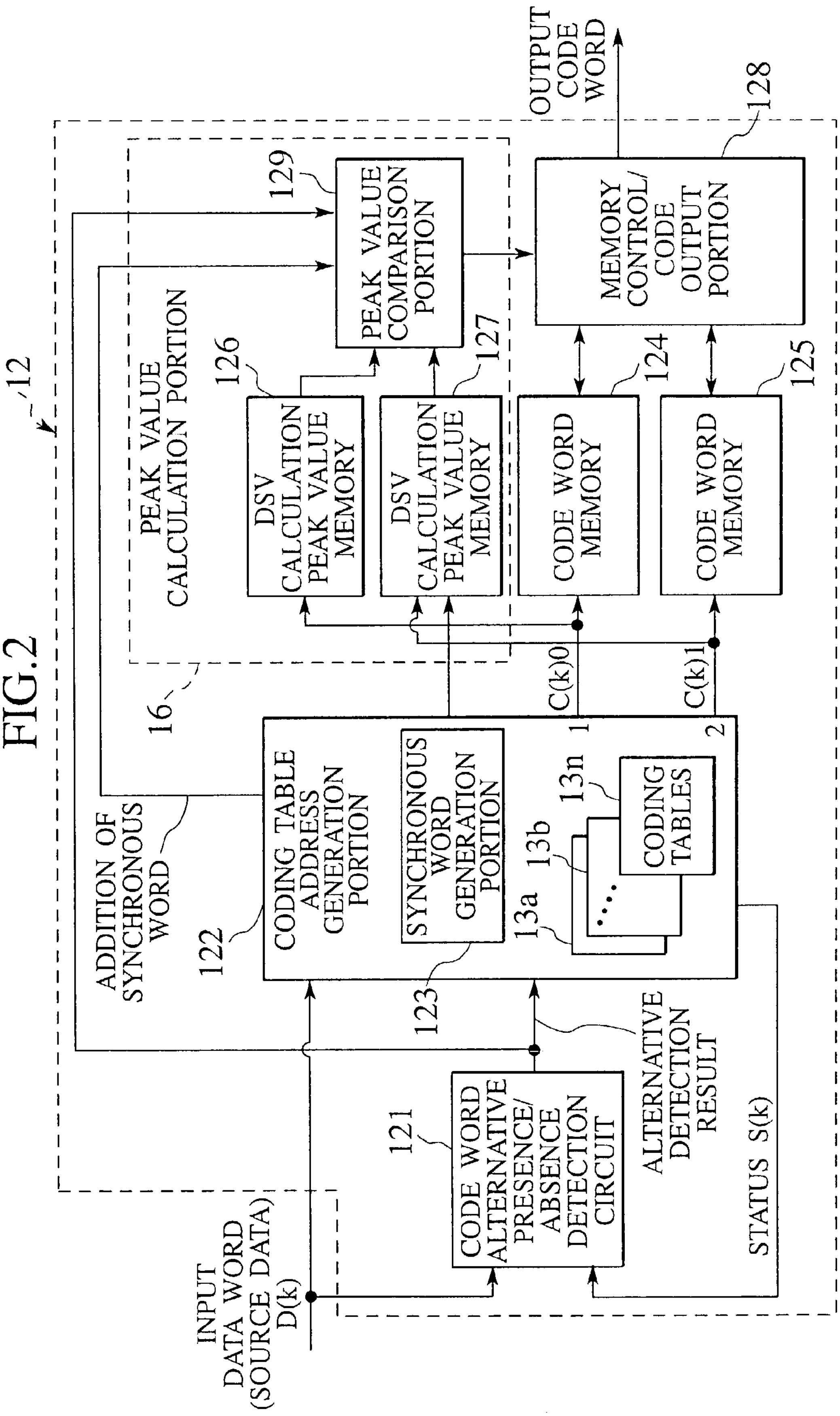
FIG. 2 is a block diagram showing a p-q modulation portion which is a primary part of the digital signal modulation apparatus according to the first embodiment of the present invention.

FIG. 2 shows the structure of the p-q modulation portion 12 in detail.

The p-q modulation portion 12 in the drawing is constituted by a code word alternative presence/absence detection circuit 121, a coding table address generation portion 122 including coding tables 13*a*, 13*b*, . . . , 13*n* and a synchronous word generation portion 123, a code word memory 124, a code word memory 125, a peak value calculation portion 16, and a memory control/code output portion 128. Further, the peak value calculation portion 16 is constituted by the DSV calculation peak value memory 126, the DSV calculation peak value memory 127 and the peak value comparison portion 129.

The operation of the p-q modulation portion 12 constituted in this manner will now be described.

The synchronous word generation portion 123 generates two types of synchronous words corresponding to a status S(k) which is a function representing a status, for each predetermined number of sets of p-bit source data. That is, the two synchronous words have respective DSV polarities which are reverse from each other, and they are code words which are preset so as to become the numbers of 1 included in respective code bits thereof different from each other. One synchronous word is supplied to the code word memory 124 as C(k)0, and the other synchronous word is supplied to the code word memory 125 as C(k)1. These two synchronous words are supplied to the DSV calculation peak value memory 126 and the DSV calculation peak value memory 127, respectively. Each DSV calculation peak value memory performs the calculation of DSV and obtains a peak value of an absolute value thereof. The memory content of the peak value which has been previously stored is updated to a newly obtained peak value. At the same time, these synchronous words are stored in the respective code word memories, and supply of the source data is started after the operations as described above with respect to the synchronous words.

The source data D(k) supplied from the formatting portion 11 is supplied to the address generation portion 122, and the source data is also supplied to the code word alternative presence/absence detection circuit 121. The code word alternative presence/absence detection circuit 121 detects whether the series of the source data includes a code word which can be replaced with another code word, which will be described later.

A result of detection concerning presence/absence of an alternative obtained by this detection is supplied to the coding table address generation portion 122. The coding table address generation portion 122 performs different operations depending on the case where an alternative is detected and the case where an alternative is not detected.

Description will be first given as to the operation when an alternative is not detected.

When a code word concerning an alternative which can satisfy later-described conditions is not detected in the source data, the source data supplied in the form of p bits is uniquely code-converted into q-bit encoding data. The coding tables 13*a*, 13*b*, . . . , 13*n* store the code words, and the code words obtained by performing code conversion using the coding tables 13*a*, 13*b*, . . . , 13*n* are outputted by specifying address values with respect to the coding tables 13*a*, 13*b*, 13*n*.

Since there is only one code data which can be obtained in this manner, the one obtained code word is supplied to both the code word memory 124 and the code word memory 125 as C(k)0 and C(k)1, and the respective code words of C(k)0 and C(k)1 are supplied to the DSV calculation peak value memory 126 and the DSV calculation peak value memory 127. Each DSV calculation is carried out in these DSV calculation peak value memories, and each peak value of each absolute value thereof is obtained. Then, the memory content of the previously stored peak value is updated to a newly obtained peak value.

In this manner, the peak value stored in each of the DSV calculation peak value memory 126 and the DSV calculation peak value memory 127 is sequentially updated to a peak value generated from the code word supplied after each of the two synchronous words meanwhile p-q modulation is carried out.

The operation when an alternative is detected in the code word will now be described. When an alternative is detected, two code words can be obtained with respect to one set of p-bit source data to be inputted. As similar to the fact that the two code word series can be created relative to the above-described respective synchronous words, with respect to the two code words, two code word series can be created based on the two code words (namely, four code word series).

Thus, when an alternative of the code word is detected, a code word series which gives a smaller DSV peak value is selected from two code word series relative to the two synchronous words.

The operation for this selection is as follows. The peak value of an absolute value stored in each of the DSV calculation peak value memory 126 and the DSV calculation peak value memory 127 is supplied to the peak value comparison portion 129, and the both peak values are compared with each other in the peak value comparison portion 129. Then, a result of comparison is supplied to the memory control/code output portion 128.

The memory control/code output portion 128 obtains a code word having a smaller peak value of the DSV absolute value as a code word series consisting of the code word supplied after the synchronous word from the code word memory 124 or the code word memory 125 based on the comparison result inputted from the peak value comparison portion 129. The thus obtained code word series is outputted from the memory control/code output portion 128 as a digital modulation signal subjected to p-q modulation.

At the end of such a series of operations, the content of the DSV calculation peak value memories stored in the code word memory 124 and the code word memory 125 is cleared. With respect to the two code word series relative to the two different code words acquired by detection of an alternative, generation of the code word having a small DSV peak value is restarted by DSV value management.

That is, after the peak values of DSV stored in the DSV calculation peak value memory 126 and the DSV calculation peak value memory 127 are once cleared, one of the two code words obtained from the source data is supplied to the code word memory 124 as C(k)0 and the other is supplied to the code word memory 125 as C(k)1. Then, these two code words are respectively stored. The peak values of DSV given from the code words C(k)0 and C(k)1 are respectively supplied to the DSV calculation peak value memory 126 and the DSV calculation peak value memory 127 and temporarily stored.

As described above, two code word series having peak values of DSV different with those of two code word series supplied so far are generated each time two types of synchronous words are generated at predetermined intervals or each time two types of code words are obtained, while each of the two code word series having respective types of DSV polarities is temporarily stored in each code word memory.

Then, at the time when the synchronous words are generated, or two types of selectable code words are obtained, the code word series having a smaller peak value of DSV is determined and outputted as a digital modulation signal. Therefore, although the output signal is a code word series which is intermittent in time, a temporary memory circuit is actually included in the memory control/code output portion 128, and the code word series signal which is once recorded in a buffer is outputted from the p-q modulation portion 12 as a consecutive code word series signal.

Description will now be given as to the coding tables 13*a*, 13*b*, . . . , 13*n* used for performing p-q code conversion.

FIG. 3 shows an example of the coding tables in which p=4 and q=6 and which is under RLL (1, 9) limitation.

The coding tables in this drawing show tables of code words in RLL (Run-length Limited) encoding in which a number of “0” existing between “1” and “1” is restricted to 1 to 9 as (1, 9).

That is, the coding tables includes four tables having four status of S(k)=0 to 3 (in this example, there are coding tables 13*a*, 13*b*, 13*c* and 13*d*, and a, b, c and d respectively correspond to 0, 1, 2 and 3). In these tables, S(k) denotes the status of a coding table; D(k), source data consisting of four (=p) bits; and C(k), a code word consisting of six (=q) bits. C(k) is notated by both a decimal value and a binary value.

In FIG. 3, S(k+1) represents status information concerning C(k+1) selected after C(k). When obtaining the code word C(k+1) relative to the source data D(k+1) to be subsequently inputted, a value to be selected from 0, 1, 2 and 3 as S(k+1) is determined by a numeric value given by S(k+1) in FIG. 3.

Description will now be given as to conditions when the above-described existence of an alternative is detected in the thus obtained C(k).

FIG. 4 shows a table of conditions when conditions of existence of an alternative are judged.

In this drawing, D(k) denotes source data consisting of four bits; C(k), a code word consisting of six bits; S(k), a status of the table at a time k; L(k−1), an low order zero-run length of C(k−1).

In this table, the condition of existence of an alternative shown as, e.g., a condition 1 corresponds to the case that S(k)=3; the low order zero-run length L(k−1) of the preceding code word is 4 or 5 and D(k) is not more than 6, or L(k−1) is 6 and D(k) satisfies any of 1, 3 and 5. Under this condition, the code word can be changed with a counterpart of S(k)=1.

Therefore, since there is a changeable code word when a condition corresponding to one of the six conditions shown in FIG. 4 occurs, a signal indicative of existence of the alternative is outputted from the code word alternative presence/absence detection circuit 121 shown in FIG. 2 as an alternative detection result. This alternative detection result signal is supplied to the peak value comparison portion 129, and comparison between the DSV peak values of the two code word series is started.

Comparison processing of the DSV peak values is also performed at a point in time of generation of the synchronous signal. The synchronous signal will now be described.

Figure 5:
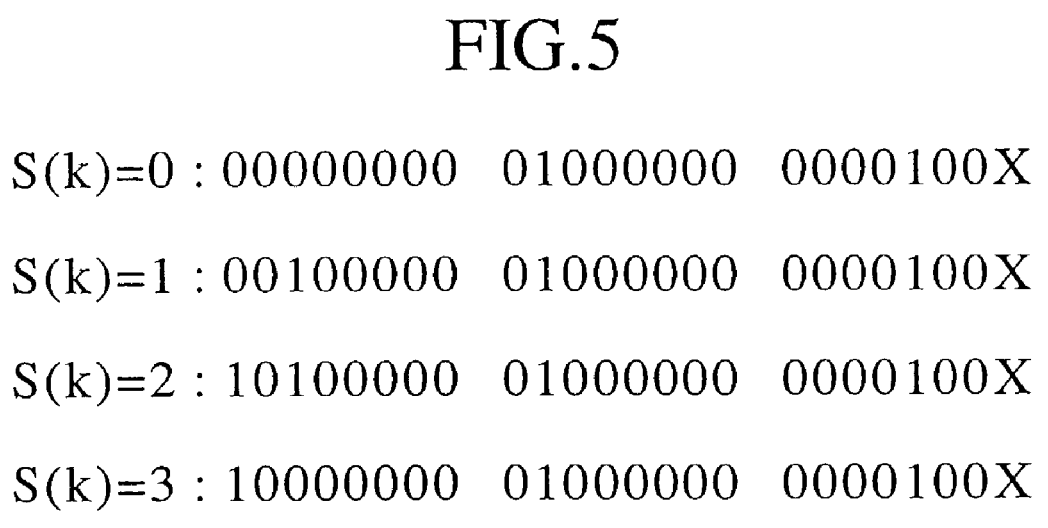

FIG. 5 shows an example of four synchronous signals used in accordance with a value of S(k).

In the drawing, there are shown synchronous codes each consisting of 24 bits which are given in accordance with the respective statuses that S(k) is 0 to 3, the least significant bit X of each code indicates that the bit may be inverted. It is assumed that the status changes to S(k)=1 after these synchronous signals.

When the synchronous words inserted at predetermined intervals or two types of selectable code words are generated based on the conditions shown in FIG. 4, the code word series signal having a smaller peak value of DSV is outputted from the p-q modulation portion 12. Description will now be given on the operation with reference to a flowchart.

Figure 6:
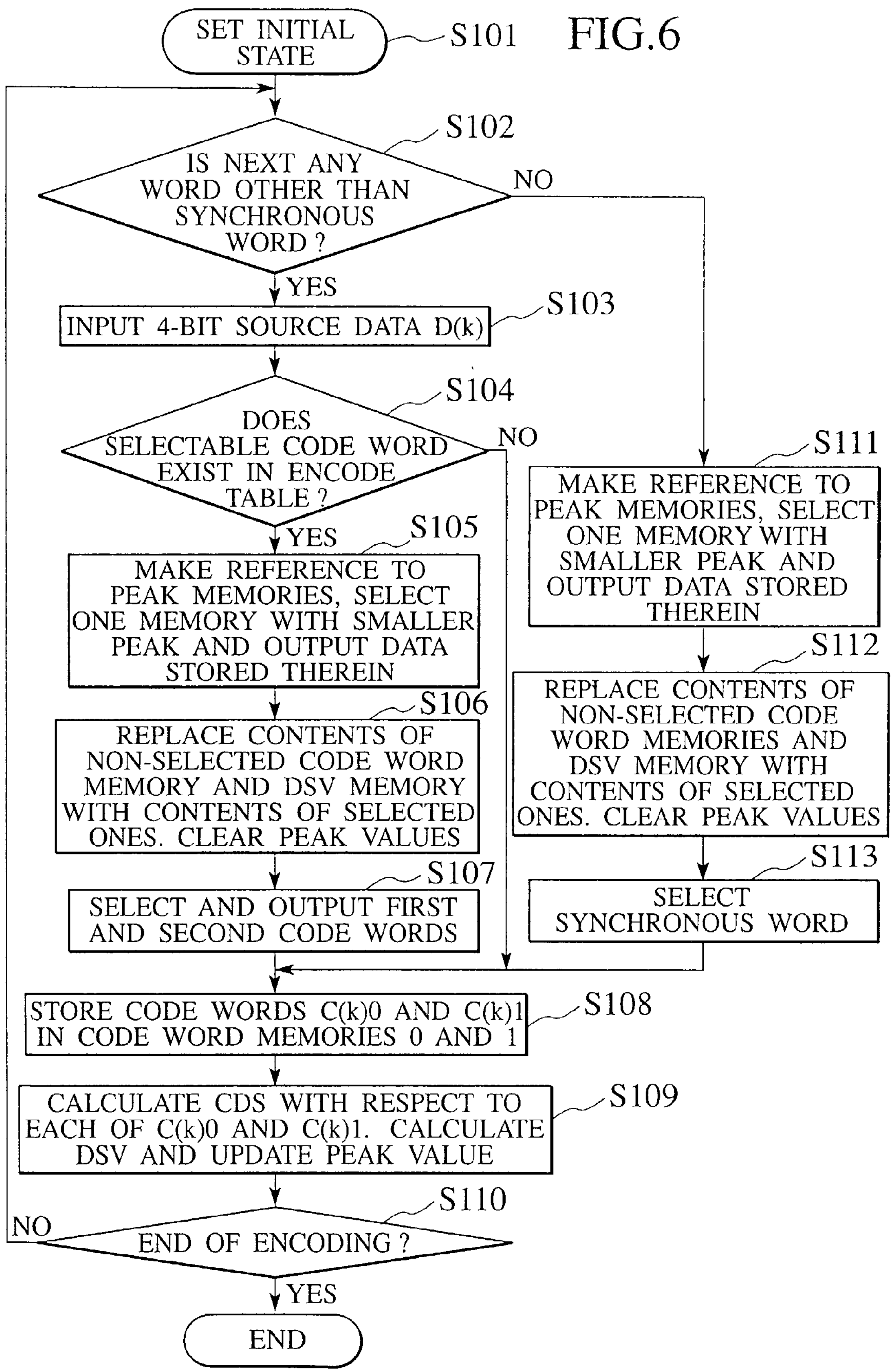
FIG. 6 is a flowchart showing an operation of the p-q modulation portion according to the first embodiment of the present invention.

FIG. 6 shows the operation of the p-q modulation portion in the form of a flowchart, and this operation will be explained.

The initial state is first set so as to take an arbitrary S(k) (step S101), and judgment is made upon whether any word other than the synchronous word is supplied. In case of the synchronous word (No at a step S102), reference is made to peak values of DSV stored in the respective peak memories in the DSV calculation peak value memories 126 and 127.

Then, the code word series signal which has a smaller peak value of DSV given by each code word series and is stored in the code word memory 124 or 125 is selected and outputted (step S111).

After outputting the code word series signal, the stored content of the code word memory which has not been selected is replaced with that of the selected code word memory, and the content of the non-selected DSV memory is rewritten by that of the selected DSV memory. Then peak values stored in the selected and non-selected peak value memories are cleared (step S112).

After clearing the peak values, the synchronous word shown in FIG. 5 is selected in accordance with a value of S(k) (step S113). For example, the synchronous word having LSB of 0 is supplied to the code word memory 124, and the synchronous word having LSB of 1 is supplied to the code word memory 125 (step S108).

However, the change of the code word is not performed when the code word is not temporarily stored in the memory since the stored content of the memory has been supplied as an output signal here.

Although the above has described on the operation when the synchronous word is generated, the operation when the synchronous word is not generated will now be explained.

That is, at a point in time when modulation target data to be supplied is any data other than a synchronous word (Yes at a step S102), the source data D(k) consisting of four bits is supplied to the code word alternative presence/absence detection circuit 121 (step S103).

As to the code word supplied to the code word alternative presence/absence detection circuit 121, whether there is a code word matching with any condition shown in FIG. 4 is detected. If existence is detected (Yes at a step S104), reference is made to the peak memories 126 and 127, the code word memory having a smaller peak value is selected, and the code word series signal stored in the code word memory is outputted (step S105).

After outputting the code word series signal, the stored content of the non-selected code word memory is replaced with the content of the selected code word memory, and the content of the non-selected DSV memory is replaced with the content of the selected DSV memory. Then, values of the peak values stored in the both peak value memories are cleared (step S106).

After clearing the peak values, the first and second code words are selected from the coding tables shown in FIG. 3. The first code word is supplied to the code word memory 124, and the second code word is supplied to the code word memory 125, thereby being stored in the respective memories (step S108).

After storing the code words, a value of CDS (Code Word Digital sum) is calculated with respect to each of the code words C(k)0 and C(k)1 supplied to the first and second code word memories, and a value of DSV is obtained based on that value. The peak value is updated so that the calculated value of the peak value is stored in each peak memory (step S109).

After such a series of operations, judgment is made upon whether encoding has been completed (step S110). If encoding has been completed (Yes at a step S110), encoding is terminated. If it is yet to be completed (No at the step S110), the processing is returned to the step S102.

In this manner, the code word series signal having a smaller peak value of DSV is obtained, and the obtained signal is acquired as an NRZI-modulated signal which has a small direct-current component when NRZI-modulated.

Figure 7B:
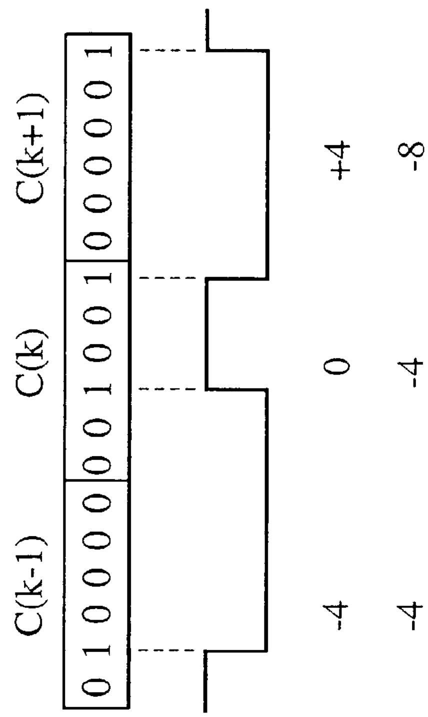
FIGS. 7A and 7B are views showing examples of values of CDS and DSV with respect to a generated code word according to the first embodiment of the present invention.
Figure 7A:
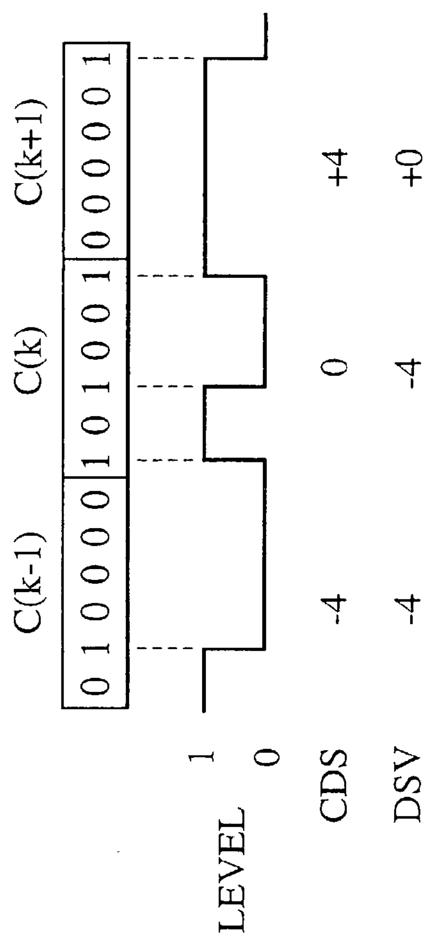

FIGS. 7A and 7B show examples of values of CDS and DSV corresponding to the generated code word signal.

FIGS. 7A and 7B show two code words, and C(k−1) and C(k+1) are the same code words in FIGS. 7A and 7B. C(k) is a changeable code word matching with a condition shown as the condition 1 in FIG. 4. This is the case where the code word "101001" is selected in FIG. 7A and the code word "001001" is selected in FIG. 7B.

Further, in FIG. 7A, since CDS of each code word is −4, 0 or +4 and modulation is carried out from the level 1, DSV to C(k+1) is 0. Furthermore, in FIG. 7B, CDS is likewise −4, 0 or +4, and DSV to C(k+1) is −8. That is because DSV inversion with respect to C(k) is carried out due to the fact that a number of "1" in C(k) differs between FIG. 7A and FIG. 7B.

When the code word matching with the condition shown in FIG. 4 is supplied in this manner, the digital modulation signals having DSV characteristics different from each other can be obtained by the fact that the code words having DSV polarities different from each other are used as shown in FIG. 7A and FIG. 7B.

Of the thus obtained two code word series, the code word series having a smaller direct-current component of the digital modulation signal generated after NRZI modulation must be selected and acquired. Description will now be given as to the method for determining the code word series based on the DSV level up to a plurality of DSV conversion points where the output code word is determined.

Figure 8:
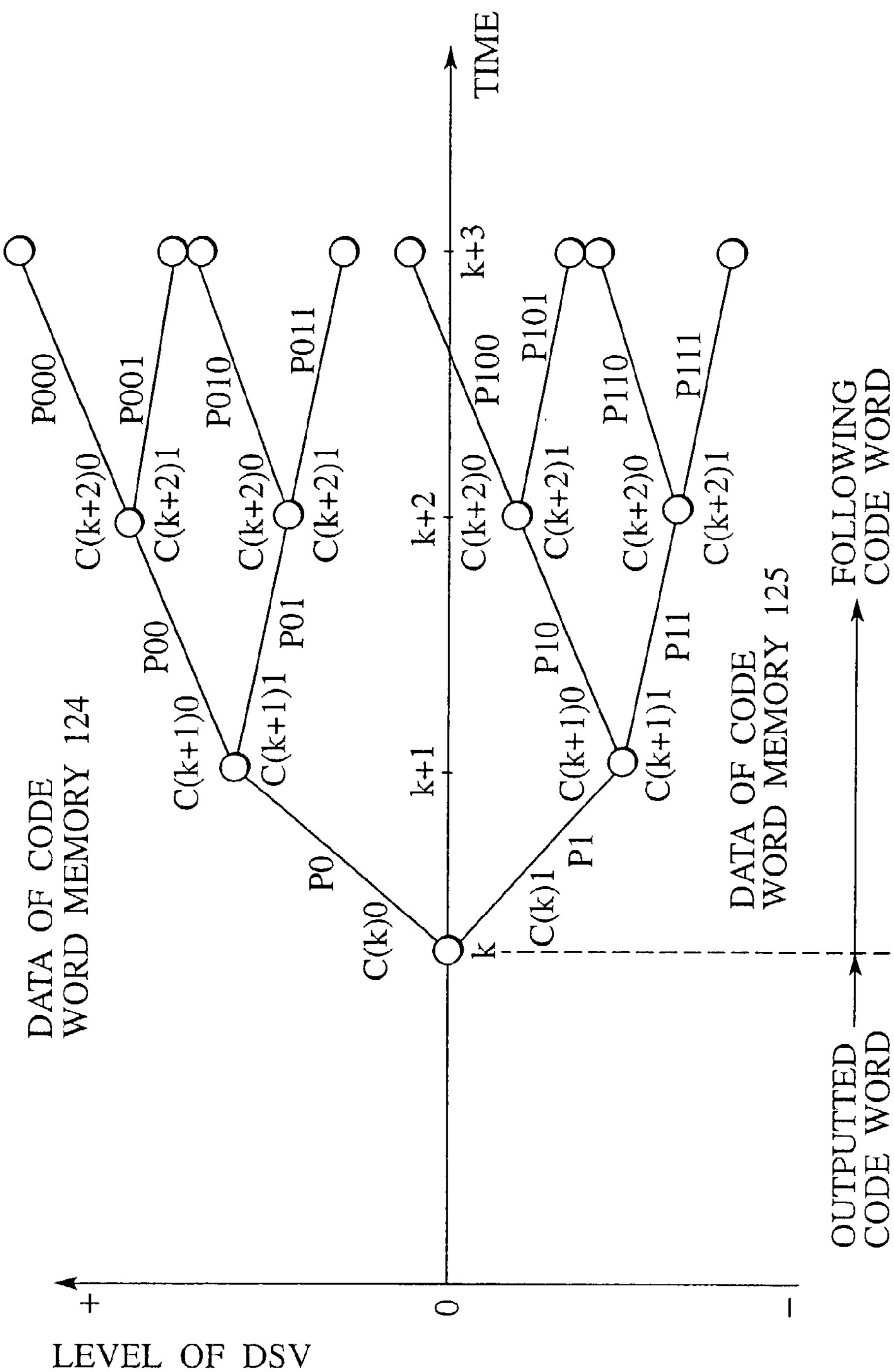
FIG. 8 is a view showing how the code word and a DSV level varies in time according to the first embodiment of the present invention.

FIG. 8 shows an example of the relationship between the code word and the DSV level used for explaining the operation of the peak value calculation portion 16 illustrated in FIG. 2.

In the drawing, the horizontal axis represents a time base, and the vertical axis represents a value of DSV. Moreover, times k, k+1, k+2 and k+3 corresponds to the time when the code word matching with the condition enabling DSV conversion occurs or the synchronous word is inserted.

In addition, at the time k, the code word series has been already selected and determined and the code word series before the time k is outputted as the code word. This means that there is no code word remaining in the code word memories 124 and 125.

Additionally, P0 is a peak value of DSV when C(k) is the head in a section from k to k+1, and P1 is likewise a peak value of DSV when C(k)1 is the head. Similarly, four peak values P00, P01, P10 and P11 exist in a section from k+1 to k+2, and eight peak values P000, P001, P010, P011, P100, P101, P110 and P111 exist in a section from k+2 to k+3.

In this manner, data of eight peak values is obtained at the time k+3. Description will now be given as to the method of determining based on the obtained data a code cord concerning a code word series to be selected which is temporarily stored in the code word memory 124 or the code word memory 125 at the time k+1.

That is, the time k+1 is a time when the selectable code word or synchronous signal has appeared, and the code word memory 124 and the code word memory 125 respectively store therein the code word having C(k)0 as the head and the code word having C(k)1 as the head.

Further, as to selection of the code word memory at the time k+1, whether the peak level up to the time k+3 is smaller when C(k)0 is selected or whether the peak level is smaller when C(k)1 is selected is calculated and accordingly the selection is determined.

Calculation of the peak level is performed in the peak value calculation portion 16. In the peak value calculation portion 16, it is good enough to calculate the peak level up to k+3 when C(k)0 is selected and the peak level up to k+3 when C(k)1 is selected. Furthermore, the code word in a section from the time k+1 to the time k+3 does not have to be stored in the code word memory, calculating only the DSV level and the peak level of the code word can suffice.

The code word memory selection conditions will now be described. That is, it is assumed that the minimum value of the following is min(P0):

$$P0+P00+P000;$$

$$P0+P00+P001;$$

$$P0+P01+P010; \text{ and}$$

$$P0+P01+P011$$

Also, it is assumed that the minimum value of the following is min(P1):

$$P1+P10+P100;$$

$$P1+P10+P101;$$

$$P1+P11+P110; \text{ and}$$

$$P1+P11+P111$$

Then, the code word memory 124 is selected when min(P0) is smaller than min(P1), and the code word memory 125 is selected in any other case.

Understandably, calculation for comparing levels of the DSV values so as to obtain such a result and selecting the code word that the direct-current component of the modulation signal after NRZI modulation gives a minimum value may be executed by any other method than the above-described calculation method.

Although the above has described the case where calculation of CDS is performed in accordance with each code word bit, a value of CDS may be obtained in advance with respect to each code word, and the obtained value of CDS may be previously stored as a table, thereby acquiring the CDS value by using this table.

FIG. 9 is a table showing values of CDS obtained for the respective code words.

In this drawing, a value of CDS for each code word is calculated when the input level is 1, and the value of CDS obtained from a value of source data D(k) and a value of S(k) corresponds to each code word in the coding table of FIG. 3.

Although the values of CDS are obtained based on the values of source data, the code word series of the digital signal having a smaller direct-current component can be previously selected based on the thus obtained value of CDS.

Then, in the description of the operation in FIG. 1, the code words outputted from the code word memories 124 and 125 are NRZI-converted for example. However, the code word strings after NRZI conversion may be stored in the code word memories 124 and 125.

Furthermore, although FIG. 5 shows an example of the synchronous signals, any synchronous word may be selected under the condition that each synchronous word is a synchronization pattern which can be readily distinguished from the code word, and the two synchronous words have DSV values different from each. Even if any other synchronization patter is used, completely the same operation is enabled.

Moreover, in the above example, description has been given as to an example of the coding table of four statuses for converting four bits into six bits. Of course, any other method for performing modulation by using the coding table used for converting p bits into q bits and the structure of the modulation apparatus employing this method are enabled. It is good enough to select appropriate values of p and q in accordance with the characteristic of the digital modulation signal to be obtained. For example, a number of conditions of existence of an alternative shown in FIG. 4 can be increased by changing values of p and q, and the code series with an increased frequency can be selected.

As described above, according to this embodiment, DSV control can be performed by using the peak values of DSV of the recording code series, and the peak level can be effectively lowered as compared with conventional control using DSV, thereby effectively reducing the dispersion of DSV of the recording code words.

Moreover, the digital modulation signal generation method which maintains the peak level value of the DSV value small has been mainly described because it is often the case that even one part having large peak level can be a factor which adversely affects the tracking performance or the like if such a part exists during reproduction of the thus generated signal recording medium.

However, when the fast response performance is not demanded in the circuit which performs such control, for example, when the average level of the control signal is used and reproduction control of the optical disk reproduction apparatus or reproduction control for special reproduction is performed, the peak value of the DSV value must be restricted to a small value, and the level of the average value must be also limited to a small value. In addition, control for maintaining the average value of the direct-current component of the modulation signal after NRZI modulation to a small value can be likewise effected by changing the above-described peak value control to the average value control.

<Second Embodiment>

Figure 10:
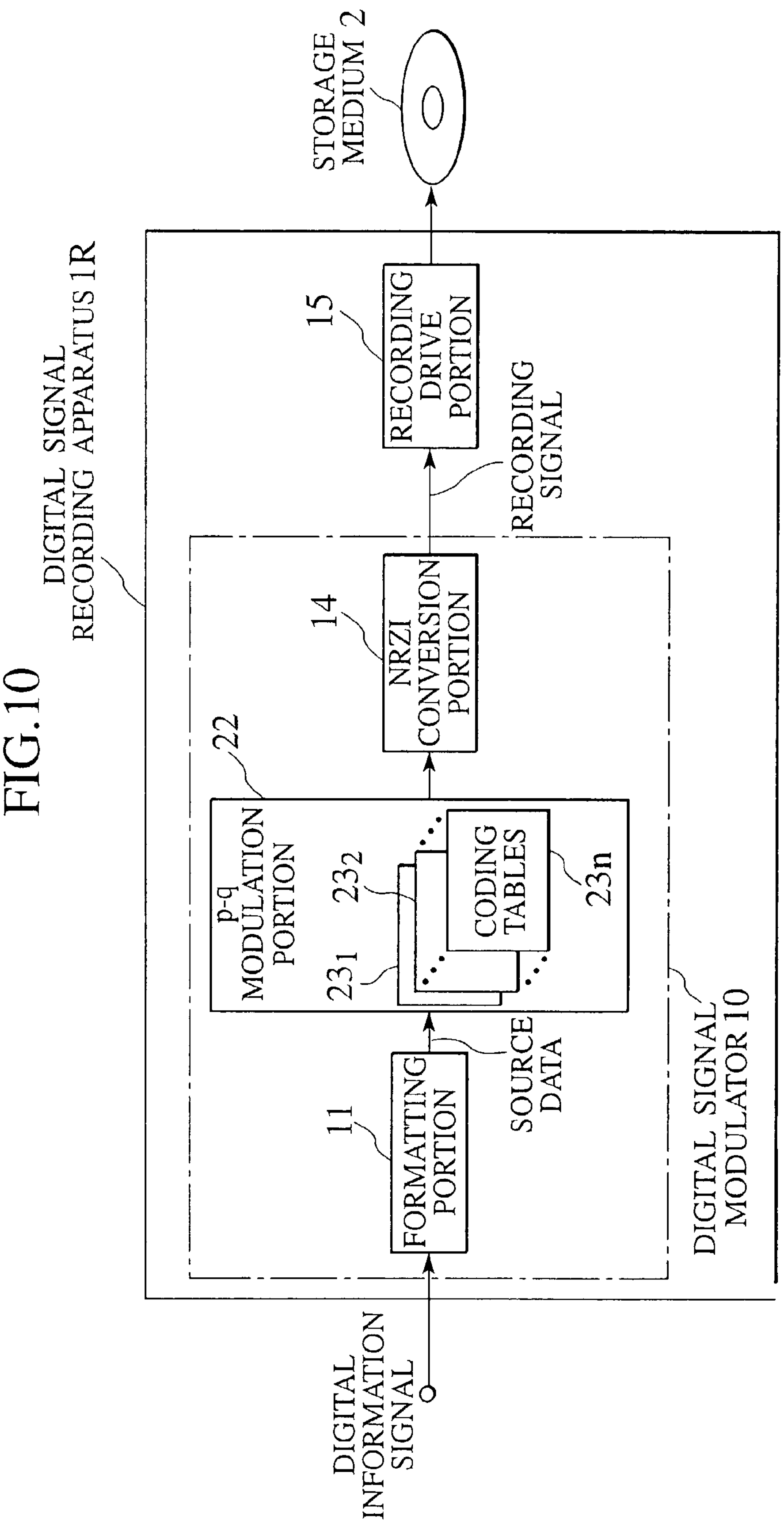
FIG. 10 is a schematic block diagram showing an example of a digital signal recording apparatus having a digital signal modulation apparatus according to a second embodiment of the present invention mounted thereon.

A second embodiment according to the present invention will now be described with reference to the drawings. In FIG. 10, like reference numerals denote parts equal to those in FIG. 1. FIG. 10 is a schematic structural view showing an example of the digital signal recording apparatus adopting the digital signal modulation method and the digital signal modulation apparatus according to the present invention. In the drawing, the digital signal recording apparatus 1R consists of the digital signal modulator 10 and the recording drive portion 15. The digital signal modulator 10 constituted by the formatting portion 11, the p-q modulation portion 22, the coding tables $\mathbf{23}_1$, $\mathbf{23}_2$, . . . , $\mathbf{23}_n$ and the NRZI (Non Return to Zero Inverse) conversion portion 14. The digital signal recording apparatus 1R modulates an inputted digital information signal by the digital signal modulator 10 and obtains a digital modulation signal. Thereafter, the digital signal recording apparatus 1R performs high-density recording on a storage medium 2 such as an optical disk by using the recording drive portion 15.

The operation of the digital signal recording apparatus 1R will now be described. At first, a digital information signal such as video or sound which has been subjected to compression and encoding based on MPEG(moving picture experts group)-2 is supplied to the formatting portion 11, and processing such as addition of an error correction code, scrambling of the supplied data or interleaving is applied to the supplied digital information signal, and the thus processed information signal is divided into source data each consisting of p bits, and each divided p-bit source data is supplied to the p-q modulation portion 22.

The p-q modulation portion 22 is a circuit which subjects a signal of the source data which is an information signal supplied every p bits to block conversion and generates a signal consisting of encoded data of q bits (q is an integer larger than p and it is 6 for example). Moreover, the p-q modulation portion 22 regards a predetermined number of sets of source data as a unit and operates so as to insert a preset synchronous word every predetermined unit number of sets of source data.

For this operation, the p-q modulation portion 22 includes n types (n is an integer not less than 2) of the coding tables $\mathbf{23}_1$, $\mathbf{23}_2$, . . . , $\mathbf{23}_n$, and outputs the supplied source data as a code word series signal obtained by block-converting the supplied source data into the q-bit code word while performing DSV (Digital Sum Value) control based on the later-described method making reference to the plurality of coding tables $\mathbf{23}_1$, $\mathbf{23}_2$, . . . , $\mathbf{23}_n$.

The block-converted code word series signal is supplied to the NRZI conversion portion 14 where this signal is subjected to NRZI conversion to be turned into a digital modulation signal. This digital modulation signal is supplied to the recording drive portion 15 as a signal which changes the intensity of a laser beam (modulates the intensity of a laser beam) for recording the signal onto the storage medium 2 which is, for example, an optical disk. The storage medium 2 is irradiated with a laser beam whose intensity has been changed, and recoding of the digital modulation signal according to the intensity of the laser beam is performed.

In this manner, the digital signal recording apparatus 1R applies p-q modulation and NRZI modulation on the supplied digital information signal so as to suppress the direct-current component, optically modulates the modulated signal, and supplies the thus obtained laser beam to the storage medium 2 as output light, thereby performing recording.

Detailed description will now be given as to the structure and the operation of the p-q modulation portion 22 which is a primary part of the digital signal modulator 10 and forms an embodiment of the digital signal modulation method and the digital signal modulation apparatus according to the present invention.

Figure 11:
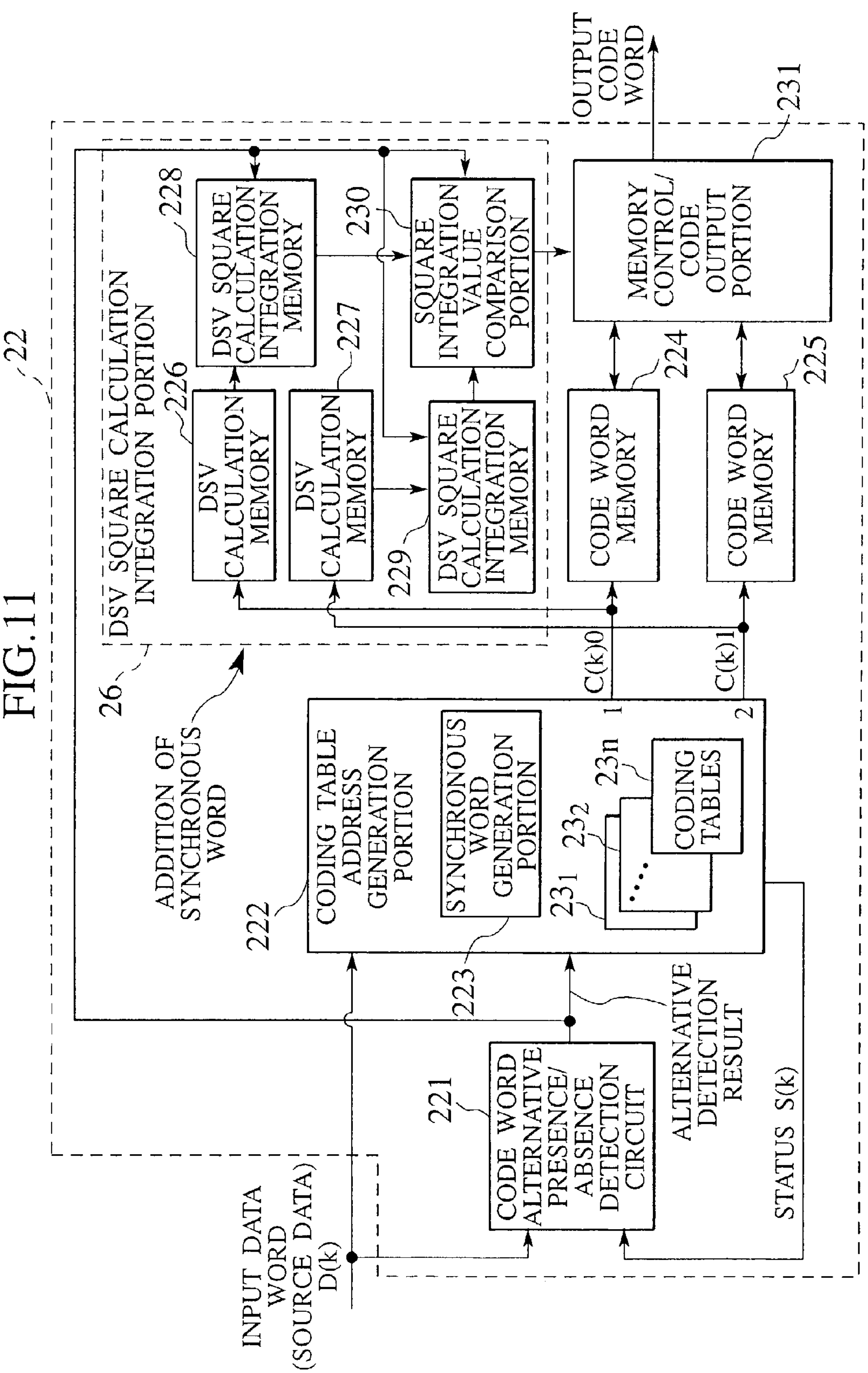
FIG. 11 is a block diagram showing a p-q modulation portion which is a primary part of the digital signal modulation apparatus according to the second embodiment of the present invention.

FIG. 11 is a block diagram showing an embodiment of the digital signal modulation apparatus according to the present invention which constitutes the p-q modulation portion 22. In the drawing, the p-q modulation portion 22 is constituted by the code word alternative presence/absence detection circuit 221, the coding table address generation portion 222 including the coding tables $\mathbf{23}_1$, $\mathbf{23}_2$, . . . , $\mathbf{23}_n$ and the synchronous word generation portion 223, the first code word memory 224, the second code word memory 225, the first DSV calculation memory 226, the second DSV calculation memory 227, the first DSV square calculation integration memory 228, the second DSV square calculation integration memory 229, the square integration value comparison portion 230, and the memory control/code output portion 231. In addition, the DSV calculation memory 226, the DSV calculation memory 227, the DSV square calculation integration memory 228, the DSV square calculation integration memory 229 and the square integration value comparison portion 230 constitute the DSV square arithmetic integration portion 26.

The operation of the p-q modulation portion 22 constituted in this manner will now be described. The synchronous word generation portion 223 generates two types of synchronous words corresponding to the status S(k) every predetermined number of p-bit source data. That is, these two synchronous words are preset code words with the parity in such a manner that a number of 1 included in code bits in one code word is an even number and the same in the code bits is an odd number in the other code word. One synchronous word is supplied as C(k)0 to each of the first code word memory 224 and the first DSV calculation memory 226, and the other synchronous word is supplied as C(k)1 to each of the second code word memory 225 and the second DSV calculation memory 227.

The DSV calculation memory 226 and the DSV calculation memory 227 calculate CDS (Code word Digital Sum) of the respective supplied synchronous words C(k)0 and C(k)1, and update the stored DSV values in the DSV calculation memory 226 and the DSV calculation memory 227. The updated DSV value in the DSV calculation memory 226 is supplied to the first DSV square calculation integration memory 228. At the same time, the updated DSV value in the DSV calculation memory 227 is supplied to the second DSV square calculation integration memory 229, and square calculation of the inputted DSV values are performed in the respective DSV square calculation integration memories 228 and 229. As a result, these values are integrated to previously stored values.

Here, the DSV calculation memory 226 and the DSV calculation memory 227 calculate CDS of the synchronous word or the code word including the previously outputted encoding string data every time the synchronous word or the code word is supplied, and the CDS value obtained from this calculation is added to the immediately preceding DSV value, thereby repeating the operation for updating the DSV value. The DSV values stored in the DSV calculation memories 226 and 227 are the direct-current component data concerning the direct-current component generated when NRZI-converting the code word series data outputted from the code word memories 224 and 225.

Further, when the code word alternative presence/absence detection circuit 221 detects the state enabling DSV control, i.e., the state in which the synchronous words or the code words having the two types of DSV polarities reverse from each other can be selected, the DSV square calculation integration memory 228 and the DSV square calculation integration memory 229 are reset to the state without integrated value by an output from the code word alternative presence/absence detection circuit 221. The integrated values stored in the DSV square calculation integration memories 228 and 229 are square integration data obtained by squaring and integrating the direct-current component data concerning the direct-current component generated when NRZI-converting the code word series data stored in the DSV calculation memories 226 and 227.

When two types of synchronous words which can be DSV-controlled are generated, the DSV square calculation integration memory 228 and the DSV square calculation integration memory 229 are reset, and square calculation values of the DSV values including the newly supplied two types of synchronous words are newly stored.

After a series of the operation relative to the two types of generated synchronous words, supply of the source data is started. The source data D(k) fetched from the formatting portion 11 shown in FIG. 10 is supplied to the coding table address generation portion 222 in FIG. 11 and also supplied to the code word alternative presence/absence detection circuit 221 where whether the later-described code word which can be replaced with the counterpart is included in the series of the source data D(k) is detected.

A result of detection concerning presence/absence of an alternative obtained by the code word alternative presence/absence detection circuit 221 is supplied to the coding table address generation portion 222, and also supplied to the DSV square calculation integration memory 228, the DSV square calculation integration memory 229 and the square integration value comparison portion 230. The operation to be performed is different depending on the case where an alternative has been detected and the case where no alternative has been detected.

Description will be first given on the case where an alternative is not detected. When the code word concerning an alternative matching with the later-described condition is not detected from the source data D(k), the source data which is supplied in the form of p bits is uniquely code-converted into the q-bit encoding data. This code conversion is performed by specifying an address value of a coding table corresponding to a data value stored in the coding tables $\mathbf{23}_1, \mathbf{23}_2, \ldots, \mathbf{23}_n$, and the code word obtained by the code conversion is obtained from the coding table address generation portion 222.

When an alternative is not detected, since there is only one code word which can be obtained in the above-described manner, the one obtained code word is supplied as C(k)0 and C(k)1 to the code word memory 224 and the code word memory 225, and also supplied to the DSV calculation memory 226 and the DSV calculation memory 227. The DSV calculation memory 226 and the DSV calculation memory 227 calculate respective CDSs of the newly supplied code words C(k)0 and C(k)1, add the obtained CDSs to the DSV values of the immediately preceding stored code words, and update the memory contents as the DSV values taking the newly supplied code word into account.

Subsequently, the respective new DSV values outputted from the DSV calculation memory 226 and the DSV calculation memory 227 are supplied to the DSV square calculation integration memory 228 and the DSV square calculation integration memory 229 where square calculation of the inputted DSV values is performed. The square calculation values are added to the immediately preceding integrated values, and the integrated values of the DSV square calculation integration memory 228 and the DSV square calculation integration memory 229 are respectively updated.

In this manner, p-q modulation is carried out while sequentially integrating and updating the DSV square calculation values calculated by using the code words supplied after two synchronous words based on the DSV values stored in the DSV calculation memory 226 and the DSV calculation memory 127.

Description will now be given on the operation when an alternative is detected in the supplied code word. When an alternative is detected, two code words can be obtained with respect to one p-bit source data D(k) to be supplied. In regard to the two code words, as similar to the fact that the two code word series can be respectively created with respect to the two synchronous words, two code word series can be created based on the respective two code words.

Thus, when an alternative is detected in the code word to be supplied, the operation is carried out in order to obtain a code word series which gives a smaller DSV square calculation integration value from the two code word series with respect to the above-described two synchronous words. That is, the DSV square calculation integrated values respectively fetched from the DSV square calculation integration memory 228 and the DSV square calculation integration memory 229 are supplied to the square integration value comparison portion 230 where the both DSV square calculation integrated values are compared with each other in largeness, and the obtained result of comparison is supplied to the memory control/code output portion 231.

The memory control/code output portion 231 obtains the code word having a smaller DSV square calculation integrated value as the code word series consisting of the code word supplied after synchronous word from the code word memory 224 and the code word memory 225, and outputs the thus obtained code word series as a digital modulation signal (output code word) which has been subjected to p-q modulation.

At the end of a series of such operations, the integrated DSV square operation integrated values respectively stored in the DSV square calculation integration memory 228 and the DSV square calculation integration memory 229 are cleared, and similar generation of the code word by DSV value management is restarted for the two code word series relative to the two different code words which are detected and obtained by the above-described alternative.

That is, the DSV square calculation integrated values integrated in the DSV square calculation integration memory 228 and the DSV square calculation integration memory 129 are once cleared, and then one of the two types of code words obtained from the source data D(k) is supplied and stored as C(k)0 in the code word memory 224 while the other code word is supplied and stored as C(k)1 in the code word memory 225. Also, the code words C(k)0 and C(k)1 are supplied to the DSV calculation memory 226 and the DSV calculation memory 227 and the DSV values are updated. Additionally, integration is restarted by using the square calculation values of the DSV values including the two types of code words in the DSV square calculation integration memory 228 and the DSV square calculation integration memory 229.

As described above, generation of two code word series is started every two types of synchronous words created at predetermined intervals or every time two types of code words are created, and the two code word series having the two types of DSV polarities are respectively temporarily stored in the code word memories 224 and 225.

Then, when the two synchronous words are generated or when two selectable code words are obtained, a code word series having a smaller square calculation accumulated value of DSV is determined and outputted as a digital modulation signal. Therefore, the output digital modulation signal is a code word series which is intermittent in time, but the memory control/code output portion 231 actually includes a temporary memory circuit. The output digital modulation signal is temporarily buffer-stored in this circuit and then outputted from the p-q modulation portion 22 as a continuous code word series signal.

Incidentally, the determined code word series is not outputted to the memory control/code output portion 231 when the code word series is determined, but the contents of the code word memory 224 and the code word memory 225 may be uniformly stored with the determined code word series and the previously determined code word series when the code word series is determined. Further, when all code word series in a predetermined interval, for example, from a synchronous word to a next synchronous word are determined, they may be outputted to the memory control/code output portion 231.

Furthermore, in the above description, the code word series is determined by comparing the DSV square calculation integration values when the next DSV-controllable condition is satisfied starting from the DSV-controllable synchronous word or code word. However, the DSV square calculation integration values in a longer interval may be compared by performing integration of the interval for integrating the DSV square calculation until the next DSV-controllable condition is satisfied. Moreover, the timing is not restricted to the DSV-controllable point in time, but arbitrary point in time, e.g., from the DSV-controllable point to a point in time when a predetermined number of sets of source data are inputted may be set.

Description will now be given as to the coding tables $\mathbf{23}_1$, $\mathbf{23}_2$, . . . , $\mathbf{23}_n$ used for performing p-q modulation. FIG. 12 shows an example of the coding tables in which p=4 and q=6 and which is under the run-length limited rule RLL (1, 9). The coding tables in this drawing show the code words in RLL (Run Length Limited) encoding in which a number of “0” existing between “1” and “1” is restricted to 1 to 9.

The coding tables in FIG. 12 specifically show four coding tables (namely, the coding table $\mathbf{23}_1$ of S(k)=0, the coding table $\mathbf{23}_2$ of S(k)=1, the coding table $\mathbf{23}_3$ of S(k)=2 and the coding table $\mathbf{23}_4$ of S(k)=3 in FIG. 11) having the four status (or table numbers) in which S(k) is “0” to “3”. Moreover, D(k) denotes source data (input data word) consisting of four (=p) bits, and C(k) designates an output code word consisting of six (=q) bits after conversion. C(k) is notated by both a decimal value and a binary value.

In addition, S(k+1) in the coding table represents status information (table number) of the coding table used for encoding the next source data D(k+1) in order to obtain a next code word which satisfies the RLL(1, 9) limitation even if it is directly combined with the output code word C(k). That is, in accordance with the status information S(k) indicative of one coding table used for encoding (modulating) the source data D(k), the status information S(k+1) of the coding table used for encoding (modulating) the source data D(k+1) which is subsequently inputted is stored as a table in association with the former information.

Description will now be given as to the condition when existence of the above-described alternative is detected in the output code word C(k) obtained making reference to the coding table. FIG. 13 shows six conditions when determining existence of an alternative. In the drawing, D(k) denotes a value (decimal numeral) of source data consisting of four bits; C(k), an output code word consisting of six bits; S(k), a status (table number) of the table at a time k; and L(k−1), a low order zero-run length of C(k−1).

In FIG. 13, for example, the condition of existence of an alternative shown as the condition 1 is that the low order zero-run length L(k−1) of the preceding code word is “4” or “5” and a value of the source data D(k) is not more than “6”, or L(k−1) is “6” and a value of D(k) is any of “0”, “1”, “3” and “5” when using the coding table $\mathbf{23}_4$ of S(k)=3. When this condition 1 is satisfied, the code word can be replaced with the counterpart in the coding table $\mathbf{23}_2$ of S(k)=1.

In addition, in FIG. 13, for example, the condition of presence of an alternative shown as the condition 3 is that the low order zero-run length L(k−1) of the preceding code word is not less than “1” and not more than “4”, and also a value of the source data D(k) is “0” or “5” when using the coding table $\mathbf{23}_3$ of S(k)=2. When this condition 3 is satisfied, the code word can be replaced with the counterpart in the coding table $\mathbf{23}_1$ of S(k)=0.

Therefore, when any one of the six conditions shown in FIG. 13 is satisfied, there is a replaceable code word, and hence the code word alternative presence/absence detection circuit 221 shown in FIG. 11 detects whether any one of these six conditions is satisfied. When any one condition is satisfied, a signal indicative of presence of an alternative is outputted as a result of alternative detection, and the alternative detection result signal is supplied to the square integration value comparison portion 230, and DSV square calculation integrated values of the two code series are compared with each other.

Figure 14:
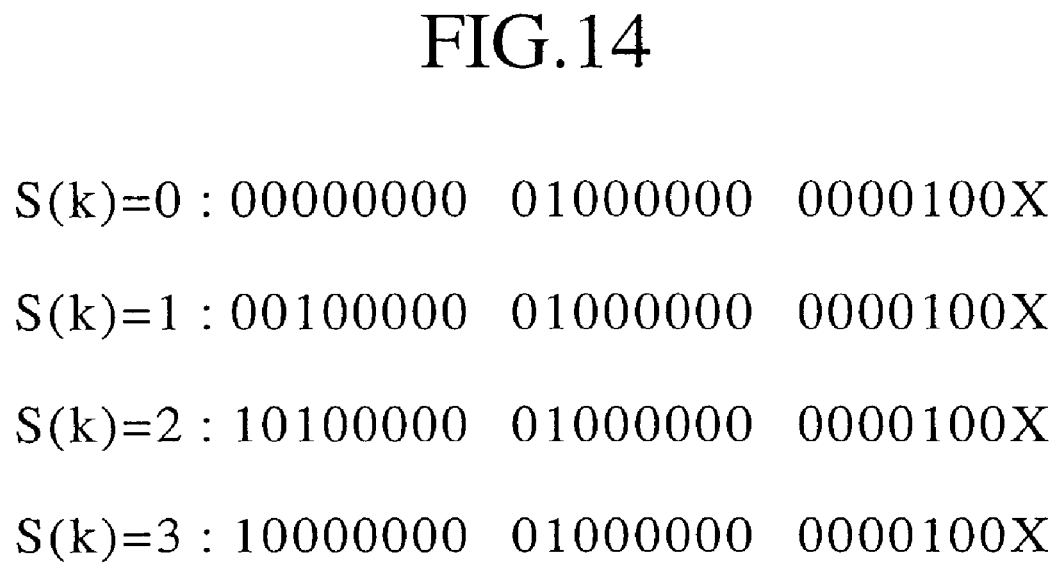

Comparison processing of the DSV square calculation integrated values is also performed when the synchronous word (synchronous signal) is generated. The synchronous word (synchronous signal) will now be described. FIG. 14 shows an example of four synchronous words used in accordance with a value of S(k).

In the drawing, there are shown synchronous words each consisting of 24 bits which are used in accordance with the four coding tables in which S(k) is 0 to 3, and illustrates that the least significant bit of each of these words can be inverted in the form of X. Furthermore, it is assumed that a value of S(k) is changed to S(k)=1 after these synchronous words.

In this manner, when the two types of selectable code words are generated based on the synchronous words inserted at predetermined intervals or the conditions shown in FIG. 13, the code word series signal having a smaller DSV square calculation integrated value is selected and outputted as an output signal from the p-q modulation portion 22.

Figure 15:
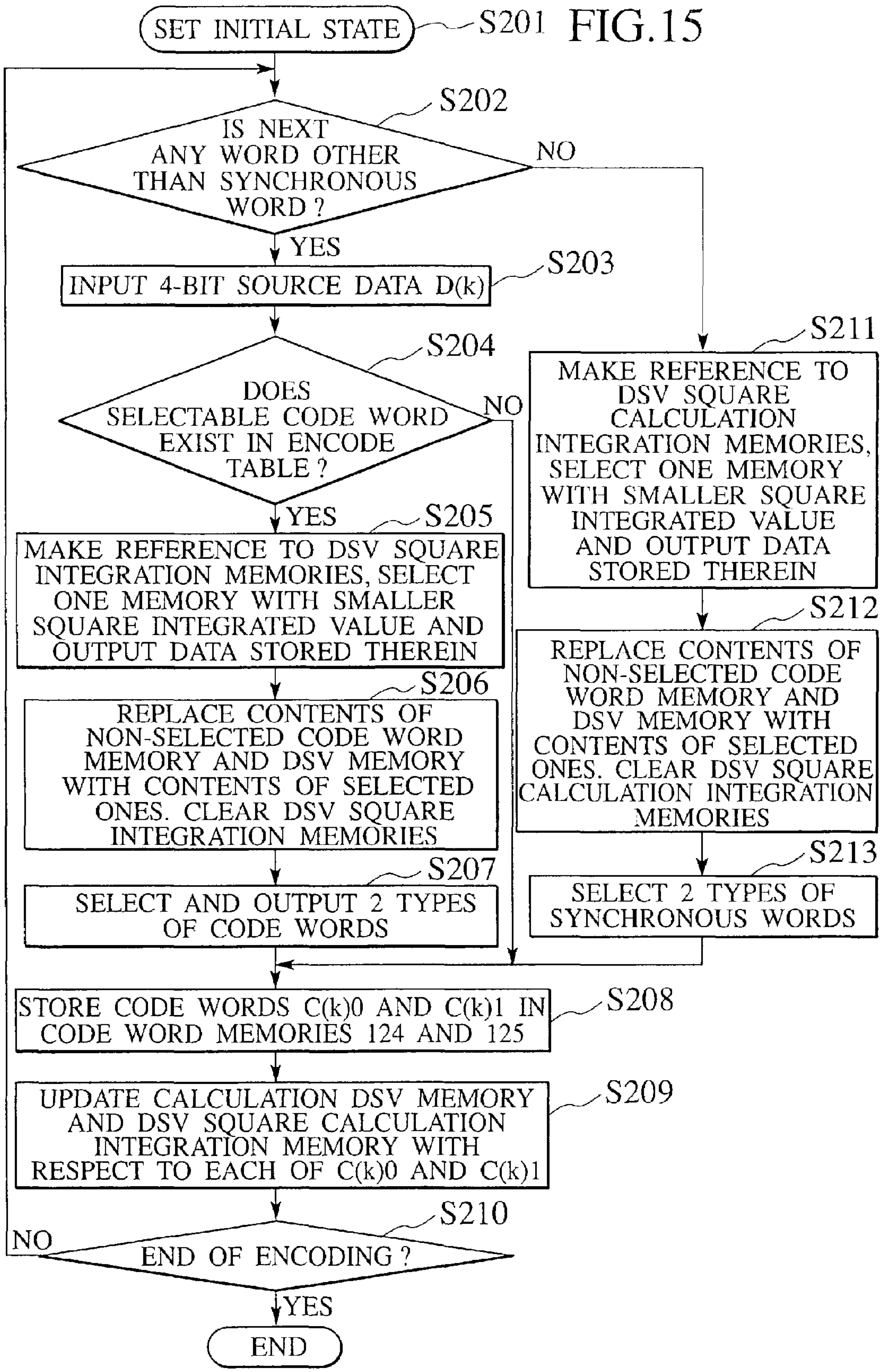
FIG. 15 is a flowchart for illustrating the operation of the second embodiment according to the present invention.

The operation of this embodiment will now be described with reference to a flowchart of FIG. 15. The p-q modulation portion 22 sets the initial state so as to take an arbitrary S(k) (step S201), and judgment is then made upon whether the input data word is a word other than a synchronous word (step S202). If it is a synchronous word, reference is made to the DSV square calculation integrated values respectively stored in the DSV square calculation integration memory 228 and the DSV square calculation integration memory 229 and these values are compared in largeness by the square integration value comparison portion 230. Based on a result of comparison, the memory control/code output portion 231 selects and outputs the code word series signal which has a smaller DSV square calculation integrated value and is stored in the code word memory 224 or 225 as an output code word (step S211).

After outputting the output code word, the stored content of the non-selected code word memory is replaced with that of the selected code word memory, and the content of the non-selected DSV calculation memory is rewritten with the content of the selected DSV calculation memory. Further, the both non-selected and selected DSV square calculation integration memories 228 and 229 clear the DSV square calculation integrated values therein(step S212).

After clearing the DSV square calculation integrated values, the synchronous word shown in FIG. 14 is selected in accordance with a value of the status information S(k) (step S213). For example, the synchronous word having LSB of 0 is supplied to the code word memory 224, and the synchronous words having LSB of 1 is supplied to the code word memory 225 (step S208). The above has described the operation when the synchronous word is generated.

The operation when the synchronous word is not generated will now be explained. When it is determined that a data word supplied as a modulation target is a word other than a synchronous word at the step S202, the 4-bit source data D(k) is supplied to the code word alternative presence/absence detection circuit 221 (step S203).

The code word alternative presence/absence detection circuit 221 detects whether there is a code word matching with any one of the six conditions shown in FIG. 13 in the inputted source data D(k) (step S204), and detects existence of the code word when it matches with any one condition. The code word alternative presence/absence detection circuit 221 outputs a result of detecting existence of an alternative, and this result is supplied to the coding table address generation portion 222. On the other hand, it is also supplied to the DSV square calculation integration memory 228, the DSV square calculation integration memory 229 and the square integration value comparison portion 230.

The square integration value comparison portion 230 makes reference to the DSV square calculation integrated values respectively stored in the DSV square calculation integration memory 228 and the DSV square calculation integration memory 229 and compares them in largeness. Based on a result of comparison, the memory control/code output portion 231 selects the code word series signal with a smaller DSV square calculation integrated value stored in the code word memory 224 or 225, and outputs it as an output code word (step S205).

After outputting the output code word, the stored content of the non-selected code word memory is replaced with the content of the code word in the selected code word memory, and the content of the non-selected DSV calculation memory is replaced with the content of the selected DSV calculation memory. Furthermore, the both non-selected and selected DSV square calculation integration memories 228 and 229 clear the DSV square calculation integrated values therein (step S206).

After clearing the DSV square calculation integration values, the coding table address generation portion 122 uses two replaceable coding tables among the four coding tables shown in FIG. 12 in order to select the first and second code words C(k)0 and C(k)1. Then, it supplies the first code word C(k)0 to the code word memory 224 and the DSV calculation memory 226 and the second code word C(k)1 to the code word memory 225 and the DSV calculation memory 227, thereby storing these words in the respective memories (steps S207 and S208).

As a result, the DSV calculation memories 226 and 227 receive as the code words C(k)0 and C(k)1 the first synchronous word and the second synchronous word after processing at the step S213, the first code word and the second code word after processing at the step S207, or the same code word in case of the code word when it is determined that there is no alternative at the step S104, respectively. The DSV calculation memory 226 and the DSV calculation memory 227 calculate CDS of the newly supplied code words C(k)0 and C(k)1, add the calculated CDS to the DSV values of the immediately preceding stored code word, and update the memory contents as the DSV values including the newly supplied code words (step S209).

Subsequently, the respective new DSV values outputted from the DSV calculation memory 226 and the DSV calculation memory 227 are supplied to the DSV square calculation integration memory 228 and the DSV square calculation integration memory 229 where square calculation of the inputted DSV values is performed, and the square calculation values are added to the immediately preceding integrated values, thereby updating the respective integrated values of the DSV calculation memory 226 and the DSV calculation memory 227 (step S209).

After such a series of operations, judgment is made upon whether encoding be completed (step S210). If it is determined that encoding has been completed, it is terminated. If it is determined that encoding is yet to be completed, the processing is returned to the step S202.

In this manner, the code word series signal having a smaller DSV value is obtained, and the obtained signal is acquired as an NRZI-modulated signal having a small direct-current component when NRZI-modulated.

Next, the relationship between the code word represented as NRZ, a recoding signal converted into NRZI, CDS and DSV will be illustrated, and description will be given as to the fact that the direct-current component can be reduced by selecting code words having different DSV polarities.

Figure 16A:
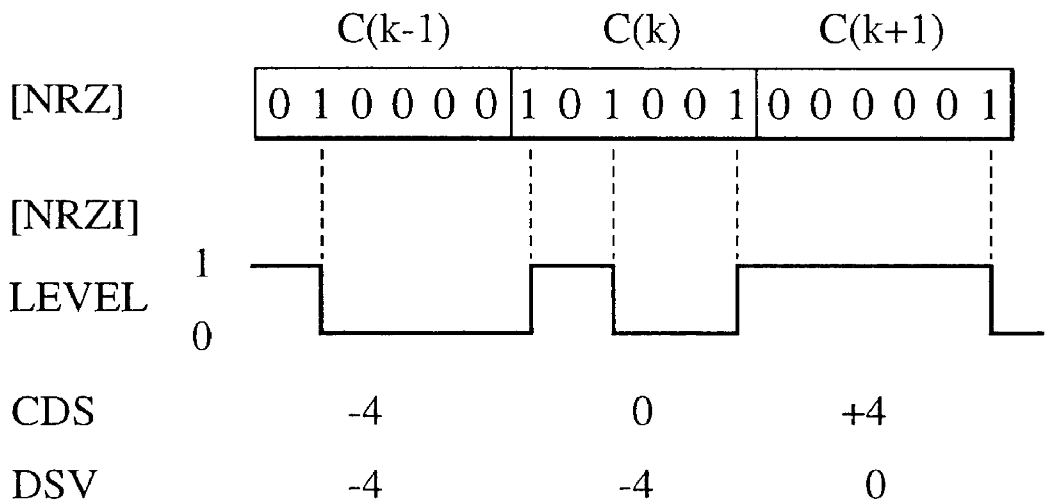
FIGS. 16A and 16B are views showing values of CDS and DSV with respect to code words generated in the second embodiment according to the present invention.
Figure 16B:
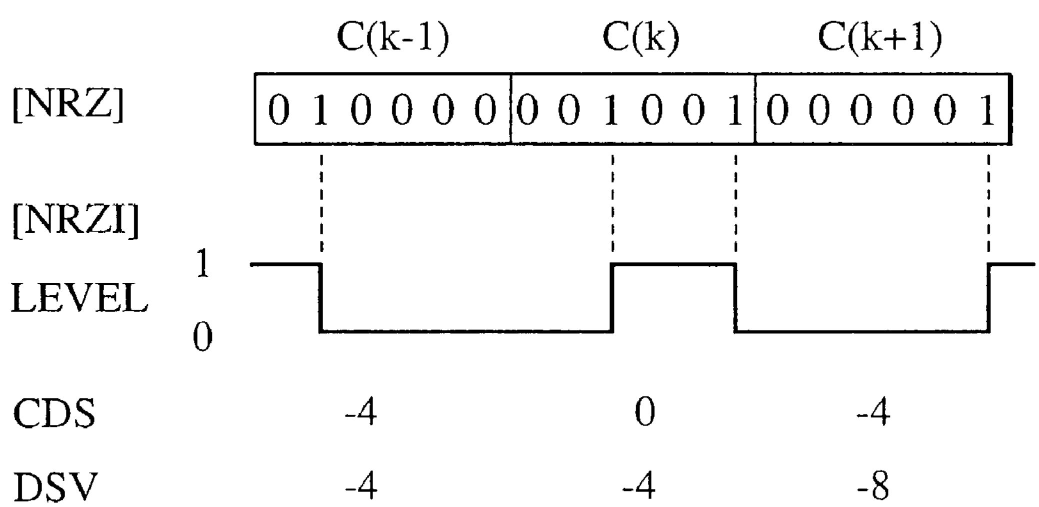

FIGS. 16A and 16B show the code word signal represented as generated NRZ, a signal obtained by NRZI-converting the code word signal, and values of CDS and DSV relative to the signal converted into NRZI.

In the two code word strings represented as NRZ shown in FIGS. 16A and 16B, although C(k−1) and C(k+1) are the same code words, C(k) is a replaceable code word which matches with the condition shown as the condition 1 in FIG. 13. In FIG. 16A, the code word "101001" is selected. On the other hand, in FIG. 16B, the code word "001001" is selected.

As to calculation of CDS and DSV, their values can be obtained by integration as +1 when the level is 1 with respect to the NRZI-converted signal and as −1 when the level is 0 with respect to the same. In FIG. 16A, since CDS of each code word is −4, 0 or +4 and modulated from the level 1, DSV up until C(k+1) is 0. In addition, in FIG. 16B, CDS is −4, 0 or −4, and DSV is −8. That is because a number of "1"

in C(k) differs in FIG. 16A and FIG. 16B, and hence the last bit of the signal obtained by NRZI-converting C(k) is "1" in FIG. 16A while the same is "0" in FIG. 16B, and accordingly DSV of the former is increased by a succeeding code while DSV of the latter is decreased by the succeeding code, and the two DSVs are opposite to each other.

In this manner, when the code word matching with the condition of FIG. 13 is supplied, the code words having different DSV polarities are used as shown in FIGS. 16A and 16B, thereby obtaining the digital modulation signals having different DSV characteristics.

Of the two thus obtained code word series, the code word series having a smaller direct-current component of the digital modulation signal generated after NRZI modulation must be selected. Description will now be given as to the method for determining the code word series by using the DSV level to a plurality of DSV conversion points to which the output code word is determined for this selection.

Figure 17:
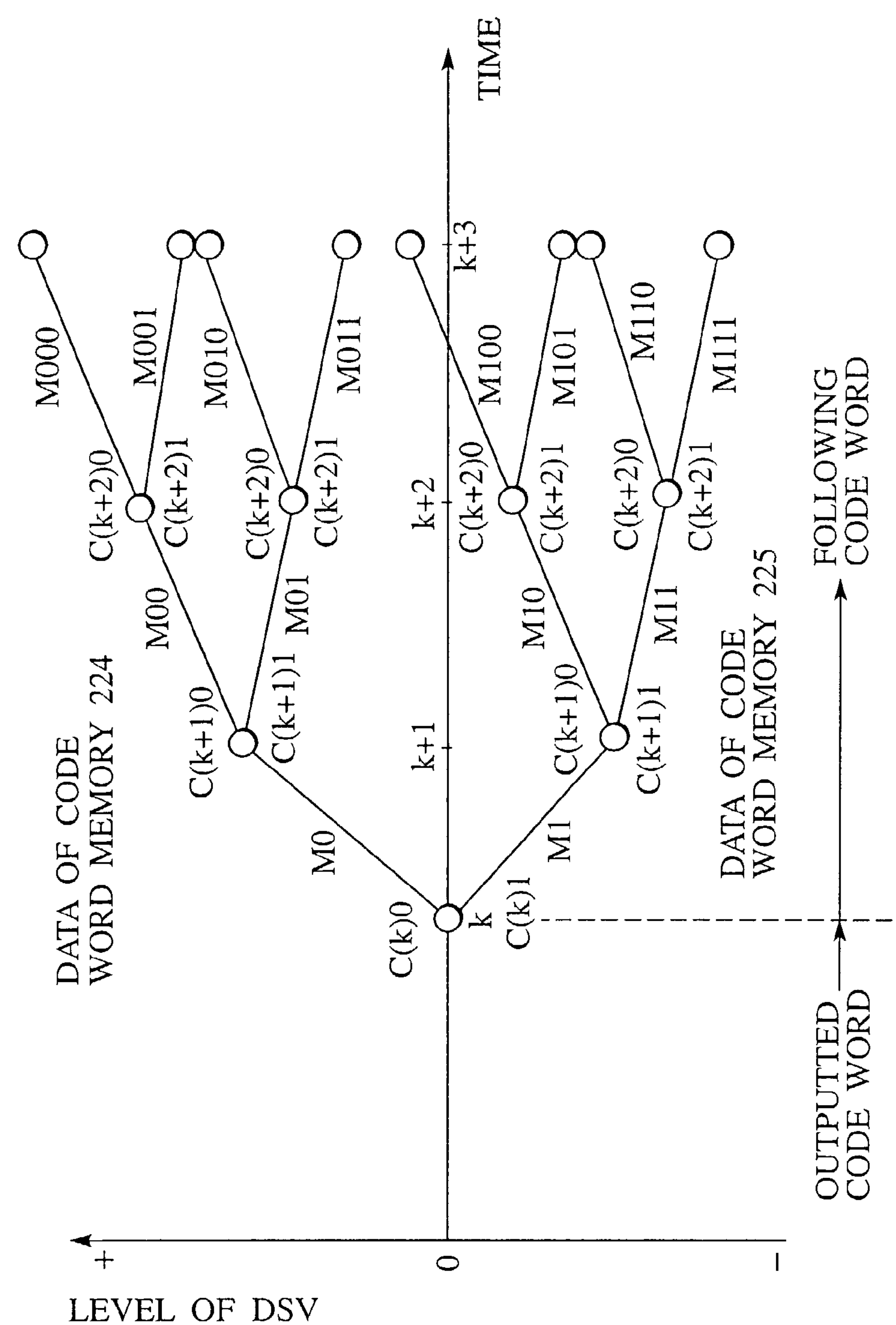
FIG. 17 is a view showing an example of the relationship between the code word and the DSV level for illustrating the operation of a DSV square operation integration portion in FIG. 11 according to the second embodiment of the present invention.

FIG. 17 shows an example of the relationship between the code word and the DSV level in order to illustrate the operation of the DSV square calculation integration portion 16 of FIG. 11. In FIG. 17, the horizontal axis represents a time base, and the vertical axis shows a value of DSV. Additionally, each of times k, k+1, k+2 and k+3 represents a time at which a code word matching with the condition enabling DSV conversion emerges or a synchronous word is inserted. Further, the time k represents the state that there is no code word remaining in the code word memories 224 and 225 since the code word series has been already selected and determined and the code word series before the time k has been outputted as output code words.

Furthermore, M0 denotes a DSV square calculation integrated value when C(k)0 is the head in a section from the time k to the time k+1, and M1 designates a DSV square calculation integrated value when C(k)1 is likewise the head. Similarly, there are four DSV square calculation integrated values M00 to M11 in a section from the time k+1 to the time k+2, and there are eight DSV square calculation integrated values M000 to M111 in a section from the time k+2 to the time k+3.

Data of the eight DSV square calculation integrated values is obtained in the section from the time k to the time k+3 in this way. Description will now be given as to the method for determining the code word which is carried out based on the thus obtained data and concerns selection of any one of the code word series temporarily stored in the code word memory 224 and the code word memory 225 at the time k+1.

The time k+1 is a time at which a selectable code word or a synchronous word has emerged, and the code word having C(k)0 as the head is stored in the code word memory 224 while the code word having C(k)1 as the head is stored in the code word memory 225. Selection of the code word memory at the time k+1 is performed by comparison in smallness between the DSV square calculation integrated value up until the time k+3 when C(k)0 is selected and the DSV square calculation integrated value up until the time k+3 when C(k)1 is selected.

Although calculation of the DSV square calculation integrated values is effected in the DSV square calculation integration portion 16, it is good enough to calculate the DSV square calculation integrated value until the time k+3 when C(k)0 is selected and the DSV square calculation integrated value until the time k+3 when C(k)1 is selected. Furthermore, the code word memories 224 and 225 do not have to store the code words in a section from the time k+1 to the time k+3, and calculating only the DSV calculation value and the DSV square calculation integrated value can suffice.

Conditions for selecting the code word memories 224 and 225 will now be described. That is, it is assumed that a minimum value among the following is min(M1):

M0+M00+M000;
M0+M00+M001;
M0+M01+M010; and
M0+M01+M011

Also, it is assumed that a minimum value among the following is min(M1):

M1+M10+M100;
M1+M10+M101;
M1+M11+M110; and
M1+M11+M111

Then, the code word memory 224 is selected when min(M0) is smaller than min(M1), and the code word memory 225 is selected in any other case.

Although the above has described the case when calculation of CDS is conducted every code word bit, it is possible to obtain the CDS value as a table in advance with respect to each code word and calculate the CDS value by using this table.

FIG. 18 is a table showing the CDS values obtained with respect to the code words. In the drawing, the CDS value of each code word when the last bit is on the level 1 if the code word immediately before each code word in the coding table shown in FIG. 12 is subjected to NRZI conversion, and the CDS values shown in this table correspond to the respective code words in the coding table illustrated in FIG. 12.

Although values of CDS are obtained based on the code words in this manner, the DSV values or the DSV square calculation values can be calculated based on the thus obtained CDS values, and a code word series of a digital signal having a smaller direct-current component can be selected.

Figure 19:
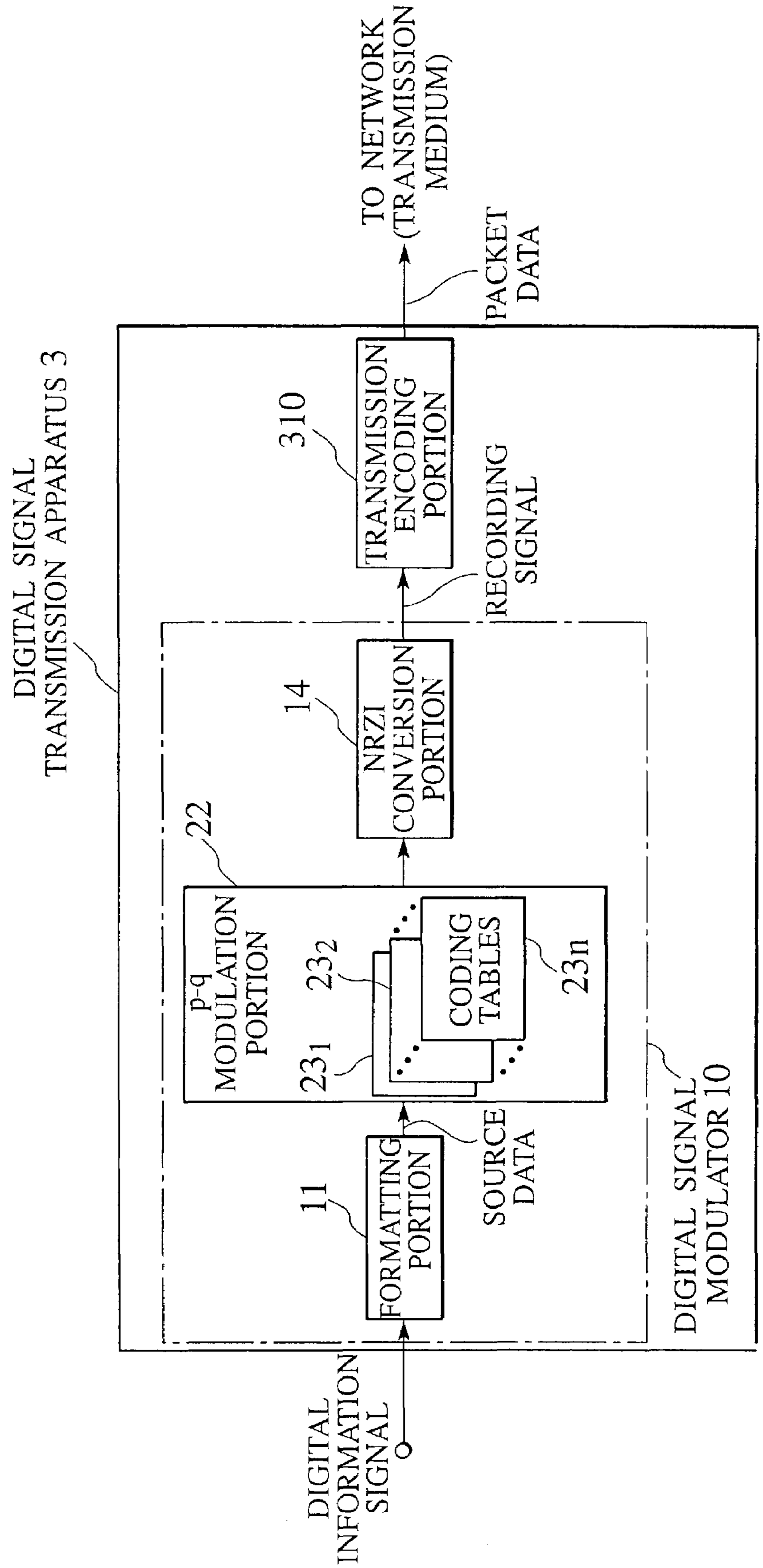
FIG. 19 is a schematic block diagram showing an example of a digital signal transmission apparatus having a digital signal modulation apparatus according to a third embodiment of the present invention mounted thereon.

Incidentally, the recording apparatus which records a signal on a storage medium such as an optical disk has been described in the foregoing embodiments, a digital signal may be transmitted through a network by the digital signal transmission apparatus 3 adopting the digital signal modulation method or the digital signal modulation apparatus according to the present invention as shown in FIG. 19.

<Third Embodiment>

In FIG. 19, the same reference numerals denote the same constituent parts as those in FIG. 10, thereby omitting their explanation. In FIG. 19, a digital modulation signal fetched from the digital signal modulator 10 is supplied to the transmission encoding portion 310 where a second digital modulation is effected according to needs so as to obtain a signal suitable to be transmitted through the network. A header for transmission is then added to this signal, and packet data having the header added thereto is outputted. This packet data is transmitted to the reception apparatus on the other side through the non-illustrated network.

Figure 20:
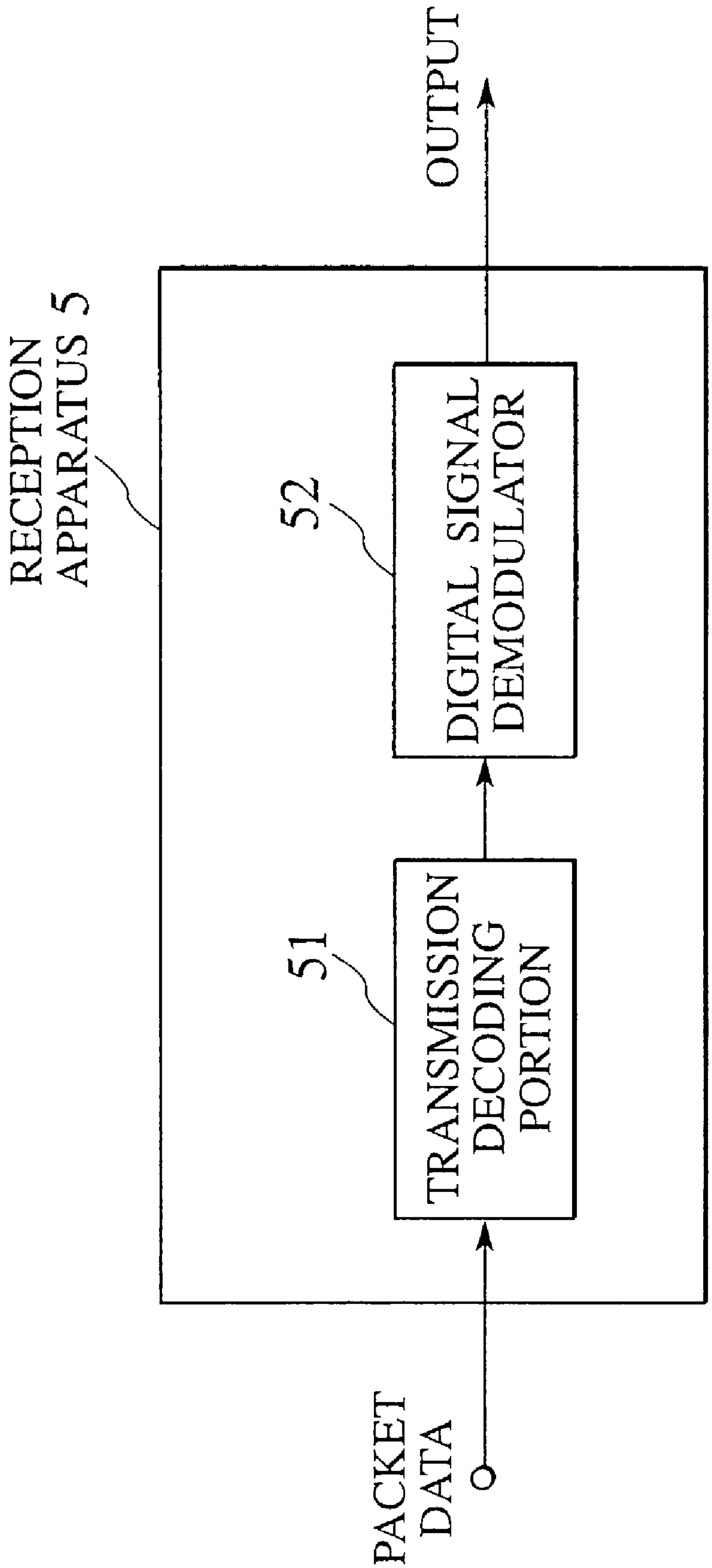
FIG. 20 is a schematic block diagram showing an example of a reception apparatus which receives packet data transmitted from the digital signal transmission apparatus illustrated in FIG. 19.

FIG. 20 is a block diagram showing an example of the above-described reception apparatus. The reception apparatus 5 is configured to have a transmission decoding portion 51 and a digital signal demodulator 52. After the packet data received in the non-illustrated reception portion of the reception apparatus 5 through the network is supplied to the transmission decoding portion 51 and the header is removed, it is supplied to the digital signal demodulator 52 where demodulation is carried out.

Furthermore, for example, in case of supplying the digital modulation signal of the digital signal modulation apparatus to any other peripheral apparatus as a base band signal, even if the ground potential differs between the apparatuses and they are coupled through, e.g., a high-frequency transformer, since there is rarely a direct-current component included in the digital modulation signal, the signal can be stably transmitted.

Incidentally, the present invention is not restricted to the above-described embodiments. For example, in the above explanation of the operation in FIG. 10, the output code word outputted from the code word memory 224 or 225 through the memory control/code output portion 231 is subjected to NRZI conversion, but the recording code word strings which have been subjected to NRZI conversion may be stored in the code word memories 224 and 225.

Moreover, although FIG. 14 shows the examples of the synchronous words, it is good enough that the synchronous words are synchronization patterns which can be readily discriminated from code words and the two synchronous words are set so as to have different DSV values. Also, even if any other synchronization pattern is used, completely the same operation can be performed.

In addition, although the example of the coding tables corresponding to four statuses for converting four bits into six bits has been described in the foregoing embodiments, it is possible to employ any other method for performing modulation by using the coding table which converts p bits into q bits and the structure of the modulation apparatus adopting this method. It is good enough to select appropriate values of p and q in accordance with the characteristic of the digital modulation signal to be obtained. For example, a number of conditions of existence of an alternative shown in FIG. 13 may be increased by changing values of p and q, and an encoded series with an increased frequency may be selected.

Additionally, although respective minimum values of the DSV square calculation integrated values having C(k)0 and C(k)1 as the head in a section from k to k+3 are compared with each other in FIG. 17, M0 and M1 may be compared in order to select and determine a code word, and k+2 or k+4 or higher may be used. A code word may be selected and determined by comparing respective minimum values of the DSV square calculation integrated values having C(k)0 and C(k)1 as the head in a section from k to k+n (n is an integer not less than 1).

Further, the present invention includes a computer program which causes the code word alternative presence/absence detection circuit 221, the coding table address generation portion 222, the code word memories 224 and 225, the DSV square calculation integration portion 26 and the memory control/code output portion 231 shown in FIG. 11 to function by a computer. This computer program is directly loaded on the digital signal recording apparatus 1R of FIG. 10 or the digital signal transmission apparatus 3 of FIG. 19 to function, and also a program distributed from a server through a communication network is loaded on the apparatus 1R or 3.

<Fourth Embodiment>

Figure 21:
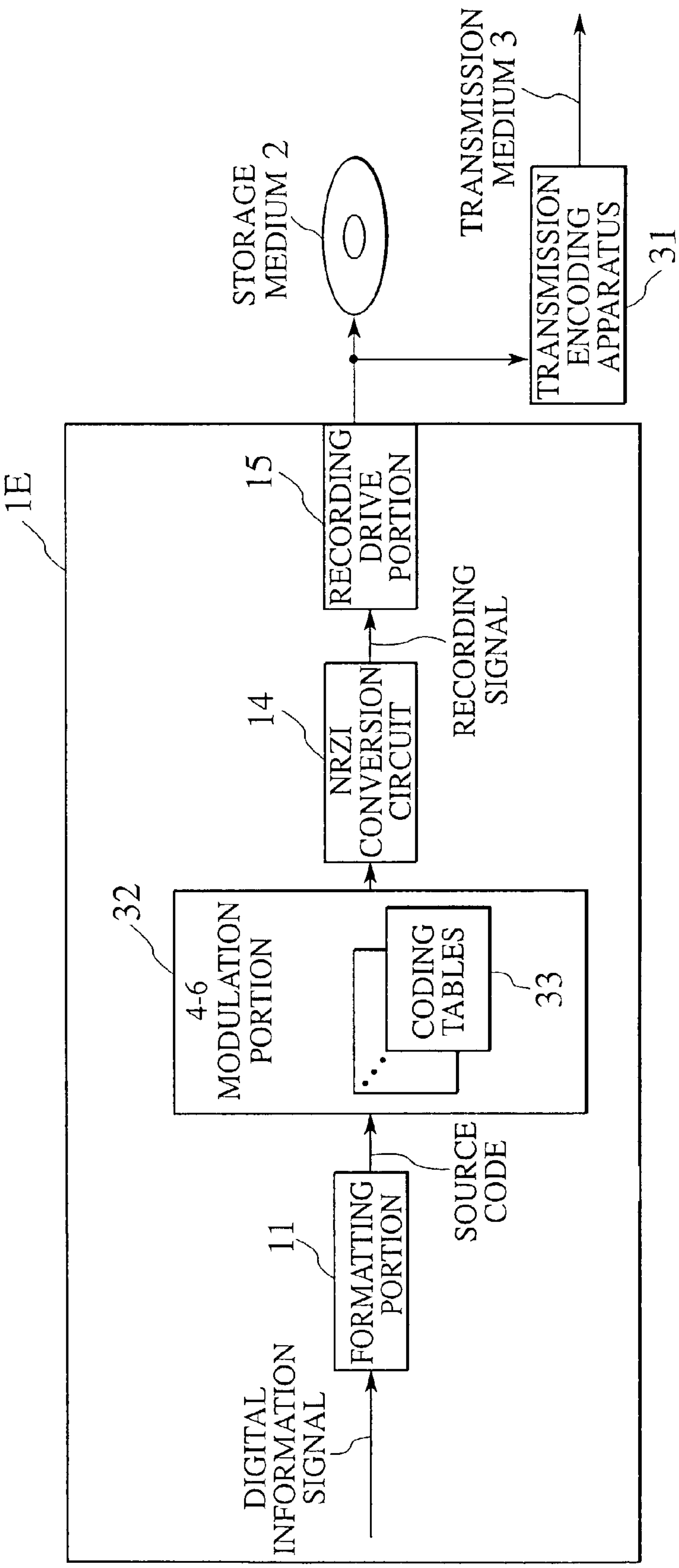
FIG. 21 is a block diagram showing an encoding apparatus according to a fourth embodiment of the present invention.
Figure 22:
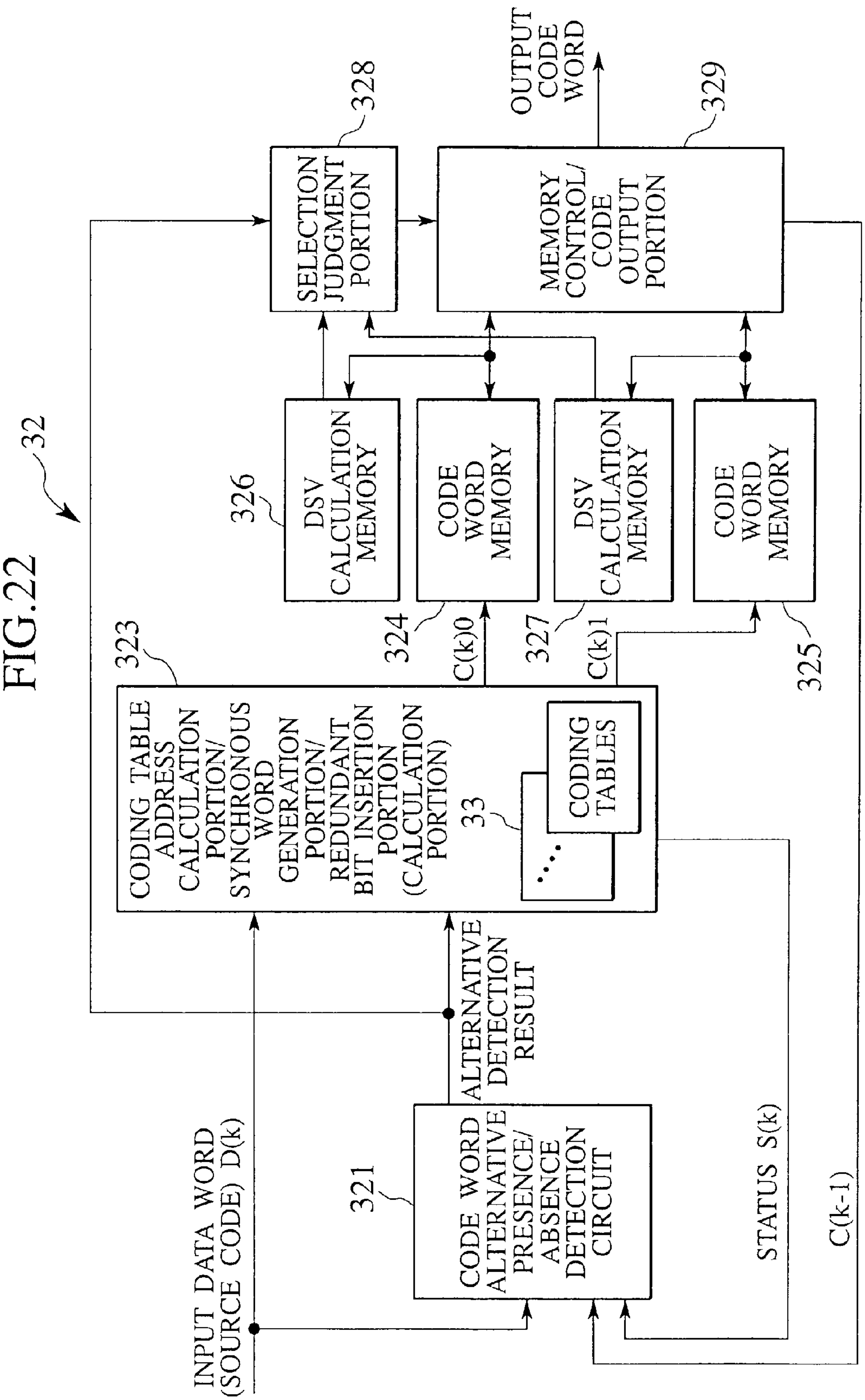
FIG. 22 is a block diagram of a 4–6 modulation portion which is a primary part of the encoding apparatus according to the fourth embodiment of the present invention.

A fourth embodiment according to the present invention will now be described with reference to the drawings. FIG. 21 is a block diagram showing the fourth embodiment of an encoding apparatus according to the present invention, and FIG. 22 is a block diagram of the fourth embodiment showing a primary part of the encoding apparatus according to the present invention. An encoding apparatus 1E according to an embodiment of the present invention will first be described with reference to FIG. 21. A digital information signal obtained by converting an image or sound which should be encoded into a binary sequence by using non-illustrated dispersing means is subjected to so-called formatting such as addition of an error correction code or sector structuralization in accordance with a recording format of a storage medium 2 in a formatting portion 11, turned into source code series each consisting of four bits, and thereafter added to a 4–6 modulation portion 32.

The 4–6 modulation portion 32 performs encoding processing which converts every four bits of the source code into six bits by using a plurality of coding tables 33 shown in FIG. 24 as an example in order to encode a source code to be inputted as will be described later, adds a predetermined a synchronous word and outputs an obtained result as a code word. This output code word is subjected to NRZI conversion by an NRZI conversion circuit 14 to be turned into a recording signal. Then, it is recorded on the storage medium 2 such as an optical disk by a recording drive circuit 15, or subjected to transmission-encoding by a transmission encoding apparatus 31 and transmitted to a transmission medium 3.

FIG. 22 is a block diagram showing a structural example of the 4–6 modulation portion 32 of FIG. 21 in order to explain the operation in more detail. The 4–6 modulation portion 32 is a circuit which modulates (encodes) each input data word (source code) D(k) in units of four bits to an output code word in units of six bits. Here, if the output code word in units of six bits is an output code word in units of six bits which satisfies (1, 7) RLL, a number of types of the output code word is 21 as shown in FIG. 23.

As an example of the coding tables used when performing the calculation for obtaining the output code word in units of six bits which satisfies this (1, 7) RLL limitation, there are four coding tables (coding table number S(k)="0" to "3") such as shown in FIG. 24. In FIG. 24, S(k)="0" to S(k)="3" designate coding table selection numbers respectively allocated to the four coding tables. Further, S(k+1) in FIG. 24 denotes a coding table selection number for selecting a coding table used for next encoding.

The above-described coding tables stores therein an input data word D(k), an output code word C(k) after conversion, and a coding table selection number S(k+1) of the coding table used for encoding a next input data word in order to obtain a next code word which satisfies the (1, 7) RLL even if this code word is directly combined with the output code word C(k) in association with each other.

In the four coding tables, the input data word D(k) is represented by a decimal numeral, and the output code word C(k) after conversion is represented by a decimal numeral or a binary numeral. As to the coding table selection number S(k+1), among the four coding tables, a number of the coding table which is used for encoding a next input data word in order to satisfy the (1, 7) RLL even if the code words are directly combined with each other is represented by a decimal numeral.

Concrete description will be given as to the case where the input data word D(k) in units of four bits is encoded based on the (1, 7) RLL when "4, 5, 6, 7, 8 (decimal)" is inputted as the input data words D(k), D(k+1), . . . with reference to FIG. 26. In the initial state of encoding, an initial selection number of the coding table is determined by the operation such as insertion of a synchronous word whose description is omitted, and the coding table S(k)="0" is selected for example. When the input data word D(k)=4 is inputted to this coding table S(k)="0", the output code word C(k)=18

(decimal) is outputted, and a next coding table selection number S(k+1)="1" is selected.

Subsequently, when the input data word D(k)=5 is inputted to the selected coding table S(k)="1", the output code word C(k)=9 (decimal) is outputted, and a next coding table selection number S(k+1)="1" is selected. Similarly, when the input data word D(k)=6 is inputted to the coding table S(k)="1", the output code word C(k)=2 is outputted, and the coding table selection number S(k+1)="3" is selected. Then, when the input data word D(k)=7 is inputted to the coding table S(k)="3", the output code word C(k)=20 is outputted, and the coding table selection number S(k+1)="1" is selected. Subsequently, when the input data word D(k)=8 is inputted to the coding table S(k)="1", the output code word C(k)=4 is outputted, and the coding table selection number S(k+1)="2" is selected.

As a result, "4, 5, 6, 7, 8 (decimal)" as the input data D(k) are encoded to "010010, 001001, 000010, 010100, 000100 (binary)" and sequentially outputted. Therefore, an output code word string in which the five output code words C(k) are sequentially directly combined becomes 010010001001000010010100000100, and the output code word string which satisfies the limitation of (1, 7) RLL can be obtained.

Although a source code in which an alternative exists does not emerge in this example, the encoding apparatus illustrated in FIGS. 21 to 31 can obtain the code word string which satisfies the (1, 7) RLL and has code words sequentially directly combined with each other from the source codes D(k) each consisting of four bits and S(k) obtained by delaying S(k+1) outputted when outputting the preceding code word by one word (four-bit length in the source code) by using the coding table shown in FIG. 24.

In this embodiment, the 4–6 modulation portion 32 outputs an output code word in units of 6 bits which satisfies the (1, 9) RLL as will be described later by using the four types of coding tables when performing calculation for obtaining an output code word each consisting of six bits which satisfies the (1, 7) RLL as described above.

In regard to allocation of the data word D(k) and the code word C(k), it is possible to change the arrangement so as not to cause a trouble in decoding without violating the encoding rule, and the embodiment according to the present invention is effective in any other structure than the coding tables shown in FIG. 24.

The structure of the 4–6 modulation portion 32 illustrated in FIG. 22 will now be described. The 4–6 modulation portion 12 is constituted by: a code word alternative presence/absence detection circuit 321 to which the input data word (source code) D(k), the output code word C(k−1) and the status information S(k) are respectively inputted; a coding table address calculation portion/synchronous word generation portion/redundant bit insertion portion (which will be referred to as a calculation portion hereinafter) 323 which performs encoding by using the four types of coding tables 33; code word memories 324 and 325; DSV calculation memories 326 and 327 provided in accordance with these code word memories 324 and 325; a selection judgment portion 328; and a memory control/code output portion 329.

The code word alternative presence/absence detection circuit 321 detects whether any of the later-described seven conditions with different DSV polarities shown in FIG. 25 can be satisfied based on the input data word D(k), the status information S(k) from the calculation portion 323 and a zero-run length on the LSB side of the output code word C(k−1). The code word alternative presence/absence detection circuit 321 outputs a result of alternative detection indicative of existence of an alternative to the calculation portion 323 if any condition is satisfied, and outputs a result of alternative detection indicative of absence of an alternative to the same if any condition is not satisfied.

The calculation portion 323 receives the alternative detection result and the input data word, calculates addresses of the four types of coding tables 33 based on the alternative detection result, and supplies to the code word memories 324 and 325 the code words C(k)0 and C(k)1 calculated and generated from the input data words D(k) by using one or two coding tables 33 corresponding to one or two calculated addresses. Further, the calculation portion 323 generates a synchronous word of a fixed pattern in one synchronous frame cycle, and outputs it to the code word memories 324 and 325. Further, it generates a redundant bit in units of an N data symbol cycle in accordance with the later-described algorithm and outputs it to the code word memories 324 and 325.

The code word memory 324 accumulates the code word C(k)0 from the calculation portion 323, and the code word memory 325 accumulates the code word C(k)1 from the calculation portion 323. The DSV calculation memory 326 and the DSV calculation memory 327 calculate CDS (Code word Digital Sum) every time the code words C(k)0 and C(k)1 are inputted from the code word memory 324 and the code word memory 325, and updates the DSV values from this CDS value and the current DSV value. It is to be noted that the CDS value is a result of adding the code word in encoding units, i.e., in units of six bits with 1 determined as +1 and 0 determined as −1 after NRZI conversion.

Figure 27:
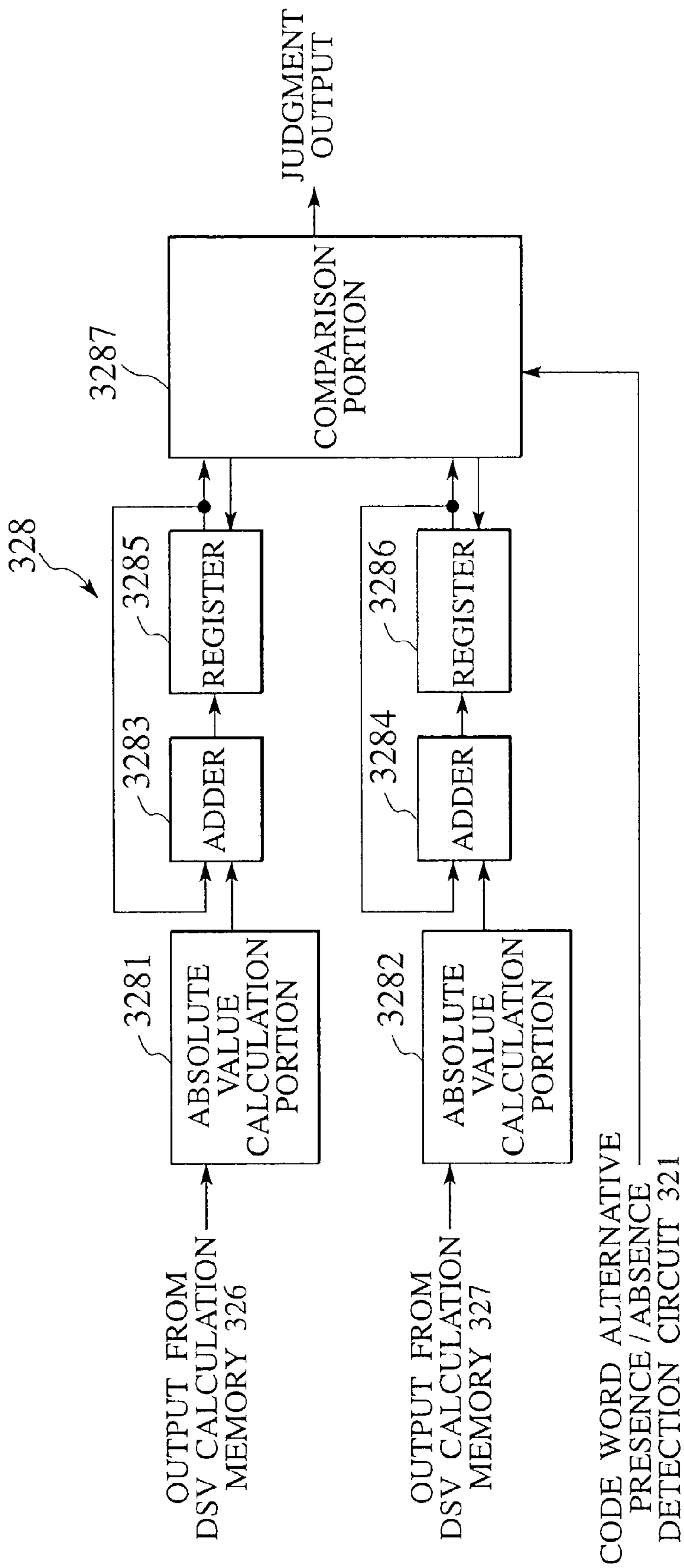
FIG. 27 is a block diagram showing an example of a selection judgment portion in FIG. 22.

The selection judgment portion 328 is configured as shown in, e.g., FIG. 27 by a circuit which compares absolute values of the DSV values outputted from the DSV calculation memories 326 and 327 in largeness, controls the memory control/code output portion 329 in accordance with a result of comparison, and selects and outputs one of the code words respectively outputted from the code word memories 324 and 325.

In FIG. 27, the selection judgment portion 328 is constituted by absolute value calculation portions 3281 and 3282 which calculate absolute values with respect to the DSV values respectively outputted from the DSV calculation memories 326 and 327, adders 3283 and 3284, registers 3285 and 3286, and a comparison portion 3287. The adder 3283 adds an output from the register 3285 and a first DSV absolute value from the absolute value calculation portion 3281 in order to obtain a fist added value, and supplies this value to the register 3285 where it is maintained. Similarly, the adder 3284 adds an output from the register 3286 and a second DSV absolute value from the absolute value calculation portion 3282 in order to obtain a second added value, and supplies this value to the register 3286 where it is maintained.

DSV values in the DSV calculation memories 326 and 327 are updated in accordance with each conversion from the input data word into the code word. After the updated DSV values are turned into absolute values by the absolute value calculation portions 3281 and 1282, the adders 3283 and 3284 add these absolute values to the previous DSV absolute values from the registers 3285 and 3286 provided corresponding to these adders, and the obtained values are supplied as first and second added values to the registers 3285 and 3286 where they are stored. Therefore, DSV absolute values for respective conversions up to the present have been integrated in the registers 3285 and 3286.

Upon receiving the alternative detection signal from the code word alternative presence/absence detection circuit 321, the comparison portion 3287 compares the first and second added values from the registers 3285 and 3286 in largeness. If the first added value (integrated value of the DSV absolute values) of the register 3285 is smaller than the second added value (integrated value of the DSV absolute values) of the register 3286, the comparison portion 3287 outputs a judgment signal to the memory control/code output portion 329 to control the portion 329 to select and output the code word outputted from the code word memory 324 shown in FIG. 22 as the output code word. On the contrary, if the first added value (integrated value of the DSV absolute values) of the register 3285 is equal to or larger than the second added value (integrated value of the DSV absolute values) of the register 3286, the comparison portion 3287 outputs a judgment signal to the memory control/code output portion 329 to control the portion 329 to select and output the code word outputted from the code word memory 325 shown in FIG. 22 as the output code word.

At the same time, the comparison portion 3287 clears the first and second added values of the registers 3285 and 3286 to a value 0. Therefore, the registers 3285 and 3286 respectively hold a result of integration of the DSV absolute values in each section where an alternative is generated in conversion.

It is to be noted that the two code word memories 324 and 325 are prepared in this embodiment, and the output code word is immediately outputted when the code word alternative presence/absence detection circuit 321 detects D(k) having an alternative. However, a number of the code word memories is not restricted two and, when D(k) having an alternative is detected, the output code word does not have to be immediately outputted. Further, it is also effective to use a method by which more memories are provided, some selectable source codes are checked and a code word string having a smallest DSV is selected and outputted.

Again referring to FIG. 22, when the source code D(k) having an alternative is detected by the code word alternative presence/absence detection circuit 321, the selection judgment portion 328 judges selection of a code word from the code word memory 324 or 325 to be outputted to the outside based on the preceding DSV absolute values by using DSV stored in the DSV calculation memory 326 and the DSV calculation memory 327. However, the memory control/code output portion 329 selects the code word stored in one code word memory and outputs it to the outside as the output code word by reception of a judgment signal from the selection judgment portion 328. At the same time, the contents of the non-selected code word memory and DSV calculation memory are replaced with the contents of the selected code word memory and DSV calculation memory.

The operation of the code word alternative presence/absence detection circuit 321 will now be described in detail with reference to FIG. 25. FIG. 25 is a view briefly showing conditions about the operation of the alternative presence/absence calculation circuit 321 in case of the (1, 9) RLL. In the drawing, a part concerning the redundant bit will be described later in detail. Here, conditions are those for DSV control under the (1, 9) RLL using the four types of coding tables used in the (1, 7) RLL.

In FIG. 25, S(k) denotes a status at a k-th symbol (which is a coding table number of the four coding tables, and any value of 0 to 3); L(k−1), a zero-run length on the LSB side of the code word C(k−1) of the k−1 symbol, namely, a number of continuous bits 0; and D(k), an input data word consisting of four bits corresponding to the k-th symbol. Furthermore, there are a total of seven conditions, i.e., the condition 1 to the condition 7.

As to the condition 1, the status S(k) which is "3" (when using the coding table of S(k)=3) means that the code word can be replaced with a corresponding code word in the coding table of S(k)=1 when the input data D(k) is not more than 6 if a number of continuous bits 0 L(k−1) on the LSB side of the preceding code word is "4" or "5", i.e., "010000" or "100000". Similarly, under the condition 1, the code word can be replaced with a corresponding code word in the coding table of S(k)=1 when L(k−1) is "6" and D(k) is "0" or "1" or "3" or "5".

The condition 2 means that the code word can be replaced with a corresponding code word in the coding table of S(k)=1 when S(k) is "2", L(k−1) is "5" or "6", and D(k) is not less than "7" or L(k−1) is "4" and D(k) is not less than "10".

The condition 3 means that the code word can be replaced with a corresponding code word in the coding table of S(k)=0 when S(k) is "2", L(k−1) is not less than "1" and not more than "4", and D(k)=0 or 5.

Under the condition 4, replacement with the coding table S(k)=0 is possible when S(k)=2, L(k−1)=1, and D(k) is "13" or "15" at any part other than those immediately before the redundant bit. Further, immediately before the redundant bit, replacement with a corresponding code word in the coding table of S(k)=0 is possible when L(k−1)=1, D(k)=15, and D(k+1) is not less than "7" or "0" or "5".

The condition 5 means that replacement with a corresponding code word in the coding table of S(k)=0 is possible when S(k)=2 and when L(k−1)=2 and D(k)=13 or 15 at any part other than those immediately before the redundant bit.

The condition 6 means that replacement with a corresponding code word in the coding table of S(k)=0 is possible when S(k)=2 and L(k−1) is 3 and when D(k)=13 and D(k+1) is not more than "6" or "13" or "15" at any part other than those immediately before the redundant bit.

The condition 7 means that replacement with a corresponding code word in the coding table of S(k)=0 is possible when S(k)=2 and L(k−1)=3 and when D(k)=15 and D(k+1) is not less than "7" or "0" or "5" at a any part other than those immediately before the redundant bit.

Corresponding replaceable code words in the two coding tables in the condition 1 to the condition 7 are arranged in such a manner that the number of 1 included in code bits of one code word of each pair is even while the number of 1 included in code bits of the other code word is odd and that code words of each pair have the same next state S(k+1) as shown in FIG. 24. Moreover, even with the replacement, the (1, 9) RLL is not broken. The code word alternative presence/absence detection circuit 321 outputs an alternative detection result indicative of existence of an alternative to the calculation portion 323 when any one of the condition 1 to the condition 7 is satisfied, and outputs an alternative detection result indicative of absence of an alternative to the calculation portion 323 when any condition is not satisfied.

Figure 28A:
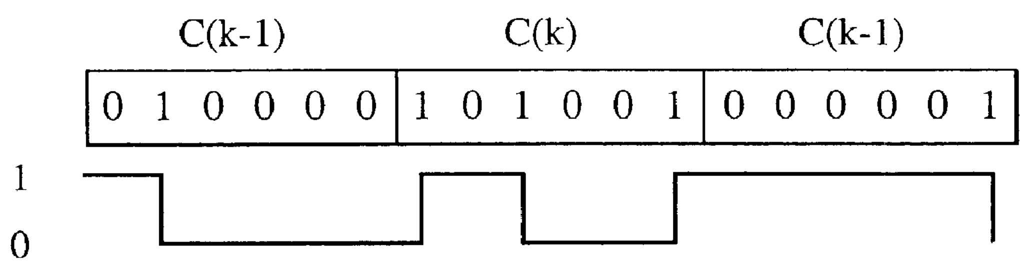
FIGS. 28A and 28B are views showing that an output level after NRZI modulation is inverted based on the fact that the numbers of "1" included in respective output code words C(k) differ from each other according to the fourth embodiment of the present invention.
Figure 28B:
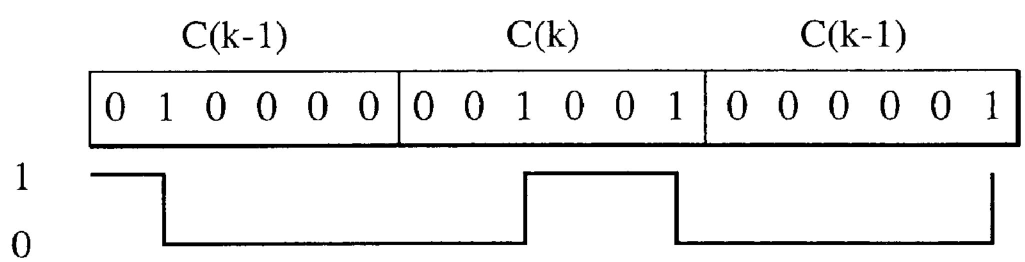

The difference in the number of 1 between the code words enables the DSV control apparently because the difference in the number of 1 between C(k)s causes the reverse of the output level after NRZI modulation as shown in FIGS. 28A and 28B. For this reason, according to the present modulation method and apparatus, as described above, while the (1, 9) RLL is satisfied, the DSV control is possible.

As described above, according to the embodiment, it is possible to realize the encoding apparatus which can generate the codes with the (1, 9) RLL by using the output code word C(k) corresponding to the input data word D(k) and a plurality of the coding tables 33 including the coding table specification information S(k+1) which specifies a coding table to be used for encoding the next code word, but a redundant bit can be also inserted in order to suppress the DC component without violating the (1, 9) RLL.

Figure 29:
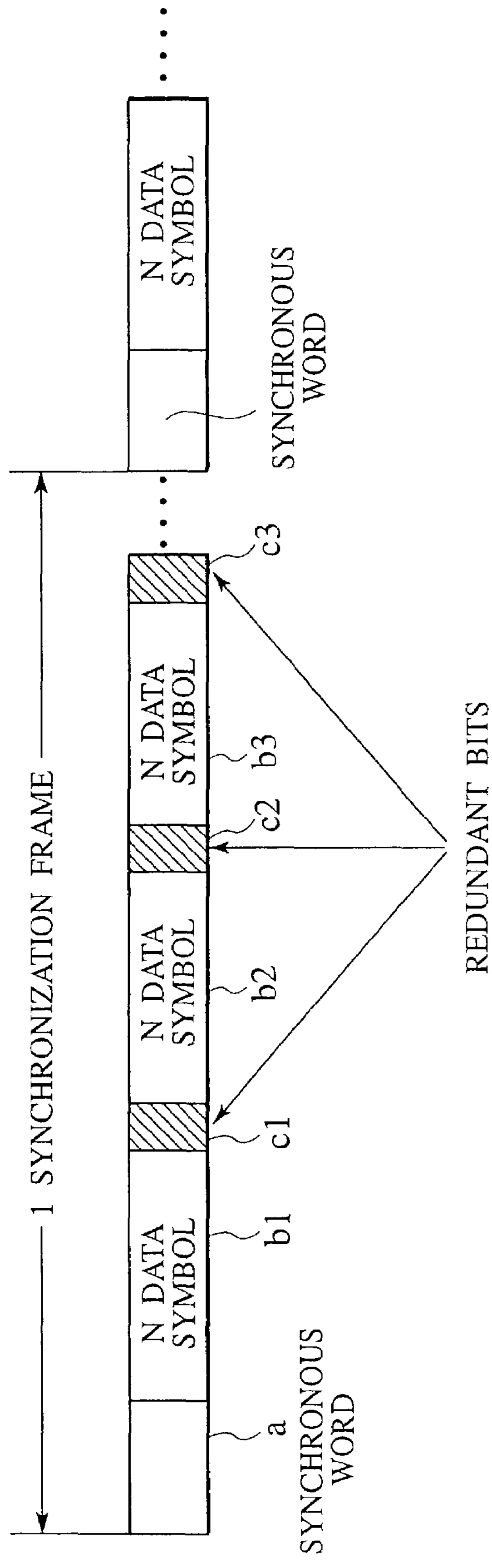
FIG. 29 is a view showing an example of a format of an output signal in the fourth embodiment according to the present invention.

Description will now be given as to insertion of redundant bits according to the present invention with reference to FIGS. 24, 29 and 30. FIG. 29 shows a signal format of a digital signal outputted from the 4–6 modulation portion 32. As shown in the drawing, one synchronization frame of an output signal from the 4–6 modulation portion 32 has a structure in which redundant bits c1, c2, c3 are inserted in accordance with respective N data symbols b1, b2, b3, . . . after a synchronous word a of a fixed pattern which is generated by the calculation portion 323 and inserted.

As shown in FIG. 30, "01 or "00" can be taken for the redundant bits when the LSB of the preceding code word is "1", and "10" or "00" can be taken for the same when the LSB of the preceding code word is "0". The redundant bits "00" can reverse the DSV polarity with respect to "01". Similarly, "00" can reverse the DSV polarity with respect to "10". For example, inversion of the polarity of the output signal occurs once in case of "01" or "10, whereas inversion of the polarity does not occur in case of "00".

Here, as described in connection with FIG. 25, the code word can be generated under the (1, 9) RLL by using the coding tables shown in FIG. 24, and the (1, 9) RLL limitation can be effected even if the redundant bits are "00". That is, according to this embodiment, as shown in FIG. 29, the code word series having the reverse DSV polarity can be necessarily generated by inserting the redundant bits consisting of two bits at predetermined intervals which is N data symbol intervals.

Figure 32A:
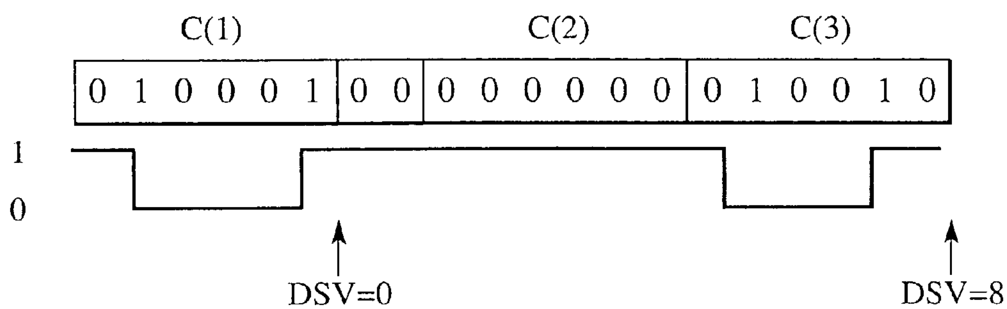
FIGS. 32A and 32B are views showing that the polarity of DSV after NRZI modulation is inverted based on the difference of a redundant bit in the fourth embodiment according to the present invention.
Figure 32B:
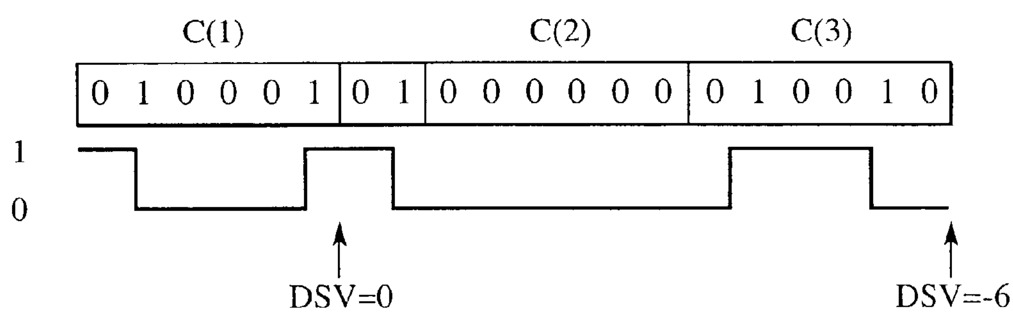

For example, in case of performing encoding from S(1)=2 to D(1)=3, D(2)=15 and D(3)=6 and inserting the redundant bits with C(2) as the head, when encoding is carried out in accordance with FIG. 24, C(1)=010001, S(2)=0, C(2)=0000000, S(3)=2 and C(3)=010010 are established, and the zero-run length "7" is generated in a section including C(2). Since C(1) has the LSB of 1, the redundant bits to be inserted are 00 or 01, and the zero-run length "9" is not exceeded as shown in FIGS. 32A and 32B. At this moment, as apparent from an output waveform after the illustrated NRZI conversion, inversion/non-inversion of the waveform can be selected at the part where the redundant bits are inserted. When DSV is 0 immediately after C(1), DSV immediately after C(3) is 8 (FIG. 32A) or −6 (FIG. 32B), and it can be understood that the subsequent DSV polarity can be changed. It is to be noted that the redundant bits can be inserted both before and after the code bit to be currently encoded.

Figure 31:
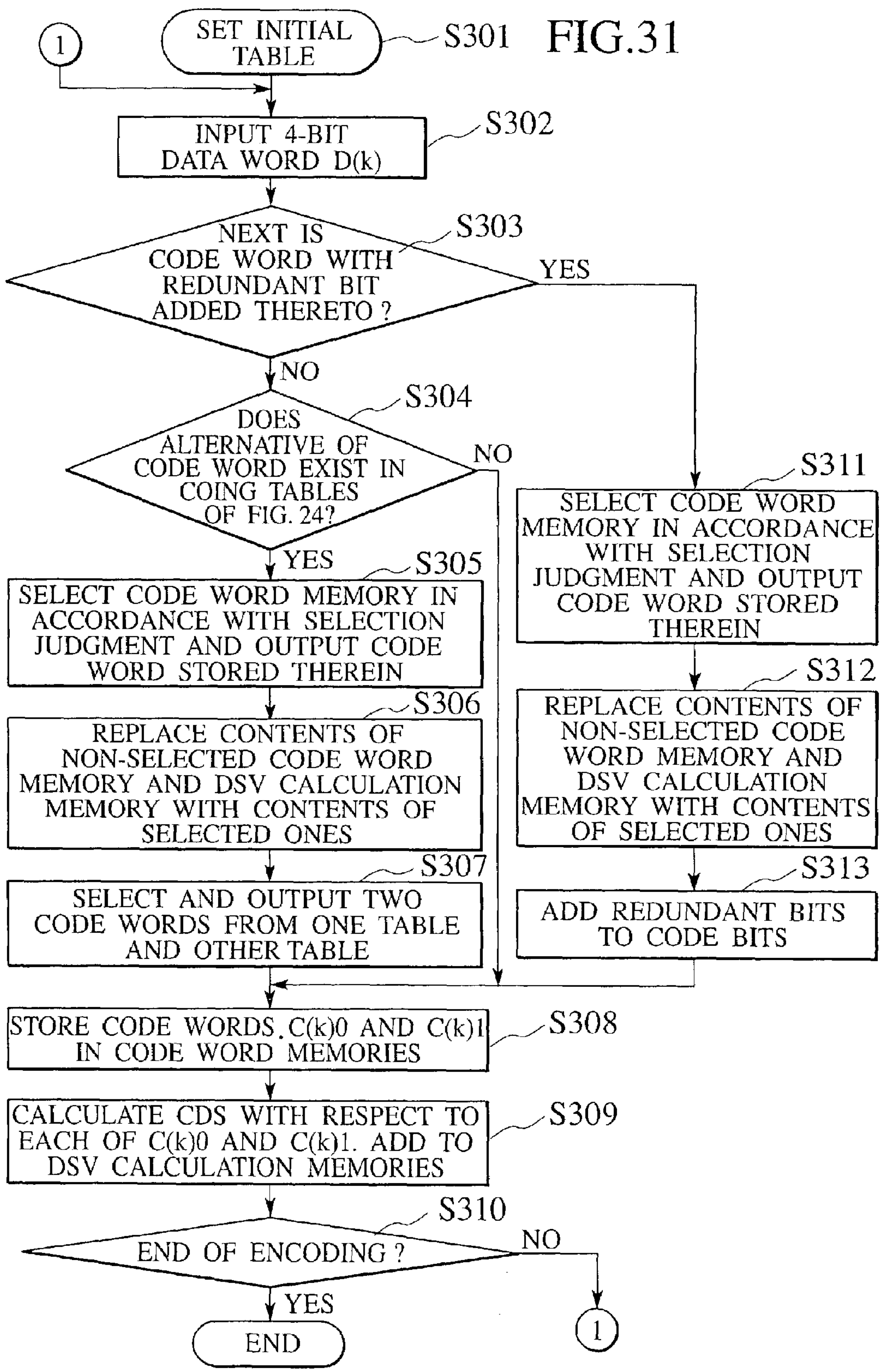
FIG. 31 is a flowchart for illustrating the encoding operation according to the fourth embodiment of the present invention.

Description will now be given as to the operation which enables DSV control even if the redundant bits are inserted according to the present invention with reference to the flowchart of FIG. 31. An initial table is first set in the calculation portion 323 (step S301). This initial table can be set by determining a coding table number S(k) of the code word following the synchronous word or the like.

Subsequently, the input data word (source code) D(k) consisting of four bits is inputted to the 4–6 modulation portion 12 (step S302), and encoding is carried out with S(k) and D(k) by using the coding tables of FIG. 24. In the process of encoding, reference is made to the preceding encoded input data word C(k−1), the zero-run length on its LSB side is calculated, and the bit of LSB is detected. Thereafter, judgment is made upon whether next word is the code word to which the redundant bits are added (step S303). If it is not such a code word, the code word alternative presence/absence detection circuit 321 makes judgment upon whether there is an alternative of the code word in accordance with the conditions shown in FIG. 29 (step S304).

The code word alternative presence/absence detection circuit 321 detects whether any one of the seven conditions explained in connection with FIG. 25 is satisfied based on the initially set status information (coding table number) S(k) supplied from the calculation portion 323, the zero-run length L(k−1) on the LSB side of the preceding encoded input data word C(k−1) and the input data word D(k). If any of the seven conditions is not satisfied, namely, if a selectable code word does not exist in the coding tables of FIG. 24, the code word alternative presence/absence detection circuit 321 supplies an alternative detection result indicative of absence of an alternative to the calculation portion 323, and the calculation portion 323 is caused to output the same code word which is outputted by using the coding table of S(k) to the code word memories 324 and 325 as C(k)0 and C(k)1 (step S308).

The DSV calculation memory 326 and the DSV calculation memory 327 calculate CDS every time the code words C(k)0 and C(k)1 are inputted from the code word memory 324 and the code word memory 325, and update the DSV value from the CDS value and the DSV value which is obtained from all the output code words which have been selected and stored in the past (step S309).

On the other hand, at the step S304, when the code word alternative presence/absence detection circuit 321 determines that any of the seven conditions explained in connection with FIG. 25 is satisfied, namely, when a selectable code word exists in the coding table of FIG. 24, the code word alternative presence/absence detection circuit 321 supplies an alternative detection result indicative of presence of an alternative to the calculation portion 323 and the selection judgment portion 328, causes the selection judgment portion 328 to perform selection and judgment, and causes the selected code word memory 324 or 325 to output the code series (step S305).

For example, in the second and subsequent data word input, when the status information S(k) from the calculation portion 323 is "2", the zero-run length L(k−1) on the LSB side of the immediately preceding output code word C(k−1) is "4" and the input data word D(k) is "5", the condition 3 in FIG. 25 is satisfied, and hence the code word alternative presence/absence detection circuit 321 outputs an alternative detection result (including the coding table number) indicative of presence of an alternative at this moment. Based on the alternative detection result, as described with reference to FIG. 27, the selection judgment portion 328 takes an absolute value of each output DSV value from the DSV calculation memories 326 and 327, adds this absolute value to an accumulated value of DSV absolute values which have been stored, compares two types of the accumulated values in largeness, and controls the memory control/code output portion 329 so as to select as the output code word the code word from the code word memory 324 or 325 corresponding to a smaller value. This is the operation at the step S305.

Then, the memory control/code output portion 329 sets the content of the code word memory which outputs the code word which has not been selected as the output code word (the code word memory 325 when the output code word of the code word memory 324 is selected, and the code word memory 324 when the output code word of the code word memory 325 is selected) equal to the content of the selected output code word, and sets the content of the DSV calculation memory corresponding to the non-selected code word memory (the DSV calculation memory 327 when the output code word of the code word memory 324 is selected, and the DSV calculation memory 326 when the output code word of the code word memory 325 is selected) equal to the content of the DSV calculation memory corresponding to the selected code word memory (step S306).

Subsequently, the calculation portion 323 selects code words which are selectable as a code word candidate from one coding table and the other coding table determined by S(k), and outputs the code words as C(k)0 and C(k)1 (step S307). In the above-described concrete example, since the condition 3 shown in FIG. 25 is satisfied, the calculation portion 323 uses the two coding tables having the coding table numbers S(k) of "0" and "2". The calculation portion 323 outputs the output code word C(k) obtained by using the coding table of S(k)=0 as C(k)0 to the code word memory 324, and outputs the output code word C(k) obtained by using the coding table of S(k)=2 as C(k)1 to the code word memory 325.

Thereafter, CDS is calculated with respect to each of the code words C(k)0 and C(k)1 respectively stored in the code word memory 324 and the code word memory 325, and the DSV calculation memories 326 and 327 add the calculated CDSs to the up-to-the-present DSV values and thereby update the DSV values (steps S308 and S309). Then, judgment is made upon whether all encoding steps have been performed (step S310). If all the encoding steps are yet to be carried out, the processing is returned to the step S302.

Further, if it is determined that the next code word is a code word to which the redundant bits are added at the step S303 (the redundant bits are added every N data symbol as shown in FIG. 29), the same selection judgment as that in the step S305 is effected, and the code word series from the selected code word memory is outputted from the memory control/code output portion 329 (step S311). Thereafter, the contents of the non-selected code word memory and DSV memory are rewritten with the contents of selected ones (step S312).

Thereafter, as described in connection with FIG. 30, the redundant bit pattern is selected based on the LSB of the code word, and the code word having one of the redundant bits being added thereto is determined as C(k)0 while the code word having the other redundant bits being added thereto is determined as C(k)1 (step S313). These code words C(k)0 and C(k)1 are respectively supplied and stored in the code word memories 324 and 325, and CDS then calculated with respect to each of C(k)0 and C(k)1. The contents of the DSV calculation memories 326 and 327 are updated by adding the CDSs values (steps S308 and S309). Generation of the code word including the redundant bits in which the DC component is suppressed is terminated by performing the above-described operation to the end of encoding (step S310).

Meanwhile, as described in connection with FIG. 25, there is a condition by which the code word replaceable occasion varies by insertion of the redundant bits. For example, although the condition 4 changes the replacement condition immediately before the redundant bits, this is the processing for maintaining the (1, 9) RLL even if the redundant bits consisting of two bits is "00". Furthermore, similarly, the code word replacement when L(k−1)=6 is not performed immediately after the redundant bits. Even if the redundant bits are inserted by this processing, the (1, 9) RLL can be maintained.

As described above, according to this embodiment, it is apparent that DSV control is enabled while satisfying the (1, 9) RLL by inserting the redundant bits consisting of two bits every predetermined data word to the output code word which is outputted as a binary series by using the output code word C(k) corresponding to the input data word D(k) and a plurality of coding tables 33 including coding table specification information S(k+1) which specifies a coding table used for encoding a next code word.

Incidentally, the present invention is not restricted to the foregoing embodiments, and it is apparent that the structure of the coding tables which convert a data word consisting of bits whose number is an integral multiple of 4 into code bits whose number is an integral multiple of 6 so as to allocate, e.g., the data word consisting of eight bits to code word bits consisting of 12 bits while satisfying the DSV control rule can be readily analogized from the foregoing embodiments and can be included in the present invention.

Moreover, the present invention includes a computer program which causes the code word alternative presence/absence detection circuit 321, the calculation portion 323, the code word memories 324 and 325, the DSV calculation memories 326 and 327, the selection judgment portion 328 and the memory control/code output portion 329 in FIG. 22 to function by a computer. This computer program is directly loaded in the encoding apparatus 1E shown in FIG. 21 and caused to function, and also a computer program distributed from a server through a communication network is loaded in the encoding apparatus 1E.

As described above, according to the present invention, the first synchronous word and the second synchronous word having respective numbers of times of inversion different from each other are simultaneously generated by NRZI conversion; the code word data group is generated based on the run-length encoding method restricting the run length in a predetermined range; the generated code word data group is arranged after the first synchronous word in order to generate the first code word series data and the code word data group is arranged after the second synchronous word in order to generate the second code word series data; the first direct-current component data concerning the direct-current component generated when NRZI-converting the first code word series data is obtained; the second direct-current component data concerning the direct-current component generated when NRZI-converting the second code word series data is obtained; the thus obtained first direct-current component data and second direct-current component data are compared with each other; and one having smaller direct-current component data is selected from the first code word series data and the second code word series data and supplied. Thus, it is possible to generate the digital modulation signal having the preferable direct-current component suppression characteristic used for recording on a discoid high-density storage medium such as an optical disk while performing predetermined run-length limited encoding.

According to the present invention, the first code word and the second code word having respective numbers of times of inversion different from each other are generated by NRZI conversion; the code word data group is generated based on the run-length encoding method by which the run length is restricted in a predetermined range; there are generated the first code word series data obtained by arranging the generated code word data group after the first code word and the second code word series data obtained by arranging the code word data group after the second code word; there are obtained the first direct-current component data concerning the direct-current component generated when NRZI-converting the first code word series data and the second direct-current component data concerning the direct-current component generated when NRZI-converting the second code word series data; the thus obtained first direct-current component data and second direct-current component data are compared with each other; and one having smaller direct-current component data is selected from the first code word series data and the second code word series data and supplied. Thus, it is possible to generate the digital modulation signal having the preferable direct-current component suppression characteristic used for recording on a discoid high-density storage medium such as an optical disk while performing predetermined run-length limited encoding.

According to the present invention, since CDS data is used for the direct-current component data in particular, the direct-current component data concerning the direct-current component generated when performing NRZI conversion can be obtained in advance, and hence it is possible to further readily generate the digital modulation signal having the preferable direct-current component suppression characteristic in addition to the above-described advantage.

According to the present invention, in particular, since one having a smaller average value level of the direct-current component data is selected from the first code word series data and the second code word series data and selected, the digital modulation signal having the further preferable direct-current component suppression characteristic can be generated in addition to the above-described advantage.

According to the present invention, in particular, since one having a smaller peak value of the direct-current component data is selected from the first code word series data and the second code word series data and supplied, the digital modulation signal having the further preferable direct-current component suppression characteristic can be generated in addition to the above-described advantage.

According to the present invention, in particular, since the code word series data is selected when the synchronous words are generated or when the source data from which a plurality of code word data having different patterns can be generated is supplied, the digital modulation signal having the further preferable direct-current component suppression characteristic can be generated in addition to the above-described advantage.

According to the present invention, the first synchronous word and the second synchronous word having respective numbers of times of inversion different from each other are simultaneously generated by NRZI conversion; the code word data group is generated based on the run-length encoding method by which the run length is restricted in a predetermined range; the generated code word data group is arranged after the first synchronous word in order to generate the first code word series data, and the code word data group is arranged after the second synchronous word in order to generate the second code word series data; there are obtained the first direct-current component data concerning the direct-current generated when NRZI-converting the first code word series data and the second direct-current component data concerning the direct-current component generated when NRZI-converting the second code word series data; the first direct-current component data and the second direct-current component data are compared with each other; and one having smaller direct-component data is selected from the first code word series data and the second code word series data and supplied. Therefore, it is possible to generate the digital modulation signal having the preferable direct-current component suppression characteristic used for recording on a discoid high-density storage medium such as an optical disk while performing predetermined run-length limited encoding.

According to the present invention, the first code word and the second code word having respective numbers of times of inversion different from each other are generated by NRZI conversion; the code word data group is generated based on the run-length encoding method by which run length is restricted to a predetermined range; there are generated the first code word series data having the generated code word data group arranged after the first code word and the second code word series data having the code word data group arranged after the second code word; there are obtained the first direct-current component data concerning the direct-current component generated when NRZI-converting the first code word series data and the second direct-current component data concerning the direct-current component generated when NRZI-converting the second code word series data; the thus obtained first direct-current component data and second direct-current component data are compared with each other; and one having smaller direct-current component data is selected from the first code word series data and the second code word series data and selected. Therefore, it is possible to generate the digital modulation signal having the preferable direct-current component suppression characteristic used for recording on a discoid high-density storage medium such as an optical disk while performing predetermined run-length limited encoding.

According to the present invention, the first synchronous word and the second synchronous word having respective numbers of times of inversion different from each other are simultaneously generated by NRZI conversion; the code word data group is generated based on the run-length encoding method by which the run length is restricted in a predetermined range; the thus generated code word data group is arranged after the first synchronous word in order to generate the first code word series data and the code word data group is arranged after the second synchronous word in order to generate the second code word series data; there are obtained the first direct-current component data concerning the direct-current component generated when NRZI-converting the first code word series data and the second direct-current component data concerning the direct-current component generated when NRZI-converting the second code word series data; the thus obtained first direct-current component data and second direct-current component data are compared with each other; and one having smaller direct-current component data is selected from the first code word series data and the second code word series data and supplied. Therefore, it is possible to provide the digital signal storage medium having the digital modulation signal with the preferable direct-current component suppression characteristic recorded thereon while performing predetermined run-length limited encoding.

According to the present invention, the first code word and the second code word having respective numbers of times of inversion different from each other are generated by NRZI conversion; the code word data group is generated based on the run-length encoding method by which the run length is restricted to a predetermined range; there are generated the first code word series data having the generated code word data group arranged after the first code word and the second code word series data having the code word data group arranged after the second code word; there are obtained the first direct-current component data concerning the direct-current component generated when NRZI-converting the first code word series data and the second direct-current component data concerning the direct-current component generated when NRZI-converting the second code word series data; the thus obtained first direct-current component data and second direct-current component data are compared with each other; and one having smaller direct-current component data is selected from the first code word series data and the second code word series data and supplied. Therefore, it is possible to provide the digital signal storage medium having the digital modulation signal with the preferable direct-current component suppression characteristic recorded thereon while performing predetermined run-length limited encoding.

According to the present invention, the square data of the first and second direct-current component data concerning the direct-current component generated when NRZI-converting each of the first and second code word series data are generated and compared with each other, and one having the smaller direct-current component square data is selected from the first code word series data and the second code word series data and outputted as the code word series signal. As a result, the lower component in the modulation signal which can be obtained in the higher-density modulation mode can be effectively suppressed since DSV control is carried out at any point in time other than DSV control point and dispersion of DSV of the output code word can be efficiently reduced as compared with a prior art method which minimizes an absolute value of DSV at the point in time of DSV control.

According to the present invention, the adverse effect on the servo control signal of the recording apparatus having the digital signal modulation apparatus according to the present invention mounted thereon can be further greatly avoided as compare with the prior art, and the recording apparatus capable of performing the stable servo operation can be configured.

In addition, according to the present invention, the invention can be also applied to the digital modulation method which does not use the data scrambling technique.

According to the present invention, when the input data word consisting of p bits is encoded into a code word of q bits (where q>p) by using a plurality of encode tables and this code word is outputted as a bit string to which a predetermined run-length limited rule is applied, a plurality of different code words are associated with a specific input data word. When DSV of the output bit string is controlled by appropriately selecting the code word, encoding is carried out every selectable code word reckoning from the absolute value of the DSV at the time of selectable conversion, the absolute value of the DSV which is being encoded is integrated, and the code word is selected and determined based on comparison of the results of integration. Therefore, with respect to DC suppression carried out by direct comparison of DSV which has been conventionally conducted, the higher suppression capability can be demonstrated with the same degree of redundancy, and the degree of redundancy can be further reduced if the DC suppression effect is the same.

It should be understood that many modifications and adaptations of the invention will become apparent to those skilled in the art and it is intended to encompass such obvious modifications and changes in the scope of the claims appended hereto.

What is claimed is:

1. A digital signal modulation method which generates a code word data group by repeating a number of times an operation for converting source data whose bit number is p (p is a positive integer) into code word data whose bit number is q (q is an integer larger than p), generates synchronous words at predetermined bit intervals, obtains code word series data by arranging said code word data group after said generated synchronous words, and obtains a signal to be supplied to a storage medium or a transmission medium by NRZI-converting said obtained code word series signal, said digital signal modulation method comprising:

a first step of simultaneously generating a first synchronous word and a second synchronous word having respective numbers of times of inversion different from each other, by said NRZI conversion;

a second step of generating said code word data group based on a run-length encoding method which restricts a run length in a predetermined range, generating first code word series data by arranging said generated code word data group after said first synchronous word, and generating second code word series data by arranging said code word data group after said second synchronous word;

a third step of obtaining first direct-current component data concerning a direct-current component generated when NRZI-converting said first code word series data and obtaining second direct-current component data concerning a direct-current component generated when NRZI-converting said second code word series data based on said first and second code word series data generated at said second step; and a fourth step of comparing said first direct-current component data with said second direct-current component data, and selecting and supplying one having smaller direct-current component data from said first code word series data and said second code word series data.

2. The digital signal modulation method according to claim 1, wherein each direct-current component data in said third step is CDS (Code Word Digital Sum) data.

3. The digital signal modulation method according to claim 1, wherein, at said fourth step, an average value level of said first direct-current component data is compared with an average value level of said second direct-current component data, and one having a smaller average value level of direct-current component data is selected from said first code word series data and said second code word series data and supplied.

4. The digital signal modulation method according to claim 1, wherein, at said fourth step, a peak value of said first direct-current component data is compared with a peak value of said second direct-current component data, and one having a smaller peak value of direct-current component data is selected from said first code word series data and said second code word series data and supplied.

5. The digital signal modulation method according to claim 1, wherein the selection of code word series data at said fourth step is performed at a point in time when said first and second synchronous words are generated or at a point in time when said source data with which a plurality of sets of code word data having different patterns can be generated is supplied.

6. A digital signal modulation method which generates, when specific source data with which first code word data and second code word data having different patterns can be generated is supplied in case of generating a code word data group by repeating a number of times an operation for converting source data whose bit number is p (p is a positive integer) into code word data whose bit number is q (q is a larger integer than p), generates said code word data group based on source data supplied after the specific source data, obtains code word series data in which the generated code word data group is arranged after the first code word or the second code word, and obtains a signal to be supplied to a storage medium or a transmission medium by NRZI-converting the obtained code word series signal, said digital signal modulation method comprising:

a first step of generating said first code word and said second code word having respective numbers of times of inversion different from each other, by said NRZI conversion;

a second step of generating said code word data group based on a run-length encoding method which restricts a run length in a predetermined range, generating first code word series data by arranging said generated code word data group after said first code word, and generating said second code word series data by arranging said code word data group after said second code word;

a third step of obtaining first direct-current component data concerning a direct-current component generated when NIRZI-converting said first code word series data and obtaining second direct-current component data concerning a direct-current component generated when NRZI-converting said second code word series data based on said first and second code word series data generated at said second step; and a fourth step of comparing said first direct-current component data with said second direct-current component data, and selecting and supplying one having smaller direct-current component data from said first code word series data and said second code word series data.

7. The digital signal modulation method according to claim 6, wherein each direct-current component data in said third step is CDS (Code Word Digital Sum) data.

8. The digital signal modulation method according to claim 6, wherein, at said fourth step, an average value level of said first direct-current component data is compared with an average value level of said second direct-current component data, and one having a smaller average value level of direct-current component data is selected from said first code word series data and said second code word series data and supplied.

9. The digital signal modulation method according to claim 6, wherein, at said fourth step, a peak value of said first direct-current component data is compared with a peak value of said second direct-current component data, and one having a smaller peak value of direct-current component data is selected from said first code word series data and said second code word series data and supplied.

10. The digital signal modulation method according to claim 6, wherein the selection of code word series data at said fourth step is carried out at a point in time when said first and second synchronous words are supplied or at a point in time when said source data with which a plurality of sets of code word data having different patterns can be generated is supplied.

11. A digital signal modulation apparatus which generates a code word data group by repeating a number of times an operation for converting source data whose bit number is p (p is a positive integer) into code word data whose bit number is q (q is an integer larger than p), generates synchronous words at predetermined bit intervals, obtains code word series data by arranging said code word data group after said generated synchronous word, and obtains a signal to be supplied to a storage medium or a transmission medium by NRZI-converting said obtained code word series data, said digital signal modulation apparatus comprising:

synchronous word generating means for simultaneously generating a first synchronous word and a second synchronous word having respective numbers of times of inversion different from each other, by said NRZI conversion;

code word series data generating means for generating said code word data group based on a mn-length encoding method which restricts a run length in a predetermined range, generating first code word series data by arranging said generated code word data group after said first synchronous word, and generating second code word series data by arranging said code word data group after said second synchronous word;

DSV calculating means for receiving said first and second code word series data generated by said code word series data generating means, obtaining first direct-current component data concerning a direct-current component generated when NRZI-converting said first code word series data, and obtaining second direct-current component data concerning a direct-current component generated when NRZI-converting said second code word series data; and code word outputting means for comparing said first direct-current component data with said second direct-current component data, and selecting and supplying one having smaller direct-current data from said first code word series data and said second code word series data.

12. A digital signal modulation apparatus which generates, when specific source data with which first code word data and second code word data having different patterns can be generated is supplied in case of generating a code word data group by repeating a number of times an operation for converting source data whose bit number is p (p is a positive integer) into code word data whose bit number is q (q is a larger integer than p), generates said code word data group based on source data supplied after said specific source data, obtains code word series data in which said generated code word data group is arranged after said first code word or said second code word, and obtains a signal to be supplied to a storage medium or a transmission medium by NRZI-converting said obtained code word series data, said digital signal modulation apparatus comprising:

code word generating means for generating said first code word and said second code word having respective numbers of times of inversion different from each other, by said NRZI conversion;

code word series data generating means for generating said code word data group based on a run-length encoding method which restricts a run length in a predetermined range, generating first code word series data by arranging said generated code word data group after said first code word, and generating second code word series data by arranging said code word data group after said second code word;

DSV calculating means for receiving said first and second code word series data generated by said code word series data generating means, obtaining first direct-current component data concerning a direct-current component generated when NRZI-converting said first code word series data, and obtaining second direct-current component data concerning a direct-current component generated when NRZI-converting said second code word series data; and code word outputting means for comparing said first direct-current component data with said second direct-current component data, and selecting and supplying one having smaller direct-current component data from said first code word series data and said second code word series data.

13. A digital signal storage medium having a signal recorded thereon, said signal being obtained by generating a code word data group by repeating a number of times an operation for converting source data whose bit number is p (p is a positive integer) into code word data whose bit number is q (q is an integer larger than p), generating synchronous words at predetermined intervals, obtaining code word series data by arranging said code word data group after said generated synchronous words, and NRZI-converting said obtained code word series signal, wherein said digital signal storage medium has said code word series data recorded thereon, said code word series data being obtained by the steps of:

simultaneously generating a first synchronous word and a second synchronous word having respective numbers of times of inversion different from each other, by said NRZI conversion;

generating said code word data group based on a run-length encoding method which restricts a run length in a predetermined range, generating first code word series data by arranging said generated code word data group after said first synchronous word, and generating second code word series data by arranging said code word data group after said second synchronous word;

obtaining first direct-current component data concerning a direct-current component generated when NRZI-converting said first code word series data, and obtaining second direct-current component data concerning a direct-current component generated when NRZI-converting said second code word series data; and comparing said first direct-current component data with said second direct-current component data, and selecting one having smaller direct-current component data from said first code word series data and said second code word series data, thereby recoding said selected and obtained code word series data.

14. A digital signal storage medium having a signal recorded thereon, said signal being obtained by generating a code word data group based on source data supplied after specific source data when said specific source data with which first code word data and second code word data having different patterns can be generated is supplied in case of generating said code word data group by repeating a number of times an operation for converting source data whose bit number is p (p is a positive integer) into code word data whose bit number is q (q is an integer larger than p), obtaining code word series data having said generated code word data group arranged after said first code word or said second code word, and NRZI-converting said obtained code word series signal, wherein said digital signal storage medium has said code word series data recorded thereon, said code word series data being obtained by the steps of:

generating said first code word and said second code word having respective numbers of times of inversion different from each other, by said NRZI conversion;

generating said code word data group based on a run-length encoding method which restricts a run length in a predetermined range, generating first code word series data by arranging said generated code word data group after said first code word, and generating second code word series data by arranging said code word data group after said second code word;

obtaining first direct-current component data concerning a direct-current component generated when NRZI-converting said first code word series data, and obtaining second direct-current component data concerning a direct-current component generated when NRZI-converting said second code word series data; and comparing said first direct-current component data with said second direct-current component data, and selecting one having smaller direct-current component data from said first code word series data and said second code word series data, thereby recording said selected and obtained code word series data.

15. A digital signal modulation method which generates a code word data group by repeating a number of times an operation for converting source data whose bit number is p (p is a positive integer) into code word data whose bit number is q (q is an integer larger than p), generates synchronous words at predetermined intervals, obtains code word series data by arranging said code word data group after said generated synchronous words, and NRZI-converts a signal of said obtained code word series data and outputs said NRZI-converted signal, said digital signal modulation method comprising:

a first step of simultaneously generating a first synchronous word and a second synchronous word having respective numbers of times of inversion different from each other, by said NRZI conversion;

a second step of generating said code word data group based on a run-length limited rule which restricts a run length in a predetermined range, generating first code word series data by arranging said generated code word data group after said first synchronous word, and generating second code word series data by arranging said code word data group after said second synchronous word;

a third step of obtaining first direct-current component data concerning a direct-current component generated when NRZI-converting said first code word series data and obtaining second direct-current component data concerning a direct-current component generated when NRZI-converting said second code word series data based on said first and second code word series data generated at said second step;

a fourth step of obtaining first direct-current component square data by squaring said first direct-current component data obtained at said predetermined bit intervals and obtaining second direct-current component square data by squaring said second direct-current component data obtained at said predetermined bit intervals; and a fifth step of comparing said first direct-current component square data with said second direct-current component square data, and selecting and outputting one having smaller direct-current component square data from said first code word series data and said second code word series data.

16. The digital signal modulation method according to claim 15, wherein the selection of code word series data at said fifth step is carried out at a point in time when said first and second synchronous words are generated or at a point in time when source data with which a plurality of code words having different patterns can be generated is inputted.

17. A digital signal modulation method which, in case of generating a code word data group by repeating a number of times an operation for converting source data whose bit number is p (p is a positive integer) into code word data whose bit number is q (q is an integer larger than p) and generating synchronous words at predetermined bit intervals, generates said code word data group based on source data inputted after specific source data when said specific source data with which a first code word and a second code word having different patterns can be generated is inputted, arranges said generated code word data group after said first code word or said second code word, obtains code word series data in which said synchronous words are inserted at said predetermined bit intervals, and NRZI-converts a signal of said obtained code word series data and outputs said NRZI-converted signal, said digital signal modulation method comprising:

a first step of generating said first code word and said second code word having respective numbers of times of inversion different from each other, by said NRZI conversion;

a second step of generating said code word data group based on a run-length limited rule which restricts a run length in a predetermined range, generating first code word series data by arranging said generated code word data group after said first code word, and generating second code word series data by arranging said code word data group after said second code word;

a third step of obtaining first direct-current component data concerning a direct-current component generated when NRZI-converting said first code word series data and obtaining second direct-current component data concerning a direct-current component generated when NRZI-converting said second code word series data based on said first and second code word series data generated at said second step;

a fourth step of obtaining first direct-current component square data by squaring said first direct-current component data obtained at said predetermined bit intervals, and obtaining second direct-current component square data by squaring said second direct-current component data obtained at said predetermined bit intervals; and a fifth step of comparing said first direct-current component square data with said second direct-current component square data, and selecting and outputting one having smaller direct-current component square data from said first code word series data and said second code word series data.

18. The digital signal modulation method according to claim 17, wherein the selection of code word series data at said fifth step is carried out at a point in time when said synchronous words are inputted or at a point in time when said specific source data with which a plurality of code words having different patterns can be generated is inputted.

19. A digital signal modulation apparatus which generates a code word data group by repeating a number of times an operation for converting source data whose bit number is p (p is a positive integer) into code word data whose bit number is q (q is an integer larger than p), generates synchronous words at predetermined bit intervals, obtains code word series data by arranging said code word data group after said generated synchronous words, and NRZI-converts a signal of said obtained code word series data and outputs said NRZI-converted signal, said digital signal modulation apparatus comprising:

synchronous word generating means for simultaneously generating a first synchronous word and a second synchronous word having respective numbers of times of inversion different from each other, by said NRZI conversion;

code word series data generating means for generating said code word data group based on a run-length limited rule which restricts a run length in a predetermined range, generating first code word series data by arranging said generated code word data group after said first synchronous word, and generating second code word series data by arranging said code word data group after said second synchronous word;

DSV calculating means for receiving said first and second code word series data generated by said code word series data generating means, obtaining first direct-current component data concerning a direct-current component generated when NRZI-converting said first code word series data, and obtaining second direct-current component data concerning a direct-current component generated when NRZI-converting said second code word series data;

DSV square calculating means for obtaining first direct-current component square data by squaring said first direct-current component data obtained at said predetermined bit intervals, and obtaining second direct-current component square data by squaring said second direct-current component data obtained at said predetermined bit intervals; and code word outputting means for comparing said first direct-current component square data with said second direct-current component square data, and selecting and outputting one having smaller direct-current component square data from said first code word series data and said second code word series data.

20. A digital signal modulation apparatus which, in case of generating a code word data group by repeating a number of times an operation for converting source data whose bit number is p (p is a positive integer) into code word data whose bit number is q (q is an integer larger than p) and generating synchronous words at predetermined bit intervals, generates said code word data group based on source data inputted after specific source data when said specific source data with which a first code word and a second code word having different patterns can be generated is inputted, arranges said generated code word data group after said first code word or said second code word, obtains code word series data in which said synchronous words are inserted at said predetermined bit intervals, and NRZI-converts a signal of said obtained code word series data and outputs said NRZI-converted signal, said digital signal modulation apparatus comprising:

code word generating means for generating said first code word and said second code word having respective numbers of times of inversion different from each other, by said NRZI conversion;

code word series data generating means for generating said code word data group based on a run-length limited rule which restricts a run length in a predetermined range, generating first code word series data by arranging said generated code word data group after said first code word, and generating second code word series data by arranging said code word data group after said second code word;

DSV calculating means for receiving said first and second code word series data generated by said code word series data generating means, obtaining first direct-current component data concerning a direct-current component generated when NRZI-converting said first code word series data, and second direct-current component data concerning a direct-current component generated when NRZI-converting said second code word series data;

DSV square calculating means for obtaining first direct-current component square data by squaring said first direct-current component data obtained at said predetermined bit intervals and obtaining second direct-current component square data by squaring said second direct-current component data obtained at said predetermined bit intervals; and code word outputting means for comparing said first direct-current component square data with said second direct-current component square data, and selecting and outputting one having smaller direct-current component square data from said first code word series data and said second code word series data.

21. An encoding method which, in case of encoding an input data word consisting of p bits into a code word of q bits (where q>p) and outputting said code word as a bit string to which a predetermined run-length limited rule is applied, associates said plurality of different code words with a specific input data word, and selects and outputs a specific code word from a plurality of said different code words, thereby performing DSV control, wherein, when selecting said specific code word, encoding is performed in accordance with each selectable code word in order to integrate an absolute value of DSV reckoning from said absolute value of DSV at a selectable point of time of conversion, and results of integration of said absolute value of DSV are compared with each other in largeness with respect to each of said plurality of different code words, thereby selecting and outputting said specific code word.

22. An encoding method which, in case of encoding an input data word consisting of p bits into a code word consisting of q bits (where q>p) and outputting said code word as a bit string to which a predetermined run-length limited rule is applied, adds one redundant bit selected from a plurality of different redundant bits every predetermined number of code bits to a code word string to be outputted, thereby performing DSV control, wherein, when selecting said redundant bit, encoding is performed in accordance with each selectable redundant bit in order to integrate an absolute value of DSV reckoning from said absolute value of DSV at a selectable point in time, results of integration of said absolute value of DSV are compared with each other in largeness with respect to each of code words to which said plurality of different redundant bits are added when executing selection, thereby selecting said one redundant bit and outputting said code word string and said selected one redundant bit.

23. An encoding apparatus which, in case of encoding an input data word consisting of p bits into a code word consisting of q bits (where q>p) and outputting said code word as a bit string to which a predetermined run-length limited rule is applied, associates a plurality of different code words with a specific input data word, and selects and outputs a specific code word from said plurality of different code words, thereby performing DSV control, said encoding apparatus comprising:

a detection circuit which detects whether there is an alternative of a code word with respect to said input data word;

a calculation portion which outputs said plurality of different code words corresponding to said input data word when an alternative detection result supplied from said detection circuit indicates existence of an alternative, and outputs one code word corresponding to said input data word when a detection result from said detection circuit indicates absence of an alternative;

a plurality of storing means for storing an output code word after a point in time of outputting an output code word and a code word immediately precedently inputted from said calculation portion with respect to each of a plurality of code word strings outputted from said calculation portion through a plurality of paths, and storing a DSV value obtained from an output code word selected in the past and a code word immediately precedently inputted from said calculation portion; and outputting means for comparing integrated values of absolute values of DSV values up until an immediately preceding code word supplied from said plurality of storing means with each other, selecting and outputting a code word of storing means corresponding to a smallest integrated value, and replacing a content of non-selected storing means among said plurality of storing means with a content of selected storing means, wherein said outputting means performs encoding in accordance with each selectable code word and integrates said absolute values of DSV reckoning from an absolute value of DSV at a point in time of selectable conversion.

24. An encoding apparatus which, in case of encoding an input data word consisting of p bits into a code word consisting of q bits (where q>p) and outputting said code word as a bit string to which a predetermined run-length limited rule is applied, adds one redundant bit selected from a plurality of different redundant bits every predetermined number of code words to a code word string to be outputted, thereby performing DSV control, said encoding apparatus comprising:

a calculation portion which adds a plurality of said different redundant bits every said predetermined number of code words;

a plurality of storing means for storing an output code word and a redundant bit after a point in time of outputting an output code word and a code word and a redundant bit immediately precedently inputted from said calculation portion with respect to each of a plurality of code word strings including redundant bits outputted from said calculation portion through a plurality of paths corresponding to said plurality of different redundant bits, and storing a DSV value obtained from an output code word and a redundant bit selected in the past and a code word and a redundant bit immediately precedently inputted from said calculation portion; and outputting means for comparing integrated values of absolute values of DSV values up until an immediately preceding code word and a redundant bit supplied from said plurality of storing means with each other, selecting and outputting a code word and a redundant bit of a storing means corresponding to a smallest integrated value, and replacing a content of non-selected storing means among said plurality of storing means with a content of selected storing means, wherein said outputting means performs encoding in accordance with each selectable redundant bit and integrates an absolute value of DSV reckoning from said absolute value of DSV at a point in time of selectable conversion.

* * * * *

UNITED STATES PATENT AND TRADEMARK OFFICE

CERTIFICATE OF CORRECTION

PATENT NO. : 7,016,286 B2

DATED : March 21, 2006

INVENTOR(S) : Hayami et al.

It is certified that error appears in the above-identified patent and that said Letters Patent is hereby corrected as shown below:

Column 46,

Line 7, delete “mn-length” and replace with -- run-length --.

Signed and Sealed this

Twenty-third Day of May, 2006

JON W. DUDAS

*Director of the United States Patent and Trademark Office*